United States Patent
Pu et al.

(10) Patent No.: US 11,824,001 B2
(45) Date of Patent: *Nov. 21, 2023

(54) INTEGRATED CIRCUIT PACKAGE STRUCTURE AND INTEGRATED CIRCUIT PACKAGE UNIT

(71) Applicant: Chengdu Monolithic Power Systems Co., Ltd., Chengdu (CN)

(72) Inventors: Yingjiang Pu, Chengdu (CN); Hunt Hang Jiang, Saratoga, CA (US); Xiuhong Guo, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 64 days.

This patent is subject to a terminal disclaimer.

(21) Appl. No.: 17/468,965

(22) Filed: Sep. 8, 2021

(65) Prior Publication Data

US 2022/0077053 A1    Mar. 10, 2022

(30) Foreign Application Priority Data

Sep. 10, 2020    (CN) .......................... 202010945779.X

(51) Int. Cl.
*H01L 23/528* (2006.01)
*H01L 25/065* (2023.01)
(Continued)

(52) U.S. Cl.
CPC ........ *H01L 23/528* (2013.01); *H01L 23/3157* (2013.01); *H01L 23/53228* (2013.01); *H01L 25/0655* (2013.01)

(58) Field of Classification Search
CPC ............... H01L 23/528; H01L 23/3157; H01L 23/53209; H01L 23/49822; H01L 23/5389; H01L 23/4334; H01L 23/552; H01L 23/3121; H01L 23/367; H01L 23/3736; H01L 2221/68345; H01L 2221/68359; H01L 2224/18; H01L 2224/97; H01L 21/561; H01L 21/6835; H01L 21/50; H01L 24/18; H01L 25/0655; H01L 23/53257; H01L 24/80
See application file for complete search history.

(56) References Cited

U.S. PATENT DOCUMENTS 7,109,410 B2 *  9/2006  Arnold ................... H01L 23/315
                                                                361/752
8,897,019 B1 * 11/2014  Shimamura ............. H01L 24/97
                                                                361/728
(Continued)

*Primary Examiner* — Victor A Mandala
*Assistant Examiner* — Lawrence C Tynes, Jr.
(74) *Attorney, Agent, or Firm* — Perkins Coie LLP

(57) ABSTRACT

An IC package structure including an array of package units formed into a panel-shaped package units array. Each package unit has a continuous and closed metal wall surrounding the periphery of the package unit and at least one IC chip/IC die disposed in the package unit, and wherein each IC chip/IC die has a top surface and a back surface opposite to the top surface. A panel-shaped metal layer corresponding to the panel-shaped package units array can be formed on entire back side of the IC package structure and bonded to the metal wall of each package unit, wherein the back side of the IC package structure refers to the side to which the back surface of each IC chip/IC die is facing.

17 Claims, 43 Drawing Sheets

(51) Int. Cl.
*H01L 23/31* (2006.01)
*H01L 23/532* (2006.01)

(56) References Cited

U.S. PATENT DOCUMENTS

| | | | |
|---|---|---|---|
| 2010/0140759 A1* | 6/2010 | Pagaila | H01L 24/73 |
| | | | 257/E23.116 |
| 2011/0304015 A1* | 12/2011 | Kim | H01L 25/0657 |
| | | | 257/532 |
| 2020/0020635 A1* | 1/2020 | Chang | H01L 23/53257 |
| 2022/0077054 A1* | 3/2022 | Pu | H01L 24/18 |

* cited by examiner

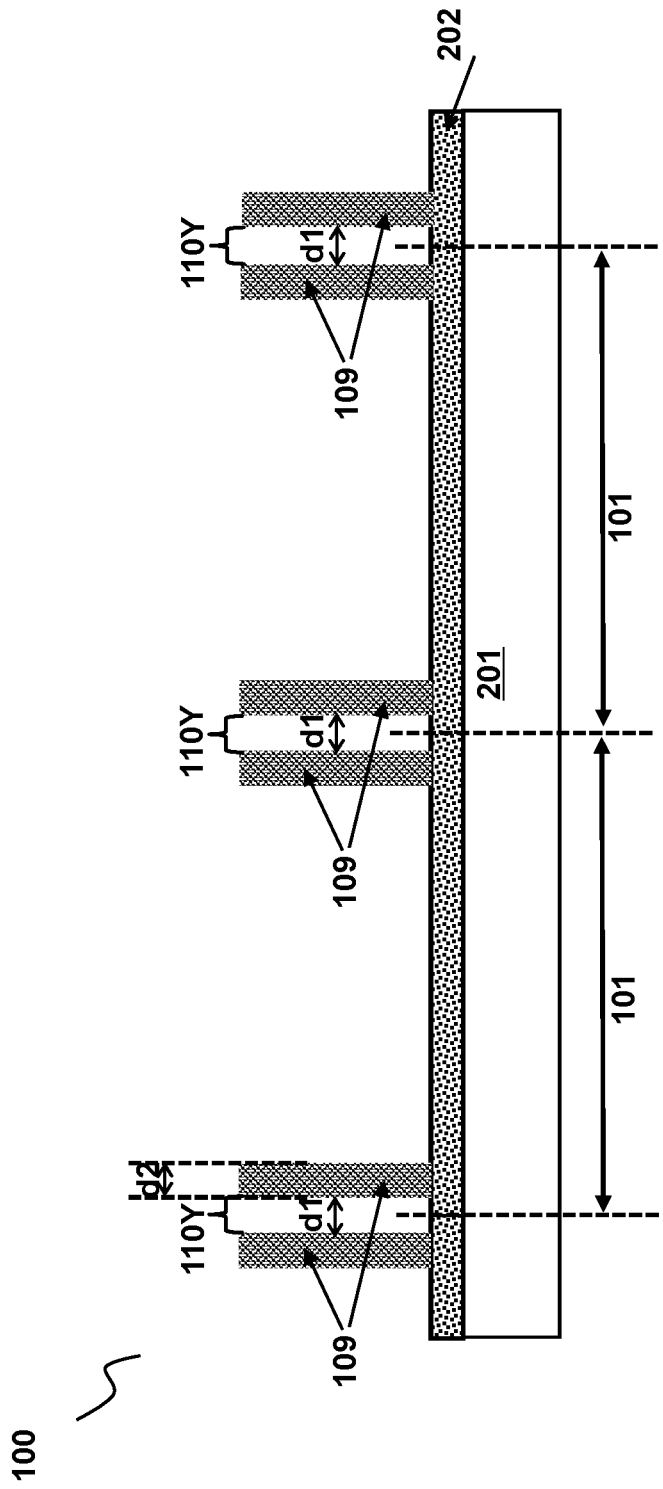

US 11,824,001 B2

INTEGRATED CIRCUIT PACKAGE STRUCTURE AND INTEGRATED CIRCUIT PACKAGE UNIT

CROSS-REFERENCE TO RELATED APPLICATION(S)

This application claims the benefit of CN application No. 202010945779.X filed on Sep. 10, 2020 and incorporated herein by reference.

TECHNICAL FIELD

This disclosure relates generally to semiconductor devices, and particularly but not exclusively relates to packaging structure for integrated circuit and associated packaging method.

BACKGROUND

To integrate more integrated circuits and circuit elements on smaller integrated circuit board or system board (i.e. increasing integration density) becomes an important trend in integrated circuit development. Integrated circuits can generally be packaged into integrated circuit chips that may be soldered/mounted/inserted on circuit board or system board. The integrated circuit chips typically have I/O pins or conductive bumps allowing them to make electrical connection and/or signal communication with other outside circuits. To improve integration density, it is desired to further shrink the package size of integrated chips. However, with the increase in integration density, thermal dissipation performance should also be improved.

SUMMARY

In accordance with an embodiment of the present disclosure, an IC package structure is disclosed. The IC package structure may comprise: an array of package units formed into a panel-shaped package units array, wherein each package unit has a continuous and closed metal wall surrounding the periphery of the package unit and at least one IC chip/IC die disposed in the package unit, and wherein each IC chip/IC die has a top surface and a back surface opposite to the top surface; and a panel-shaped metal layer corresponding to the panel-shaped package units array and formed on entire back side of the IC package structure and bonded to the metal wall of each package unit, wherein the back side of the IC package structure refers to the side to which the back surface of each IC chip/IC die is facing.

In accordance with an embodiment of the present disclosure, an IC package unit is further disclosed. The IC package unit may comprise: a metal wall grid having a continuous and closed metal wall surrounding the periphery of the package unit; at least one IC chip/IC die disposed in the metal wall grid, each of the at least one IC chip/IC die having a top surface and a back surface opposite to the top surface; and a metal layer, formed on entire back side of the IC package unit and bonded to the metal wall of the IC package unit, wherein the back side of the IC package unit refers to the side to which the back surface of each IC chip/IC die is facing.

BRIEF DESCRIPTION OF THE DRAWINGS

The following detailed description of various embodiments of the present invention may best be understood when read in conjunction with the following drawings, in which the features are not necessarily drawn to scale but rather are drawn as to best illustrate the pertinent features. Likewise, the relative sizes of elements illustrated by the drawings may differ from the relative size depicted.

FIG. 2A to FIG. 2J illustrate partial cross-sectional views of some process stages of a method for manufacturing an integrated circuit ("IC") package structure in accordance with an embodiment of the present invention.

The use of the same reference label in different drawings indicates the same or like components or structures with substantially the same functions for the sake of simplicity.

DETAILED DESCRIPTION

Various embodiments of the present invention will now be described. In the following description, some specific details, such as example device structures, example manufacturing process and manufacturing steps, and example values for the process, are included to provide a thorough understanding of the embodiments. One skilled in the relevant art will recognize, however, that the present invention may be practiced without one or more specific details, or with other methods, components, materials, etc. In other instances, well-known structures, materials, processes or operations are not shown or described in detail to avoid obscuring aspects of the present invention.

Throughout the specification and claims, the terms "left," right," "in," "out," "front," "back," "up," "down, "top," "atop", "bottom," "over," "under," "overlying," "underlying," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner to establish an electrical relationship between the elements that are coupled. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Those skilled in the art should understand that the meanings of the terms identified above do not necessarily limit the terms, but merely provide illustrative examples for the terms.

Figure 1A:
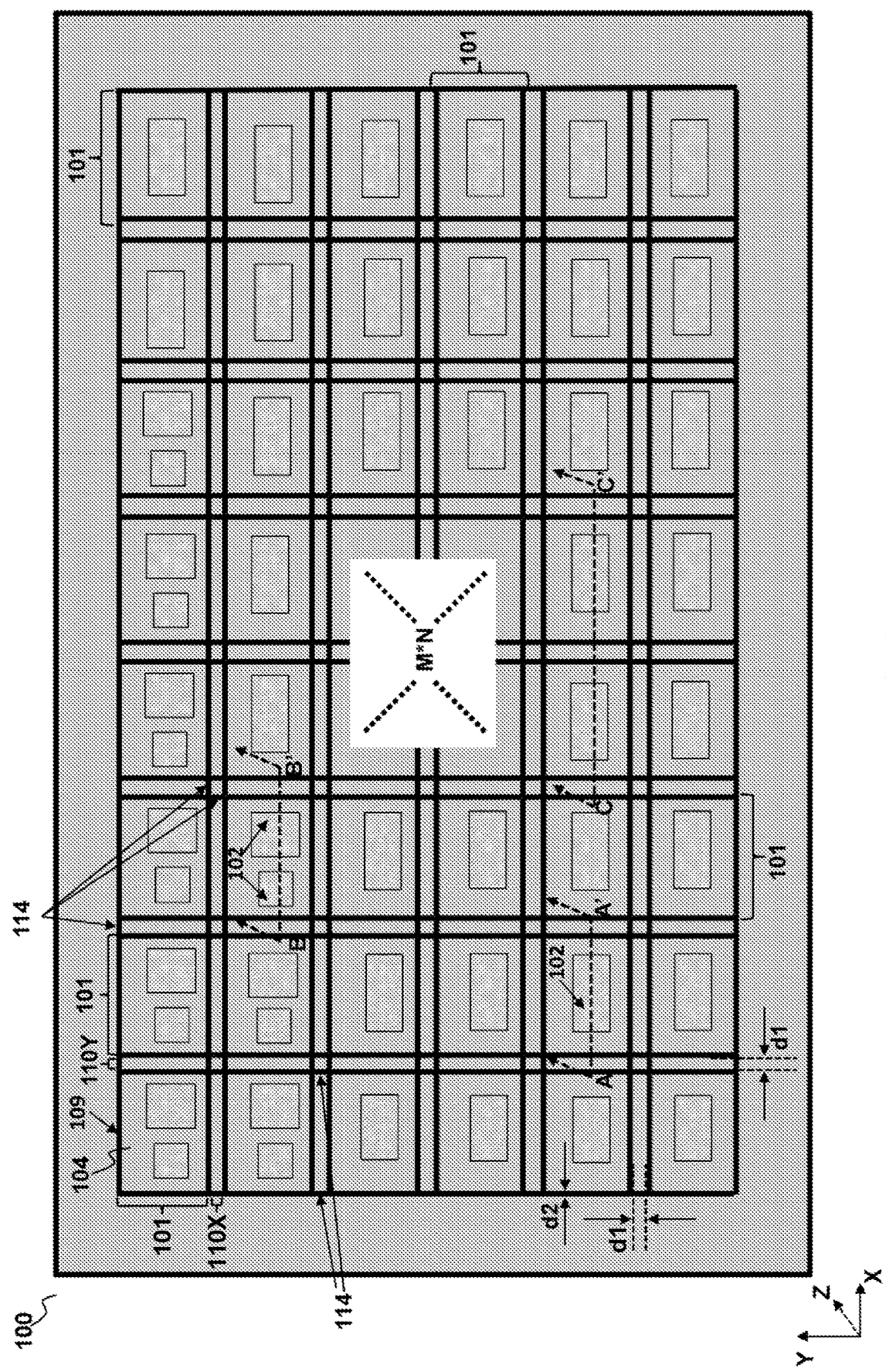
FIG. 1A illustrates a top plane view of an integrated circuit ("IC") package structure 100 in accordance with an embodiment of the present invention.

FIG. 1A illustrates a top plane view of an integrated circuit ("IC") package structure 100 in accordance with an embodiment of the present invention. In FIG. 1A, the top plane view of IC package structure 100 may be considered as taken from the X-Y plane defined by the X and Y axis in a coordinate defined by X, Y and Z axis perpendicular to each other. In the exemplary embodiment of FIG. 1A, the IC package structure 100 may comprise an array of package units 101 formed into a panel. The package panel comprising or carrying the array of package units 101 may be referred to as a panel-shaped package structure 100 or a panel-shaped array of package units 101. Each package unit 101 may have a continuous and closed metal fence/wall 109 (indicated by bold solid lines in FIG. 1A), which forms a metal wall grid (also denoted by 109) to surround the periphery of the package unit 101. The metal fence/wall 109 may have a predetermined wall height h1 (measured in the Z direction, see FIG. 1B), which may be chosen reasonably according to practical application requirements (for example, depending on the thickness of the integrated circuit chip/die 102 to be packaged). To provide an example, each integrated circuit chip/die 102 to be packaged may have a thickness t1 (measured in the Z direction, see FIG. 1B) ranging from 200 μm to 250 μm, and the predetermined wall height h1 should be at least greater than the thickness t1 of each integrated circuit chip/die 102 (i.e., h1>t1). For example, the predetermined wall height h1 may be 100 μm higher than the thickness t1 of the integrated circuit chip/die 102, that is, h1>(t1+100 μm). In another example, if i integrated circuit chips/dies 102 are stacked and placed in each package unit 101 (or metal wall grid 109), the predetermined wall height h1 should be at least greater than a sum of the thickness of the i stacked integrated circuit chips/dies 102, i.e., h1>i*t1, wherein i is a positive integer greater than or equal to 1. For instance, the predetermined wall height h1 is 100 μm higher than the sum of the thickness of the i integrated circuit chips/dies 102, namely: h1>(i*t1+100 μm). In an embodiment, the panel-shaped array of package units 101 may comprise a corresponding panel-shaped array of metal wall grids 109, and each package unit 101 may be surrounded by a corresponding one metal wall grid 109 having a continuous and closed metal wall 109.

Those skilled in the art would understand that the area of each package unit 101 illustrated in FIG. 1A may be indicative of a single package unit 101 that will be singulated/separated (for example, by a cutting process) with each metal wall grid 109 as a cutting unit in the Z-axis direction. Although the panel of IC package structure 100 (or the panel of the array of package units 101 or the panel of the array of metal wall grids 109) in FIG. 1A is exemplarily illustrated as of rectangular shape (here refers to the top plane view shape on the X-Y plane), it should be understood by those skilled in the art that this is only an example and not intended to be limiting. In alternative embodiments, the panel of IC package structure 100 (or the panel of the array of package units 101 or the panel of the array of metal wall grids 109) may be of other shapes such as circular, polygonal, or other shapes that are compatible with the manufacturing process. This application does not limit the panel size (here refers to the size on the X-Y plane) of the panel of IC package structure 100 (or the panel of the array of package units 101 or the panel of the array of metal wall grids 109). For example, for a rectangular panel, the panel size may be chosen from 300 mm*300 mm, 580 mm*600 mm, 800 mm*800 mm, 240 mm*74 mm, 189 mm*68 mm and many other sizes that are compatible with the manufacturing process. The array of the package units 101 or the corresponding array of metal wall grids 109 may be an array arrangement of any suitable number and shape (here refers to the top view shape on the X-Y plane). As an example, FIG. 1A illustrates a rectangular array of M rows by N columns, wherein M and N are both positive integers greater than or equal to 1. Cutting/singulating such a panel of IC package structure 100 having an array of M*N package units 101 along the Z axis with each package unit 101 (or each metal wall grid 109) as a cutting unit will obtain M*N singulated individual package units 101. The top plan view shape of each metal wall grid 109 (here refers to the top view shape on the X-Y plane) is also not limited, and may be rectangular, quadrilateral, polygonal, circular, or other shapes. According to an embodiment of the present invention, there is a cutting lane between adjacent metal fences/walls 109 of every two adjacent package units 101 (or metal wall grids 109), and the cutting lane has a predetermined lane width d1 (in the X-Y plane). It may be chosen reasonably according to practical application requirements. For example, in one example, the predetermined lane width d1 may be 100 μm to 1000 μm, and in another example, the predetermined lane width d1 may be 100 μm to 500 μm. In another example, the predetermined lane width d1 may be 100 μm to 250 μm, and in another example, the predetermined lane width d1 may be 250 μm. In the example shown in FIG. 1A, each metal wall grid 109 is shown as a rectangular wall grid (that is, its planar top view shape is rectangular), each metal wall grid 109 is surrounded by four metal side walls. The array of package units 101 (or the array of metal wall grids 109) may have a row cutting lane 110X between every two rows (of the array of package units 101 or the array of metal wall grids 109), and a column cutting lane 110Y between every two columns (of the array of package units 101 or the array of metal wall grids 109). It can also be understood that every two adjacent package units 101 (or metal wall grids 109) have a row cutting lane 110X between adjacent metal walls (metal side walls) in the X-axis direction, and every two adjacent package units 101 (or the metal wall grids 109) have a column cutting lane 110Y between adjacent metal walls (metal side walls) in the Y-axis direction. In one embodiment, both the row cutting lane 110X and the column cutting lane 110Y have a predetermined lane width d1.

In accordance with an embodiment of the present invention, the metal wall grids 109 in the array of metal wall grids 109 are connected to form a monolithic panel through a plurality of metal connecting portions 114, wherein each metal wall grid 109 may be connected to at least one of the metal wall grids 109 that are adjacent to it through at least one of the plurality of metal connecting portions 114. In the example shown in FIG. 1A, every two adjacent metal wall grids 109 are connected to each other. For example, the metal side walls in the X-axis direction of every two adjacent metal wall grids 109 may be connected by a metal connecting portion 114 that crosses (spans across) a column cutting lane 110Y. The metal side walls in the Y-axis direction of every two adjacent metal wall grids 109 may be connected by a metal connecting portion 114 that crosses (spans across) a row cutting lane 110X. According to an alternative embodiment of the present invention, when the array of the metal wall grids 109 are connected into an integral panel shape by the plurality of metal connection portions 114, there may be a variety of connection patterns (planar top plan view patterns), which will be further described later with reference to the illustrations in FIGS. 6A to 6G. Those skilled in the art should understand that, for brevity, FIG. 1A does not labeled out all package units 101, all metal wall grids 109, all cutting lanes (110X or 110Y), and all metal connecting parts 114.

The panel-shaped IC package structure 100 (the entire panel-shaped array of package units 101) may be cut along the cutting lanes (for example, the row cutting lanes 110X and the column cutting lanes 110Y in the example of FIG. 1A) from the Z-axis direction (for example, using a cutting process) to form singulated individual package units 101. Each one of the plurality of metal connection portions 114 may have a predetermined connecting portion height h2 (in the Z-axis direction). In accordance with an embodiment of the present invention, the predetermined connecting portion height h2 may be smaller/lower than the predetermined wall height h1, which helps to reduce the cutting resistance along the cutting lanes and the wear down to the cutting equipment during the cutting process to singulate/cut the entire panel-shaped array of package units 101 into singulated individual package units 101. Those skilled in the art should understand that most of the detailed structures of each package unit 101 is not shown in the top plan view of FIG. 1A.

Figure 1B:
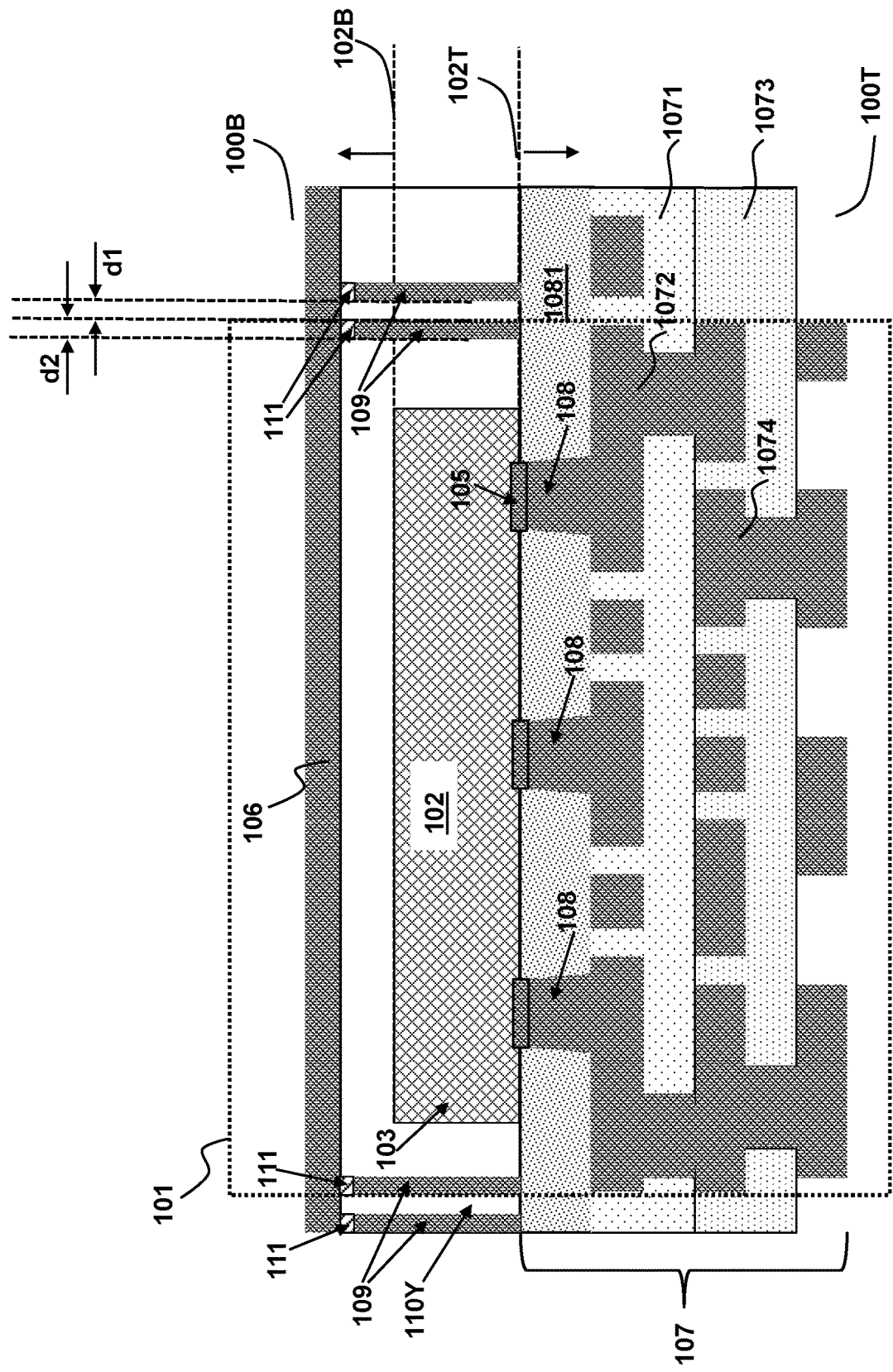
FIG. 1B to FIG. 1H illustrate cross-sectional views of a portion of the IC package structure 100 in accordance with several exemplary embodiments of the present invention.
Figure 1C:
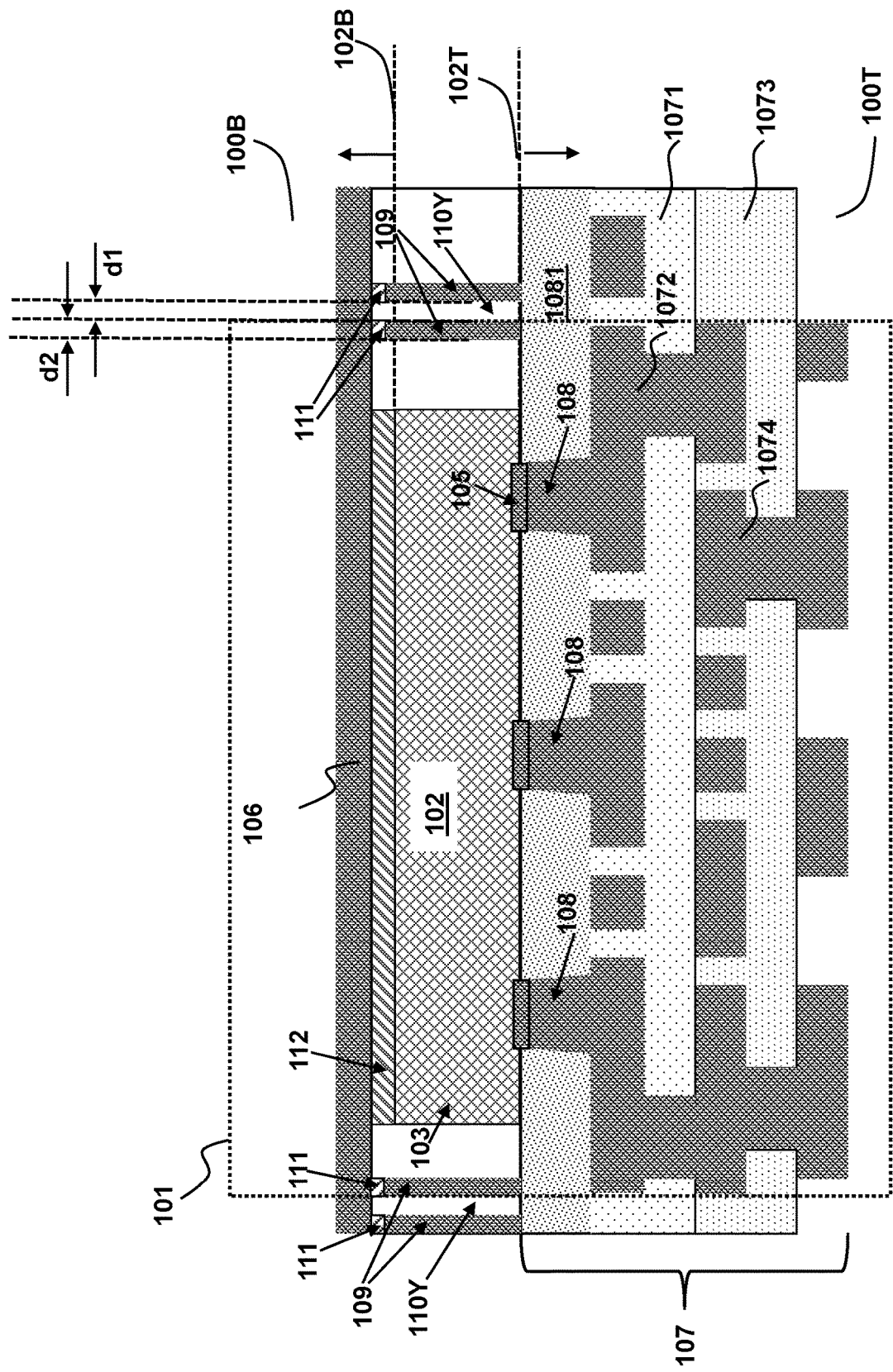

FIG. 1B illustrates a cross-sectional (cutting down along the Z-axis direction) view of a portion of the IC package structure 100 in accordance with an embodiment of the present invention. The cross-section in FIG. 1B may be considered as a partial cross-sectional view corresponding to a portion cutting along the A-A' cutting line in the Z-axis of FIG. 1A. Each one of the package units 101 in the IC package structure 100 may comprise at least one IC chip/IC die 102. In the example of FIG. 1B showing the package unit 101 in the cross-sectional view cut along the A-A' cutting line in FIG. 1A includes one IC chip/IC die 102. Those skilled in the art should understand that, in other embodiments or along other cutting lines, the package unit 101 shown by cross-sectional cutting in other portions of FIG. 1A may include two or more IC chips/IC dies 102. For example, FIG. 1F illustrates a cross-sectional (cutting down along the Z-axis direction) view of another portion of the IC package structure 100 shown in FIG. 1A, which may be considered as a partial cross-sectional view corresponding to the portion cutting along the B-B' cutting line of FIG. 1A. The package unit 101 shown in the example of FIG. 1F includes two integrated circuit chips/dies 102. The number and arrangement pattern or stacking fashion of the IC chips/IC dies 102 packaged in different package units 101 may be different. The size of each IC chip/IC die 102 and the circuit functions implemented may be the same or different, depending on the specific circuit functions to be implemented by a single package unit 101.

Each IC chip/IC die 102 may comprise a substrate 103 on or in which integrated circuits are fabricated. Those skilled in the art should understand that the substrate 103 may comprise substrate formed of semiconductor materials such as silicon (Si), compound semiconductor materials such as silicon germanium (SiGe), or other forms of substrates such as silicon-on-insulator (SOI). The integrated circuit(s) fabricated on or in the substrate 103 may allow connection or coupling to circuits outside the IC chip/IC die 102 through a plurality of metal pads 105. The surface of the IC chip/IC die 102 on which the metal pads 105 are formed may be referred to as a top surface (labeled with 102T in FIG. 1B), and the surface opposite to the top surface 102T may be referred to as a back surface (labeled with 102B in FIG. 1B). Correspondingly, for the IC package structure 100 and each package unit 101, the side (for example, the direction indicated by the downward arrow in FIG. 1B) to which the top surface 102T of the IC chip/IC die 102 is facing may be referred to as a top side (indicated with 100T in FIG. 1B) of the IC package structure 100 or of each package unit 101, and the side to which the back surface 102B of the IC chip/IC die 102 faces (for example, the direction indicated by upward arrow in FIG. 1B) may be referred to as a back side (indicated with 100B in FIG. 1B) of the IC package structure 100 or of each package unit 101.

In accordance with an exemplary embodiment of the present invention, the IC package structure 100 may further comprise a panel-shaped metal layer 106 corresponding to the panel-shaped array of package units 101 (or the panel-shaped array of the metal wall grids 109). Those skilled in the art should understand that the panel-shaped metal layer 106 when mentioned refers to its panel level entirety and integrity. The panel-shaped metal layer 106 corresponding to the panel-shaped array of package units 101 at least means that the panel-shaped metal layer 106 has a panel size compatible to (or matching with) the panel size of the panel-shaped array of package units 101 (here refers to the size on the X-Y plane). For instance, the panel size of the panel-shaped metal layer 106 should be at least large enough to cover the entire back side of the panel-shaped array of package units 101 or the entire back side 100B of the IC package structure 100. In accordance with an embodiment of the present invention, the panel-shaped metal layer 106 is fabricated on the entire back side 100B of the IC package structure 100 and bonded to the metal fence/wall 109 of each package unit 101.

In an exemplary embodiment, the panel-shaped metal layer 106 may be prefabricated as a whole board, and bonded to the metal fence/wall 109 of the metal wall grids 109 by an adhesive material 111 having a strong adhesive coefficient. For example, the adhesive material 111 with strong adhesive force may be selected from materials such as SE4450 silica gel of high thermal conductivity etc., which should at least pass the peeling test under the condition of TCC1000 or HTS1000. After the whole panel/whole board of the prefabricated panel-shaped metal layer 106 is attached to the metal fence/wall of the metal wall grids 109, each package unit 101 is covered/enveloped/enclosed by a cabinets/cubic formed by the metal fence/wall 109 and the metal layer 106, which can provide better electromagnetic interference (EMI) protection for the integrated circuit chip/die 102 packaged in the package unit 101. In an exemplary embodiment, as shown in FIG. 1C, the panel-shaped metal layer 106 may be further bonded to the back surface 102B of each integrated circuit chip/die 102, for example, through a high thermal conductivity adhesive material layer 112, so as to achieve better heat dissipation performance and improved EMI protection performance at the same time. The adhesive material layer 112 with high thermal conductivity may be an adhesive material with thermal conductivity not less than 3 W/(m·K), including but not limited to epoxy resin such as T31 or X-31 etc.

Figure 1D:
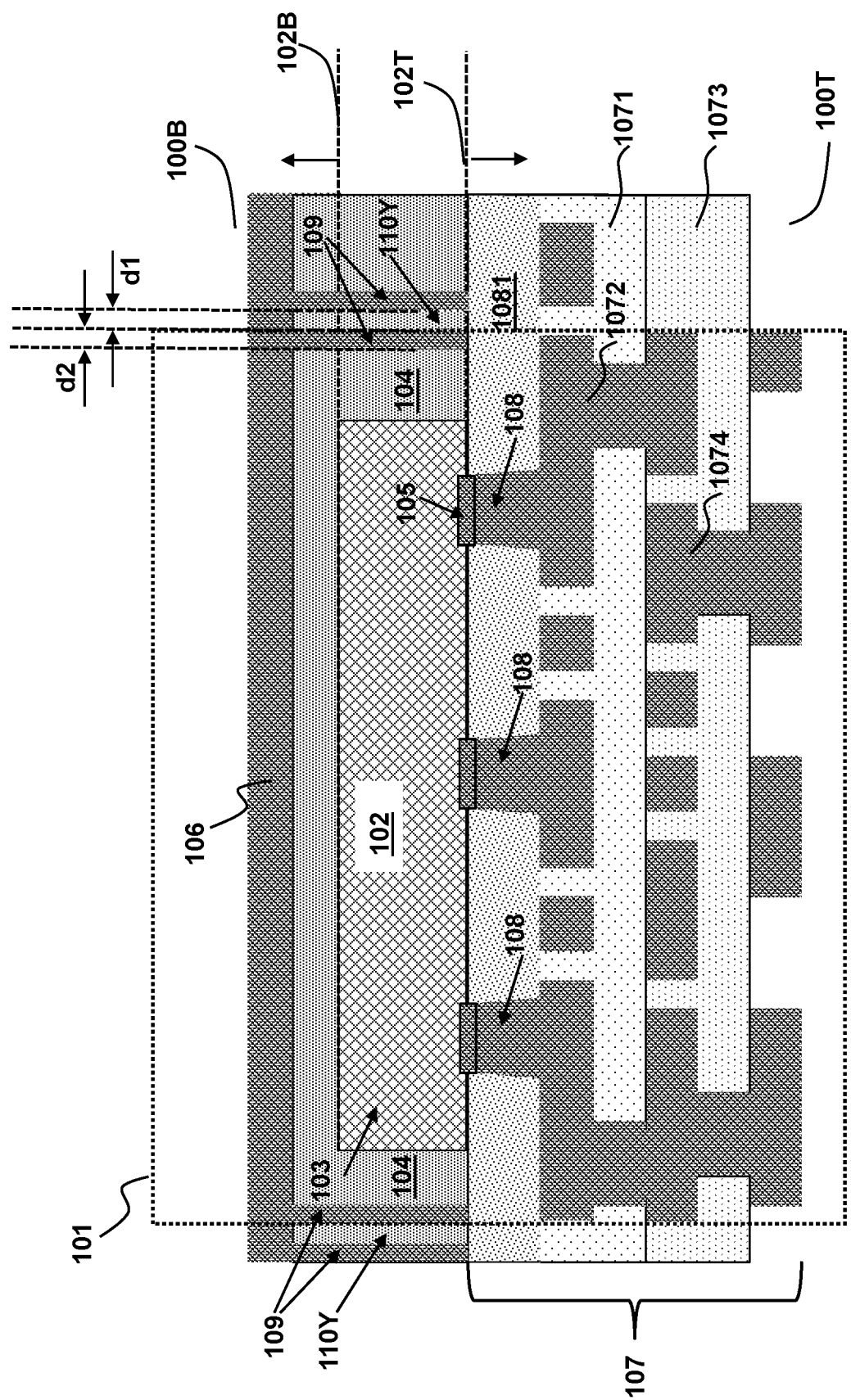

In accordance with an exemplary embodiment as shown in FIG. 1D, each one of the package units 101 in the IC package structure 100 may be molded or encapsulated by an encapsulation layer 104 (for example formed of an epoxy resin molding compound or other appropriate encapsulation materials). The encapsulation layer 104 may fill the metal wall grid of each package unit 101, cover and wrap the IC chip(s)/IC die(s) 102 in each package unit 101, and electrically isolate the integrated circuit chips or dies 102 from each other. It also plays a role in preventing moisture and shaping the entire panel of the IC package structure 100, and so on. The encapsulation layer 104 may further fill cutting lanes (for example, including the row cutting lanes 110X and the column cutting lanes 110Y in the illustrated examples of this application) between the metal wall grids 109. In this fashion, the encapsulation layer 104 may be formed for example through injection molding materials or laminating encapsulation materials to fill the metal wall grids 109 and the cutting lanes (110X, 110Y) between the metal wall grids 109 as well as cover and wrap the IC chips/IC dies 102 in the metal wall grids 109, saving manufacturing processes.

In accordance an exemplary embodiment as shown in FIG. 1D, the panel-shaped metal layer 106 may be fabricated on the entire back side 100B of the IC package structure 100 by an electroplating process, so that the panel-shaped metal layer 106 is in direct contact with the metal fence or metal wall 109 of each package unit 101 (or of each metal wall grid 109). The panel-shaped metal layer 106 may be formed by electroplating metal materials such as copper, nickel, and/or gold etc. Since the panel-shaped metal layer 106 is electroplated, during the electroplating process, molecular bonding forms at the interface between the panel-shaped metal layer 106 and the metal fence or metal wall 109 of each package unit 101 (or of each metal wall grid 109). Such molecular bonding between the metal material of the panel-shaped metal layer 106 and the metal material of the metal fence or metal wall 109 of each package unit 101 (or of each metal wall grid 109) may be very strong bond. And thus, the panel-shaped metal layer 106 may be tightly bonded to (not easy to fall off from) the back surface 102B of each IC chip/IC die 102, without the need to use any additional adhesive layer or adhesive material (such as the aforementioned adhesive material 111, which is usually a resin material having a thermal conductivity far inferior to the metal layer 106). Therefore, electroplating the panel-shaped metal layer 106 not only saves fabrication costs, but the direct contact between the panel-shaped metal layer 106 and the metal fence or metal wall 109 of each package unit 101 (or of each metal wall grid 109) may help to greatly enhance the EMI protection performance of each IC chip/IC die 102. In an embodiment, the metal layer 106 may comprise a seed layer 1061 (refer also to FIG. 2F for illustration), and a main metal layer 1062 (refer also to FIG. 2F for illustration) formed on the seed layer 1061. The main metal layer 1062 may comprise for instance a copper layer or a copper-nickel stack layer or other single metal layers or multilayer metal stacked layers. In one embodiment, the metal layer 106 may further comprise an anti-oxidation metal layer 1063 formed on the main metal layer 1062 (refer also to FIG. 2F for illustration, for example, an electroplated SUS alloy layer).

Figure 1E:
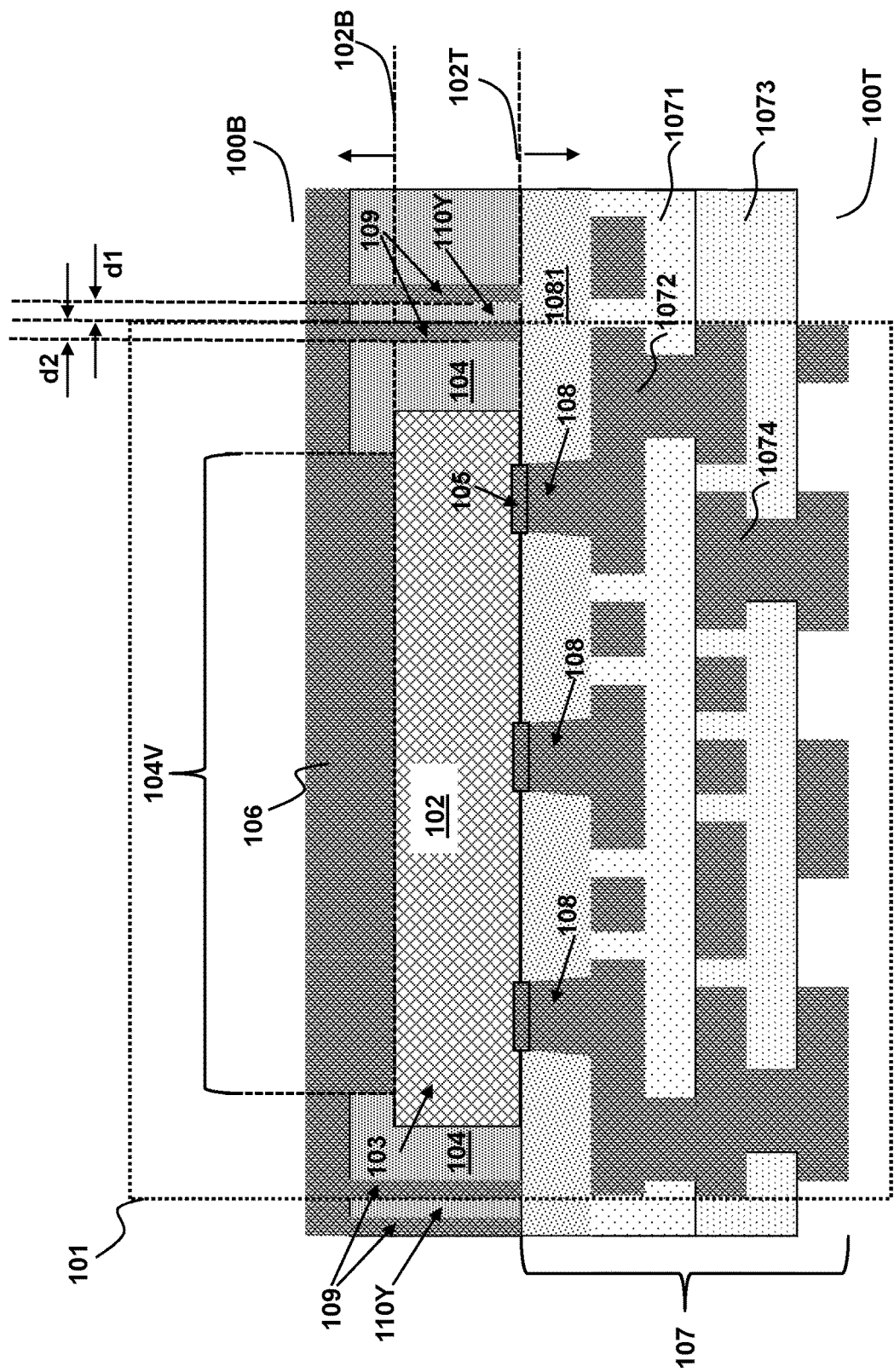
Figure 1F:
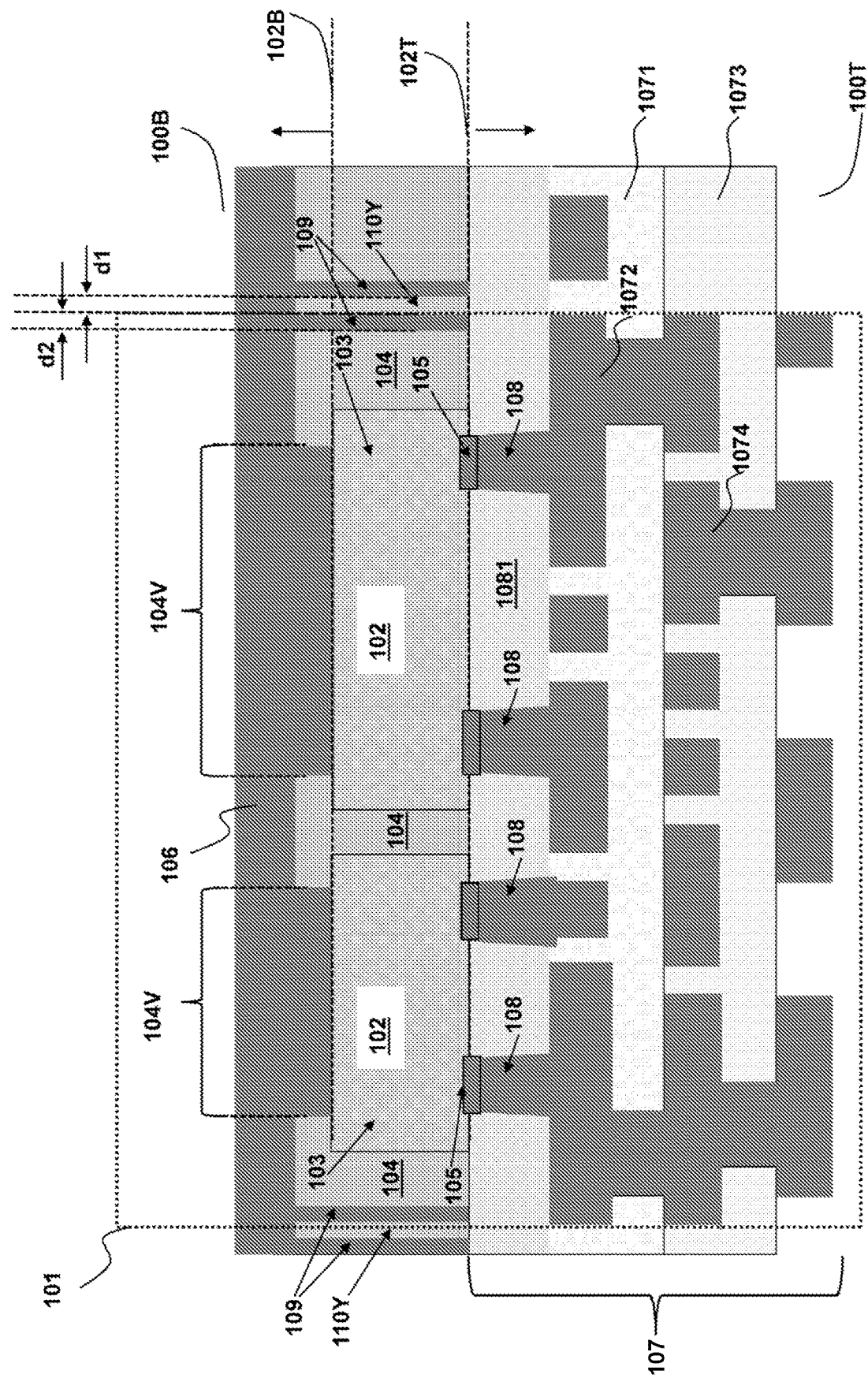
Figure 1G:
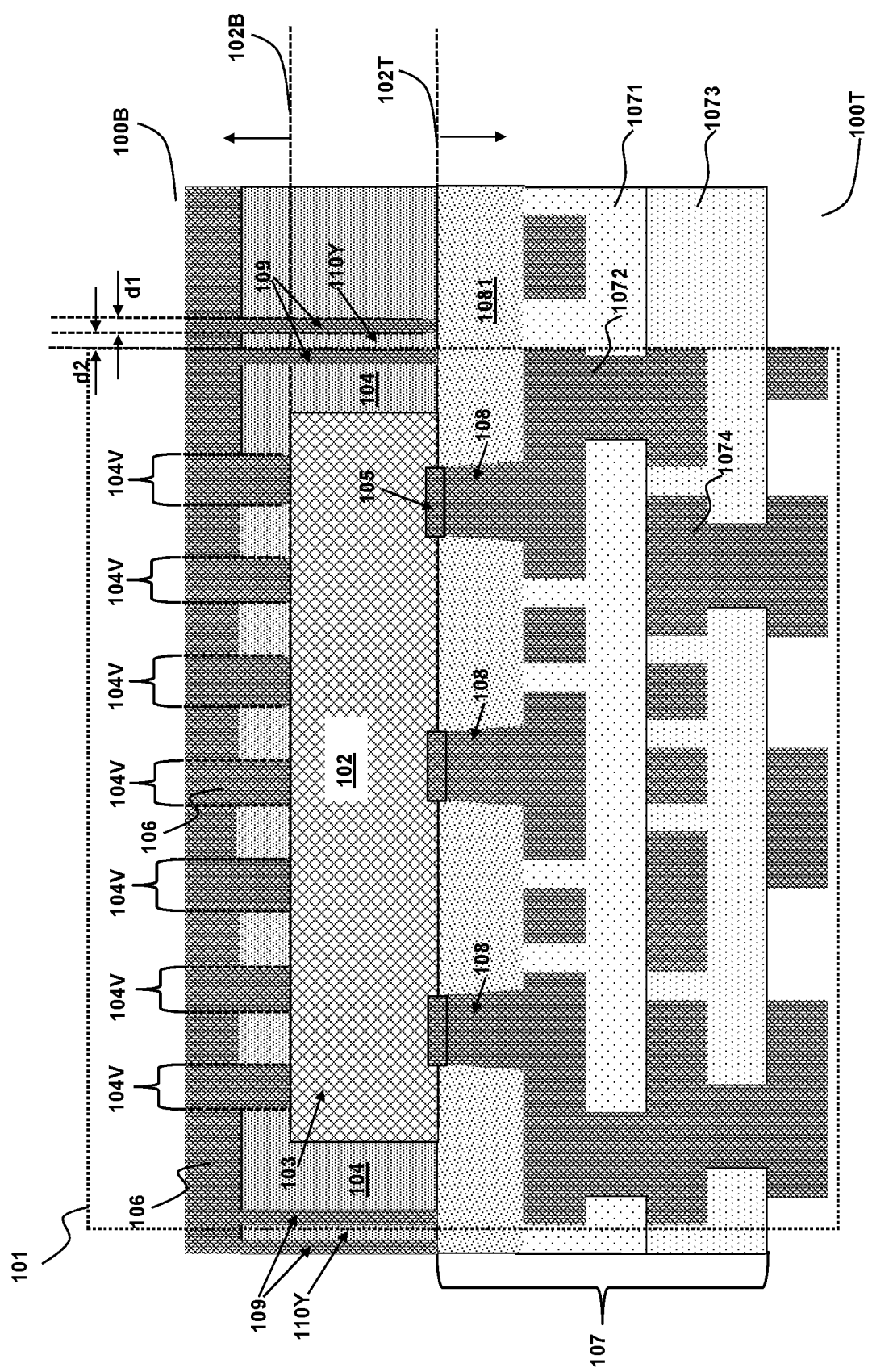
Figure 1H:
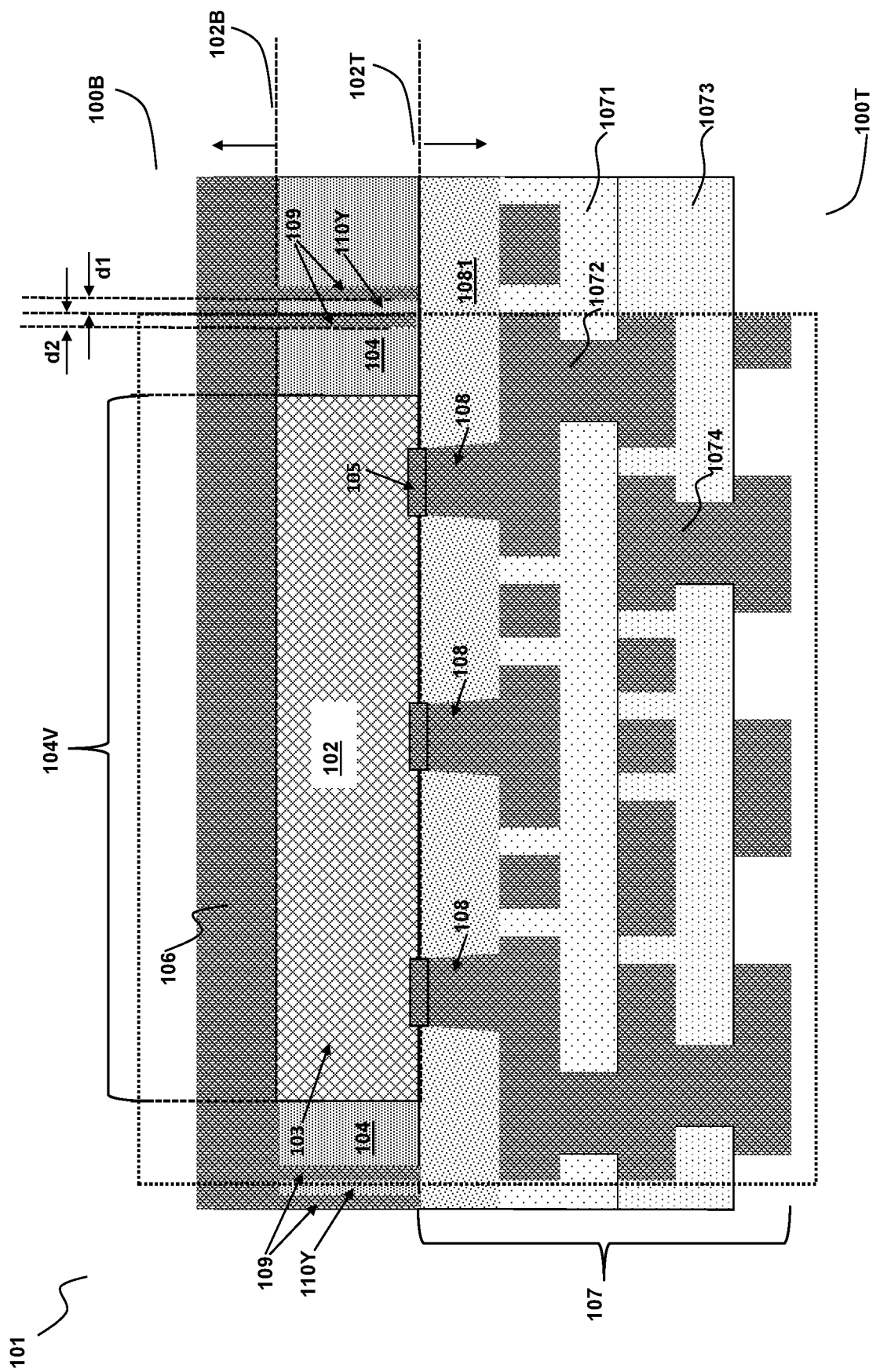

In accordance with an exemplary embodiment, the encapsulation layer 104 may have one or more openings 104V at a portion corresponding to the back surface 102B of each IC chip/IC die 102, exposing entire or at least a portion of the back surface 102B of each IC chip/IC die 102. The exemplary embodiments of this disclosure do not limit the shape, size, and number of the one or more openings 104V. For example, according to the illustration in FIG. 1E and FIG. 1F, those skilled in the art would understand that a relatively large opening 104V may be formed in portions of the encapsulation layer 104 above each IC chip/IC die 102, which may expose entire or most of the back surface 102B of each IC chip/IC die 102. FIG. 1G illustrates an alternative example. In the alternative example of FIG. 1G, a plurality of relatively small openings 104V may be formed in portions of the encapsulation layer 104 above each IC chip/IC die 102, exposing a corresponding plurality of portions (corresponding to the plurality of openings 104V) of the back surface 102B of each IC chip/IC die 102. FIG. 1H illustrates another alternative example. In FIG. 1H, the entire back surface of the IC package structure 100 may be grounded/polished (for example, with chemical grinding and/or mechanical grinding, etc.), until the entire back surface 102B of the IC chip/IC die 102 is exposed.

In accordance with the exemplary embodiments of FIG. 1E to FIG. 1H, the panel-shaped metal layer 106 may be fabricated on the entire back side 100B of the IC package structure 100 by an electroplating process and filling the openings 104V, so that the panel-shaped metal layer 106 is not only in direct contact with the metal fence or metal wall 109 of each package unit 101 (or of each metal wall grid 109) but also in direct contact with the exposed portions of the back surface 102B of each IC chip/IC die 102 (i.e., the portions of the back surface 102B of each IC chip/IC die 102 that are not covered by the encapsulation layer 104). The panel-shaped metal layer 106 may be formed by electroplating metal materials such as copper, nickel, and/or gold etc. Since the panel-shaped metal layer 106 is electroplated, during the electroplating process, molecular bonding also forms at the interface between the panel-shaped metal layer 106 and the back surface 102B of each IC chip/IC die 102. Such molecular bonding between the metal material of the panel-shaped metal layer 106 and the substrate material (e.g. typically semiconductor material) of the substrate 103 of each IC chip/IC die 102 may be very strong bond. And thus, the panel-shaped metal layer 106 may be tightly bonded to (not easy to fall off from) the back surface 102B of each IC chip/IC die 102, without the need to use any additional adhesive layer or adhesive material (such as the aforementioned adhesive material 112) which is usually a resin material having a thermal conductivity far inferior to the metal layer 106. Therefore, electroplating the panel-shaped metal layer 106 on back side of the IC package structure 100 not only saves process costs, but the direct contact between the panel-shaped metal layer 106 and the metal fence or metal wall 109 of each package unit 101 (or of each metal wall grid 109) may help to greatly enhance the EMI protection performance of each IC chip/IC die 102. Furthermore, the direct contact between the panel-shaped metal layer 106 and the back surface 102B of each IC chip/IC die 102 may help to greatly enhance the heat dissipation capacity of the IC chip/IC die 102, and improve the heat dissipation performance of each IC chip/IC die 102. In an embodiment, the panel-shaped metal layer 106 may comprise a seed layer 1061 (refer also to FIG. 2F for illustration), and a main metal layer 1062 (refer also to FIG. 2F for illustration) formed on the seed layer 1061. The main metal layer 1062 may comprise for instance a copper layer or a copper-nickel stack layer or other single metal layers or multilayer metal stacked layers. In one embodiment, the panel-shaped metal layer 106 may further comprise an anti-oxidation metal layer 1063 formed on the main metal layer 1062 (refer also to FIG. 2F for illustration, for example, an electroplated SUS alloy layer).

In accordance with an exemplary embodiment, the metal pads 105 (such as aluminum pads or copper pads) formed on the top surface 102T of each IC chip/IC die 102 may be the input/output (I/O) pads of the IC chip/IC die 102. In the examples illustrated in FIG. 1A to FIG. 1H, the metal pads 105 may be coupled to the package pins/solder bumps of the IC package structure 100 through a rewiring structure 107 to allow each IC chip/IC die 102 to be electrically coupled to external circuits or for signal communication. The rewiring structure 107 may comprise one or more interlayer dielectric layer(s) and one or more rewiring metal layer(s). For example, referring to the examples illustrated in FIG. 1A to FIG. 1H, the rewiring structure 107 may include metal pillars 108 passing/extending through a first interlayer dielectric layer 1081. For example, a plurality of metal pillars 108 may be formed corresponding to each IC chip/IC die 102 to facilitate electrical connection to the corresponding plurality of metal pads 105 of each IC chip/IC die 102. The plurality of metal pillars 108 may also be electrically connected to the rewiring metal layer(s) (for example, connected to the first rewiring metal layer 1072). The rewiring metal layers may include, for example, a first rewiring metal layer 1072 that passes/extends through a second interlayer dielectric layer 1071 and is electrically connected to the plurality of metal pillars 108. In some embodiments, the rewiring metal layer(s) may further include, for example, a second rewiring metal layer 1074, which passes/extends through a third interlayer dielectric layer 1073 to electrically connect to the first rewiring metal layer 1072. Those skilled in the art should understand that the first interlayer dielectric layer 1081, the second interlayer dielectric layer 1071, and the third interlayer dielectric layer 1073 may include a same dielectric material, or may include different dielectric materials. The rewiring structure 107 described here is just for example and not intended to be limiting.

FIG. 2A to FIG. 2J illustrate partial cross-sectional views of some process stages of a method for manufacturing an integrated circuit ("IC") package structure (for example, the IC package structure 100 mentioned in the above described embodiments with reference to FIG. 1A to FIG. 1H) in accordance with an embodiment of the present invention.

Referring to the cross-sectional view illustrated in FIG. 2A, an entire panel of a panel-shaped array of metal wall grids 109 may be attached on a carrier 201, for example, through an adhesive layer 202 (for example, a resin-like material that is easy to peel off). Each metal wall grid 109 in the panel-shaped metal wall grids 109 array has a continuous and closed metal fence/wall (also labeled 109 for brevity). Those skilled in the art should understand that the top plan view of the panel-shaped metal wall grids 109 array may refer to the illustration in the example of FIG. 1A and related descriptions, which will not be addressed again here. Those skilled in the art should understand that the shape and size of the panel-shaped metal wall grids 109 array and the shape and size of the carrier 201 may be reasonably selected according to the shape, size, and quantity of the integrated circuit chips/dies 102 to be packaged, which is not limited in this application.

Figure 2B:
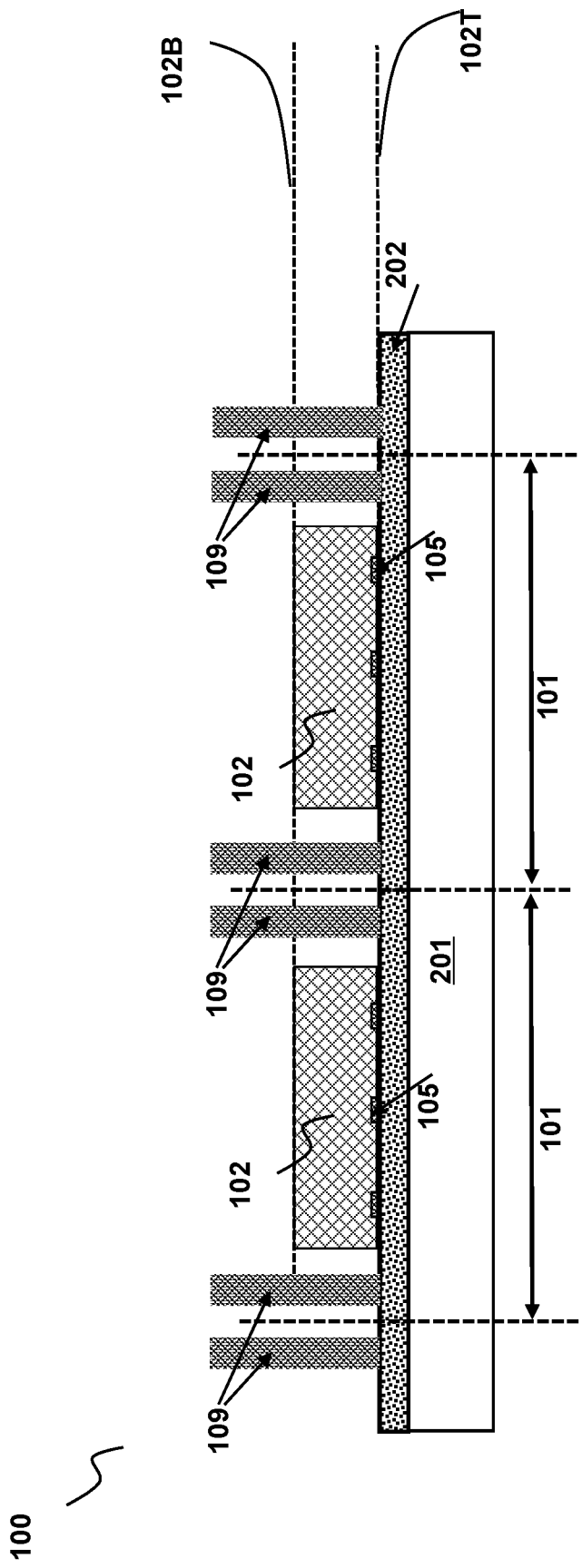

Referring to the cross-sectional view illustrated in FIG. 2B, a plurality of (at least one) IC chips/IC dies 102 to be packaged may be attached/adhered to a carrier 201 through an adhesive layer 202 (for example, a resin material that is easy to peel off, etc.). In an exemplary embodiment, at least one IC chip/IC die 102 may be placed in each metal wall grid 109. In the examples shown in FIG. 2A to FIG. 2H, the IC chips/IC dies 102 may comprise flip chip IC chips/IC dies, each having a top surface 102T with a plurality of metal pads 105 formed thereon and a back surface 102B opposite to the top surface 102T. A plurality of preset positions may be designated in advance on the carrier 201 for the plurality of the IC chips/IC dies 102 to be packaged in a one-to-one correspondence manner. The plurality of integrated circuit chips/dies 102 may be placed in the metal wall grids 109 array with the top side 102T facing the carrier 201 in batches and attached on the carrier 201. The plurality of IC chips/IC dies 102 may be mounted on the carrier 201 in batches with the top surface 102T of each IC chip/IC die 102 facing down to the carrier 201 and attached on a corresponding preset position on the carrier 201 within a corresponding metal wall grid 109. Usually the plurality of IC chips/IC dies 102 may be packaged in batch through subsequent processes to form a panel level IC package structure (such as the IC package structure 100). The panel level IC package structure may at last be singulated or cut into a plurality of individual package units (such as package units 101) with each metal wall grid 109 as a cutting unit (i.e. each metal wall grid 109 is used as a boarder of a single package unit 101) in the Z-axis direction. Each singulated/individual package unit 101 may comprise at least one IC chip/IC die 102. For better understanding, one can also turn to the exemplary top plan view illustration in FIG. 1A for reference. The cross-section shown in FIG. 2B may be considered as a partial cross-sectional view corresponding to a portion cutting along the C-C' cutting line in the Z-axis of FIG. 1A during a certain stage (e.g. chip/die attaching stage) of the production process. One of ordinary skill in the art would understand that in the exemplary cross-sectional views of FIG. 2A to FIG. 2J, the center line of the cutting lanes between the package units 101 (or the metal wall grids 109) are illustrated in dashed lines.

Figure 2C:
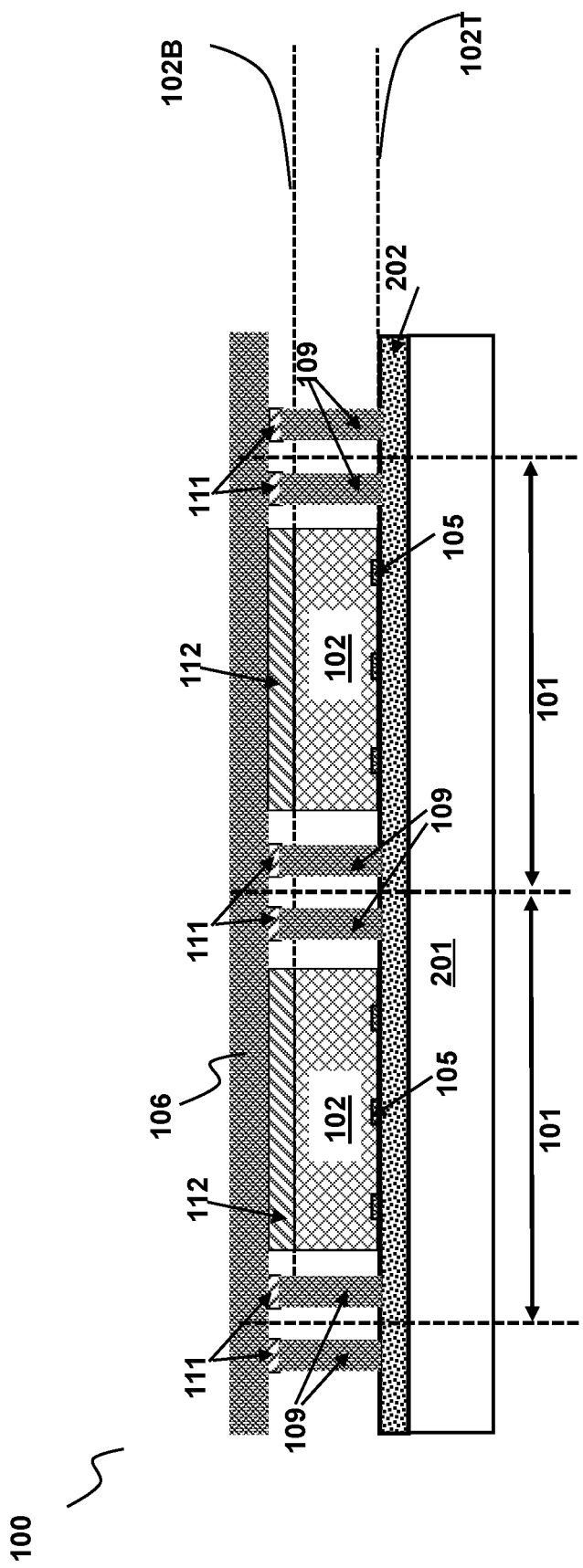

Now turning to the cross-sectional view illustrated in FIG. 2C, after the integrated circuit chips/dies 102 are attached to the carrier 201, a panel-shaped metal layer 106 corresponding to the panel-shaped metal wall grids 109 array may be fabricated on the entire back side 100B of the IC package structure 100 under fabrication, so that the panel-shaped metal layer 106 is bonded to the metal fence/wall 109 of each metal wall grid 109. Optionally, the panel-shaped metal layer 106 may be prefabricated as a whole board, and bonded to the metal fence/wall 109 through an adhesive material 111 having a strong adhesive coefficient. The panel-shaped metal layer 106 may be further bonded to the back surface 102B of each integrated circuit chip/die 102 through an adhesive material 112 having a better thermal conductivity than the adhesive material 111.

Figure 2D:
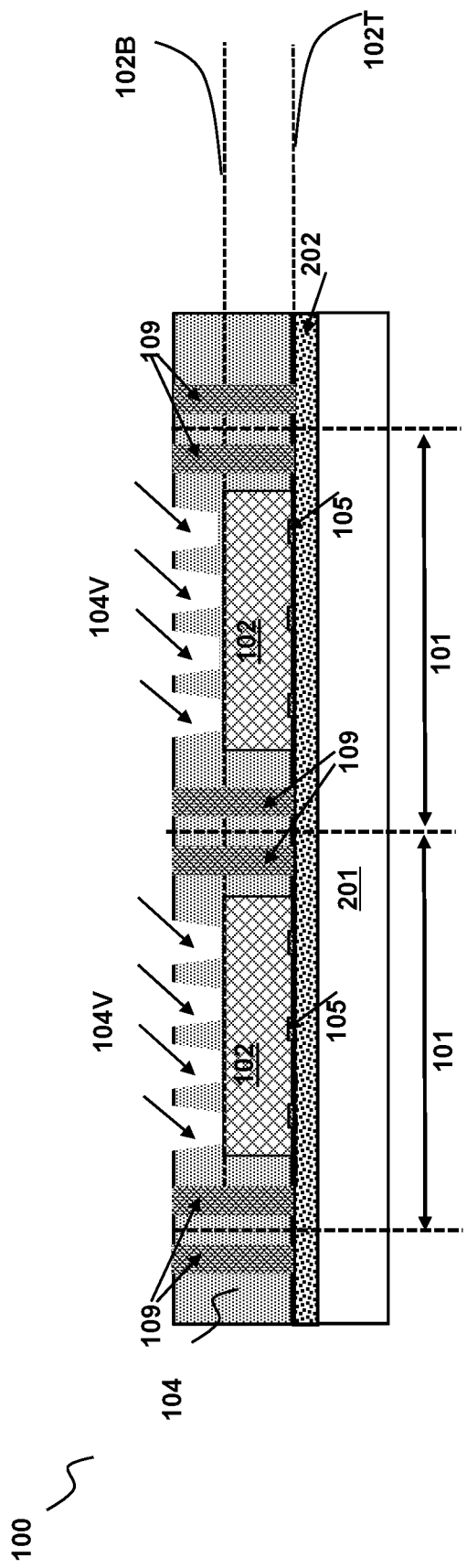
Figure 2E:
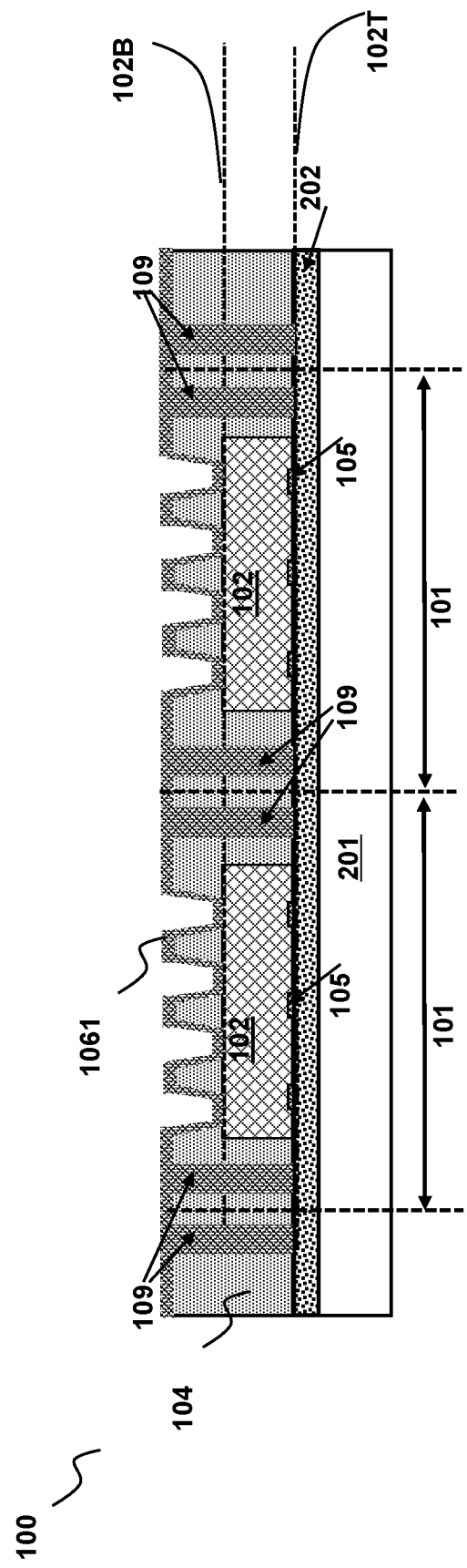
Figure 2F:
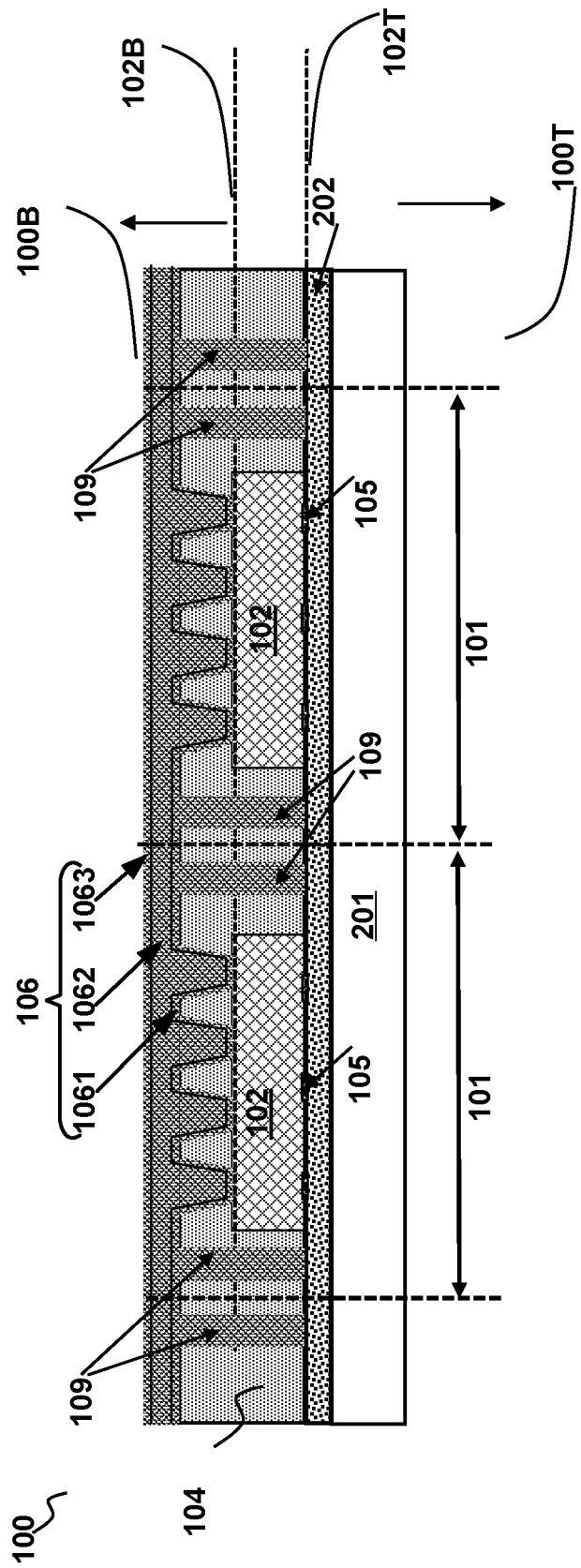

In accordance with an embodiment of the present invention, referring to FIG. 2D to FIG. 2F, as an alternative embodiment of the related steps illustrated in FIG. 2C, an encapsulation layer 104 (e.g. formed of an epoxy resin molding compound or other appropriate encapsulation materials such as other plastic packaging materials etc.) may be formed. As illustrated in FIG. 2D, the encapsulation layer 104 may fill the metal wall grid 109 of each package unit 101, cover and wrap the IC chip(s)/IC die(s) 102 in each package unit 101, and electrically isolate the integrated circuit chips or dies 102 from each other. It also plays a role in preventing moisture and shaping the entire panel of the IC package structure 100, and so on. The encapsulation layer 104 may further fill cutting lanes (for example, including the row cutting lanes 110X and the column cutting lanes 110Y in the illustrated examples of this application) between the metal wall grids 109. In this fashion, the encapsulation layer 104 may be formed for example through injection molding materials or laminating encapsulation materials to fill the metal wall grids 109 and the cutting lanes (110X, 110Y) between the metal wall grids 109 as well as cover and wrap the IC chips/IC dies 102 in the metal wall grids 109, saving manufacturing processes. After that, at least a portion of the encapsulation layer 104 may be removed to expose the metal walls of the metal wall grids 109 and to form one or more openings 104V to expose entirety or at least a portion of the back surface 102B of each IC chip/IC die 102. In the example of FIG. 2D, it is illustrated that a plurality of openings 104V are formed in the encapsulation layer 104 above the back surface 102B of each IC chip or IC die 102. However, those skilled in the art should understand that the exemplary embodiments of this disclosure do not limit the shape, size, and number of the openings 104V. For instance, more examples may be referred to the illustrations in FIG. 1C to FIG. 1G and corresponding descriptions in connection with these figures. There are many options for forming the openings 104V in the encapsulation layer 104, for example, laser polishing, chemical polishing, or mechanical polishing or one or more combinations thereof may be used.

Now referring to FIG. 2E, a seed layer 1061 may be formed on the encapsulation layer 104, the exposed surface of the metal wall grids 109 and the exposed back surface 102B of the IC chips or IC dies 102. The seed layer 1061 may be spread over the surface of the encapsulation layer 104, the exposed surface of the metal wall grids 109 and the exposed back surface 102B (exposed by the plurality of openings 104V) of the IC chips or IC dies 102 for instance by sputtering conductive materials (such as titanium, copper, or other metals or alloys etc.). In an embodiment, the seed layer 1061 may comprise a titanium-copper (Ti—Cu) stack layer, wherein the titanium layer may be formed on the surface of the encapsulation layer 104, the exposed surface of the metal wall grids 109 and the exposed back surface 102B of the IC chips or IC dies 102, and the copper layer may be formed on the titanium layer. In the titanium-copper (Ti—Cu) stack layer, the titanium layer may be used as a protective layer, and the copper layer may be used as an electroplating seed layer.

Now referring to FIG. 2F, a panel-shaped metal layer 106 may be formed by electroplating metal materials (for example, copper, nickel, gold, or other metal or alloy etc.). In an exemplary embodiment, electroplating metal materials may comprise electroplating a copper layer or a copper-nickel stack layer or other single metal layers or multilayer metal stacked layers to form a main metal layer 1062. In an embodiment, electroplating metal materials may further comprise electroplating an anti-oxidation metal layer 1063 (for example, an SUS alloy layer) on the main metal layer 1062. The anti-oxidation metal layer 1063 may protect the main metal layer 1062 from being oxidized. In such an example, the panel-shaped metal layer 106 may finally comprise the seed layer 1061, the main metal layer 1062 and the anti-oxidation metal layer 1063. The panel-shaped metal layer 106 covers the entire back side 100B of the IC package structure 100 (the side to which the back surface 102B of the IC chips or IC dies 102 are facing) and fills the opening(s) 104V, so that the metal layer 106 is in direct contact with the exposed portions of the back surface 102B of each IC chip/IC die 102 (i.e., the portions of the back surface 102B of each IC chip/IC die 102 that are not covered by the encapsulation layer 104) and also in direct contact with the metal fence or metal wall of each metal wall grid 109. In an exemplary embodiment, the panel-shaped metal layer 106 may be formed to have a thickness of 10 μm to 2000 μm. In an alternative exemplary embodiment, the panel-shaped metal layer 106 may be formed to have a thickness of 50 μm to 1000 μm. In an alternative exemplary embodiment, the panel-shaped metal layer 106 may be formed to have a thickness of 100 μm to 500 μm. In still an alternative exemplary embodiment, the panel-shaped metal layer 106 may be formed to have a thickness of 100 μm to 200 μm. During the process of electroplating the panel-shaped metal layer 106, molecular bonding forms at the interface between the panel-shaped metal layer 106 and the metal fence or metal wall 109 of each package unit 101 (or of each metal wall grid 109). Such molecular bonding between the metal material of the panel-shaped metal layer 106 and the metal material of the metal fence or metal wall 109 may be very strong bond. And thus, the panel-shaped metal layer 106 may be tightly bonded to the metal wall grids 109 and not easy to fall off from the back side 100B of the IC package structure 100, without the need to use any additional adhesive layer or adhesive material (such as the aforementioned adhesive material 111). Therefore, electroplating the panel-shaped metal layer 106 not only saves fabrication costs, but the direct contact and bond between the panel-shaped metal layer 106 and the metal fence/wall 109 of each package unit 101 (or of each metal wall grid 109) may help to greatly enhance the EMI protection performance of each IC chip/IC die 102. Molecular bonding also forms at the interface between the panel-shaped metal layer 106 and the back surface 102B of each IC chip/IC die 102, making the panel-shaped metal layer 106 tightly bonded to (not easy to fall off from) the back surface 102B of each IC chip/IC die 102 without the need to use any additional adhesive layer or adhesive material (such as the aforementioned adhesive material 112) which is usually a resin material having a thermal conductivity far inferior to the metal layer 106. In addition, the direct contact between the panel-shaped metal layer 106 and the back surface 102B of each IC chip/IC die 102 may help to greatly enhance the heat dissipation performance of each IC chip/IC die 102.

Figure 2G:
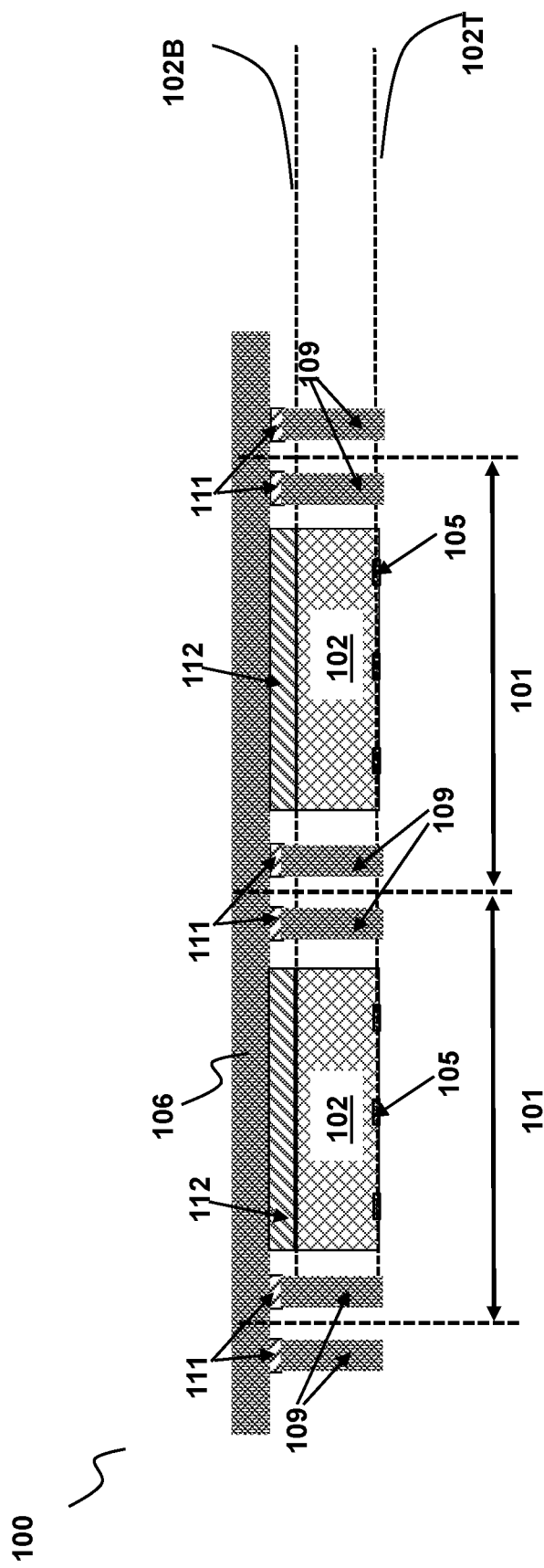
Figure 2H:
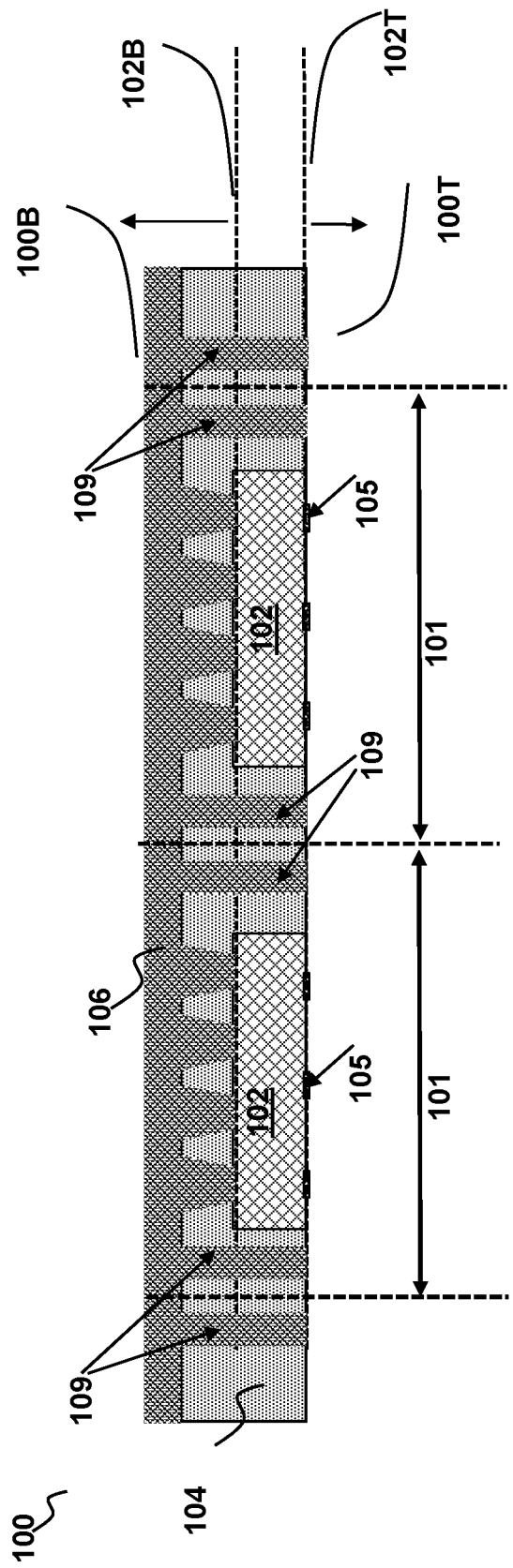

Next, referring to the example of FIG. 2G and FIG. 2H, after the panel-shaped metal layer 106 is fabricated on the entire back side 100B of the IC package structure 100, for example, after at least the steps of FIG. 2C or the steps of FIG. 2D to FIG. 2F (those skilled in the art should understand that other process steps may also be included, which are not limited and detailed here), the carrier 201 is peeled off and the adhesive layer 202 is removed to expose the top surface 102T of each integrated circuit chip/die 102 and its metal pads 105. FIG. 2G shows a cross-sectional view of a portion of the structure after the carrier 201 is peeled off and the adhesive layer 202 is removed following the steps of FIG. 2C. In alternative, FIG. 2H shows a cross-sectional view of a portion of the structure after the carrier 201 is peeled off and the adhesive layer 202 is removed following the steps of FIG. 2F. So far, a panel-shaped IC package structure 100 including a plurality of (at least one) integrated circuit chips/dies 102, an encapsulation layer 104, and a panel-shaped metal layer 106 is manufactured. On the top side 100T of the panel level IC package structure 100, the top surface 102T of each IC chip or IC die 102 and its metal pads 105 are exposed, which allows the packaged IC chip or IC die 102 to interact with other external circuits or external structure or external components for electrical connection and/or signal communication.

Figure 2I:
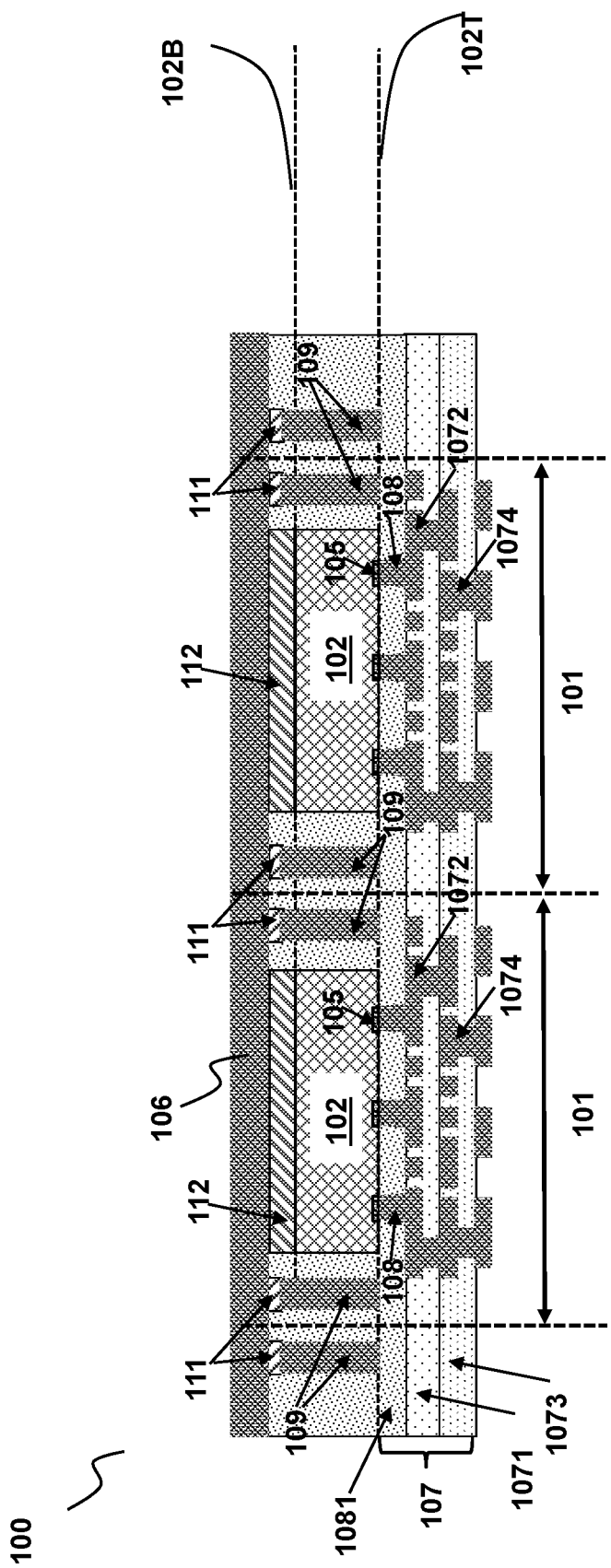
Figure 2J:
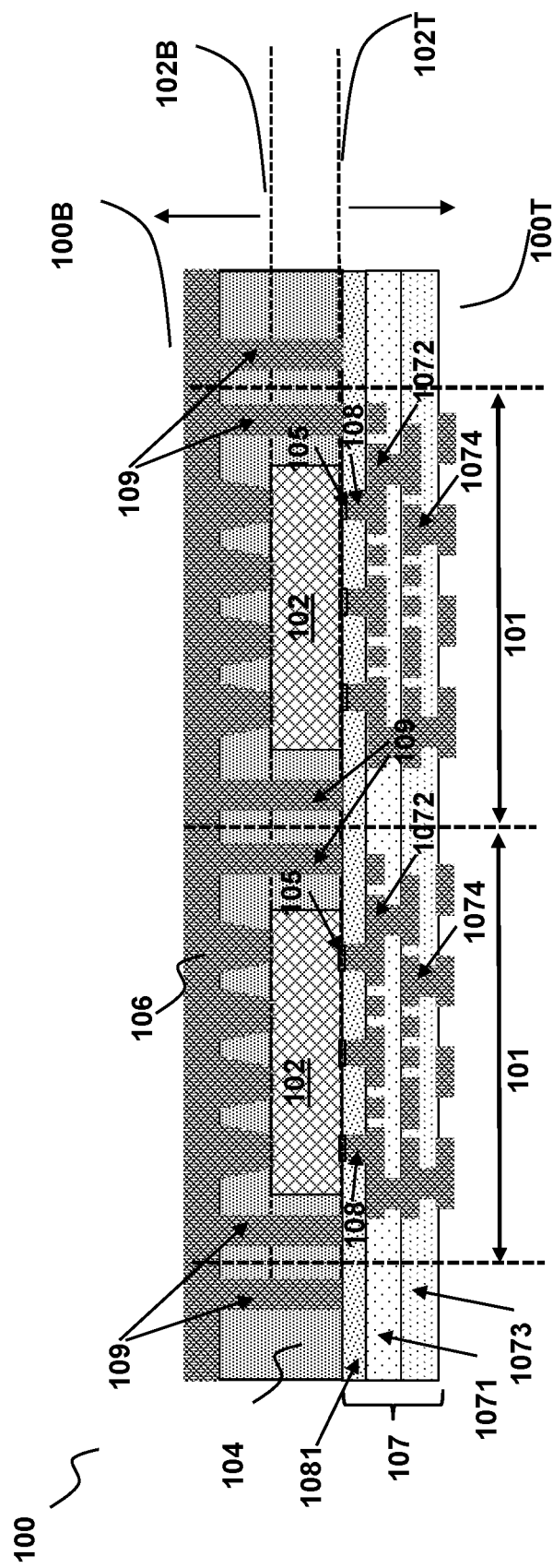

For instance, referring to the examples of FIG. 2I and FIG. 2J, the metal pads 105 of each integrated circuit chip/die 102 may be led out on the top side 100T of the panel-shaped IC package structure 100 through a rewiring process. For example, a rewiring structure 107 may be fabricated to lead out each integrated circuit chip/die 102. FIG. 2I shows a cross-sectional view of a portion of the IC package structure 100 formed after the rewiring structure 107 is further fabricated following the steps of FIG. 2G. In alternative, FIG. 2J shows a cross-sectional view of a portion of the IC package structure 100 formed after the rewiring structure 107 is further fabricated following the steps of FIG. 2H. Those skilled in the art should understand that there are many methods for fabricating the rewiring structure 107, which are not limited or exhaustive in this application, and the following are only examples. The rewiring structure 107 may be fabricated by a method different from the following examples, which does not exceed the spirit and protection scope of the present invention.

For obtaining the exemplary structures shown in FIG. 2I and FIG. 2J, according to an exemplary embodiment, a plating mask (for instance a dry film such as a polyimide film) may be formed on the exposed surface of the top side 100T of the panel-shaped IC package structures 100 respectively shown in FIG. 2G and FIG. 2H. One of ordinary skill in the art would understand that here, "on" does not specifically refer to on the upper side in the cross sectional views, because the top side 100T of the IC package structures 100 shown in 2G and FIG. 2H is facing down, but before the actual rewiring process, the panel-shaped IC package structures 100 will be flipped so that the top side 100T is facing upwards. Then, the plating mask may be patterned (for example, patterned by using laser direct imaging technology or other exposure and development techniques) to expose the metal pads 105. After that, the patterned plating mask may be used as a mask for forming a plurality of metal pillars 108 corresponding to each IC chip/IC die 102 for example by an electroplating process, with each one of the plurality of metal pillars 108 connected to a corresponding one of the plurality of metal pads 105. Subsequently, the plating mask may be removed and a first interlayer dielectric layer 1081 may be formed for example by a lamination (or rolling) process. For the example structure of FIG. 2I, the first interlayer dielectric layer 1081 may be formed to fill each one of the array of metal wall grids 109, the cutting lanes (e.g. 110X and 110Y) between the metal wall grids 109 and all the gaps between the metal pillars 108. For the example structure of FIG. 2J, the first interlayer dielectric layer 1081 may be formed to fill all the gaps between the metal pillars 108. Optionally, according to an alternative exemplary embodiment, the first interlayer dielectric layer 1081 may be formed on the exposed surface of the top side 100T of the panel-shaped IC package structures 100 respectively shown in FIG. 2G and FIG. 2H, and then the first interlayer dielectric layer 1081 may be patterned, for example, by a laser drilling process to expose the metal pads 105, and then the patterned first interlayer dielectric layer 1081 may be used as a mask for electroplating metal materials to form the metal pillars 108.

Similarly, a patterned plating mask may be further fabricated on the first interlayer dielectric layer 1081 according to practical application requirements, and then a first rewiring metal layer 1072 may be fabricated by electroplating with the patterned plating mask as a mask for the electroplating process. A person skilled in the art should understand that in order to form the first rewiring metal layer 1072 of irregular shape, it is possible to repeat the process of forming the plating mask, patterning the plating mask, and electroplating metal materials with the patterned plating mask as a mask for electroplating. After the first rewiring metal layer 1072 is made, the plating mask may be entirely removed, and then a second interlayer dielectric layer 1071 may be formed for example by a lamination (or rolling) process. The second interlayer dielectric layer 1071 may fill all the gaps between segments of the first rewiring metal layer 1072. Optionally, accordingly to an alternative embodiment, the second interlayer dielectric layer 1071 may firstly be formed on the first interlayer dielectric layer 1081, and then the second interlayer dielectric layer 1071 may be patterned, and subsequently the patterned second interlayer dielectric layer 1071 may be used as a mask for electroplating to form the first rewiring metal layer 1072.

It is also possible to further fabricate a patterned plating mask on the second interlayer dielectric layer 1071 according to practical application requirements, and then a second rewiring metal layer 1074 may be fabricated by electroplating metal materials with the patterned plating mask as a mask for the electroplating process. A person skilled in the art should understand that in order to form the second rewiring metal layer 1074 of irregular shape, it is possible to repeat the process of forming the plating mask, patterning the plating mask, and electroplating metal materials with the patterned plating mask as a mask for electroplating. After the second rewiring metal layer 1074 is made, the plating mask may be entirely removed, and then a third interlayer dielectric layer 1073 may be formed for example by a lamination (or rolling) process. The third interlayer dielectric layer 1073 may fill all the gaps between segments of the second rewiring metal layer 1074. Optionally, accordingly to an alternative embodiment, the third interlayer dielectric layer 1073 may firstly be formed on the second interlayer dielectric layer 1071, and then the third interlayer dielectric layer 1073 may be patterned, and subsequently the patterned third interlayer dielectric layer 1073 may be used as a mask for electroplating to form the second rewiring metal layer 1074, etc. Those skilled in the art should understand that the first interlayer dielectric layer 1081, the second interlayer dielectric layer 1071, and the third interlayer dielectric layer 1073 may comprise a same dielectric material, or may include different dielectric materials.

Figure 3:
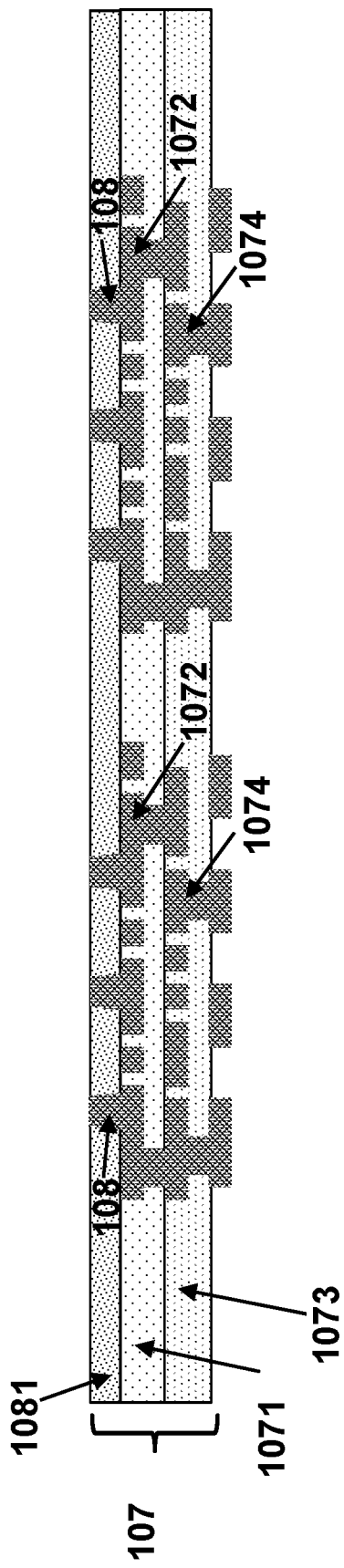
FIG. 3 illustrates a partial cross-sectional view of a rewiring structure 107 prefabricated as a panel-level rewiring board in accordance with an embodiment of the present invention.
Figure 4:
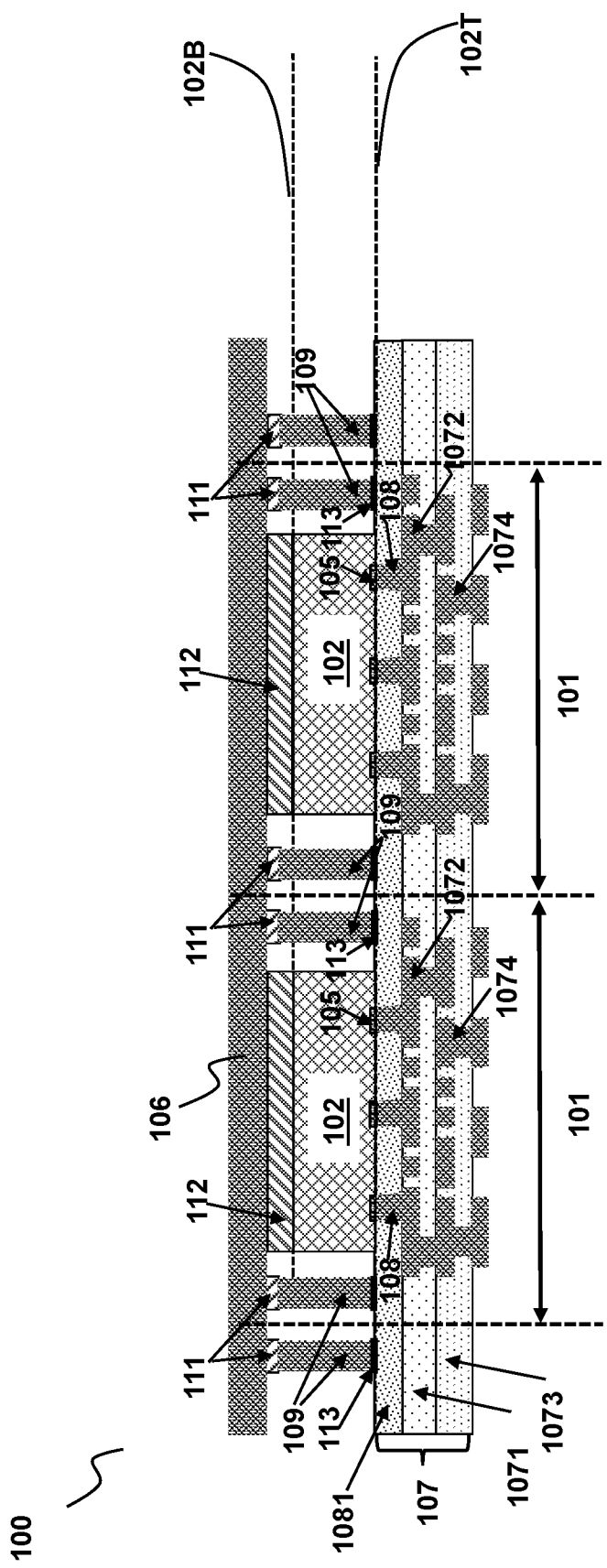
FIG. 4 illustrates a partial cross-sectional view of an IC package structure 100 formed by bonding and/or welding/soldering the entire panel-shaped IC package structure 100 shown in step of FIG. 2G with the prefabricated panel-shaped rewiring substrate 107 shown in FIG. 3 in accordance with an alternative embodiment of the present invention.

In accordance with an alternative embodiment of the present invention, as shown in FIG. 3, the rewiring structure 107 may be prefabricated as a panel-level rewiring board (also referred to as a panel-level rewiring substrate 107). In the example of FIG. 3, the panel-level rewiring board/substrate 107 is illustrated as comprising a plurality of interlayer dielectric layers (e.g. a first interlayer dielectric layer 1081, a second interlayer dielectric layer 1071, a third interlayer dielectric layer 1073 etc.) and a plurality of rewiring metal layers (e.g. a plurality of metal pillars 108, a first rewiring metal layer 1072, a second rewiring metal layer 1074 etc.). The process steps of prefabricating the panel-level rewiring board/substrate 107 may be similar to the fabrication process steps as described above with reference to FIGS. 2I and 2J for forming the rewiring structure 107. For instance, the prefabricated panel-level rewiring board/substrate 107 may be formed by repeating the process steps of forming a plating mask (e.g. a dry film such as a polyimide film), patterning the plating mask, electroplating metal materials with the patterned plating mask as a mask for electroplating to form a rewiring metal layer, removing the patterned plating mask and forming an interlayer dielectric layer by lamination (or rolling). Alternatively, as another example, the prefabricated panel-level rewiring board/substrate 107 may be formed by repeating the process steps of forming an interlayer dielectric layer by lamination (or rolling), patterning the interlayer dielectric layer (e.g. by a laser drilling process), and electroplating metal materials with the patterned interlayer dielectric layer as a mask for electroplating to form a rewiring metal layer. One of ordinary skill in the art should understand that other process steps may also be included, which are not limited and not addressed in more details here. The prefabricated panel-level rewiring board/substrate 107 may correspond to the panel-shaped array of package units 101 (or the panel-shaped array of metal wall grids 109). Those skilled in the art should understand that the panel-level rewiring board/substrate 107 has a whole board/integrity. Those skilled in the art should understand that the panel-shaped rewiring substrate 107 when mentioned refers to its panel level entirety and integrity. The panel-shaped rewiring substrate 107 corresponding to the panel-shaped array of package units 101 (or the panel-shaped array of metal wall grids 109) at least means that the panel-shaped rewiring substrate 107 has a panel size compatible to (or matching with) the panel size of the panel-shaped array of package units 101 or the panel size of the panel-shaped array of metal wall grids 109 (here refers to the size on the X-Y plane). For instance, the panel size of the panel-shaped rewiring substrate 107 should at least be large enough to cover the entire top side of the panel-shaped package units 101 array (or the panel-shaped metal wall grids 109 array) or to cover the entire top side 100T of the IC package structure 100. Meaning of the panel-shaped rewiring substrate 107 corresponding to the panel-shaped array of package units 101 (or the panel-shaped array of metal wall grids 109) may further include that the metal pillars 108 in the rewiring substrate 107 are compatible to or matching with the plurality of metal pads 105 of each integrated circuit chip/die 102 placed in each package unit 101 (or each metal wall grid 109) that need to be led out. For instance, the metal pillars 108 in the rewiring substrate 107 are in one-to-one correspondence with the metal pads 105 of the integrated circuit chips/dies 102 in size, quantity and position etc., so that the prefabricated panel-shaped rewiring substrate 107 may be directly bonded/soldered in panel level to the panel-shaped IC package structure 100 obtained in steps of FIG. 2G or FIG. 2H showing that the panel-shaped IC package structure 100 includes a panel-shaped array of metal wall grids 109, a plurality of (at least one) integrated circuit chips/dies 102, and a panel-shaped metal layer 106. For example, bonding and/or welding/soldering the entire panel-shaped IC package structure 100 shown in step of FIG. 2G with the prefabricated panel-shaped rewiring substrate 107 shown in FIG. 3 may form the panel-shaped IC package structure shown in FIG. 4 (still labeled as IC package structure 100). Bonding and/or welding/soldering the entire panel-shaped IC package structure 100 shown in the step of FIG. 2H with the prefabricated panel-shaped rewiring substrate 107 shown in FIG. 3 may form the panel-shaped IC package structure 100 as illustrated in FIG. 2J.

FIG. 5A to FIG. 5G illustrate partial cross-sectional views process of some stages of a method for manufacturing an integrated circuit ("IC") package structure (for example, the IC package structure 100 mentioned in the above described embodiments with reference to FIG. 1A to FIG. 1H) in accordance with an alternative embodiment of the present invention.

Figure 5A:
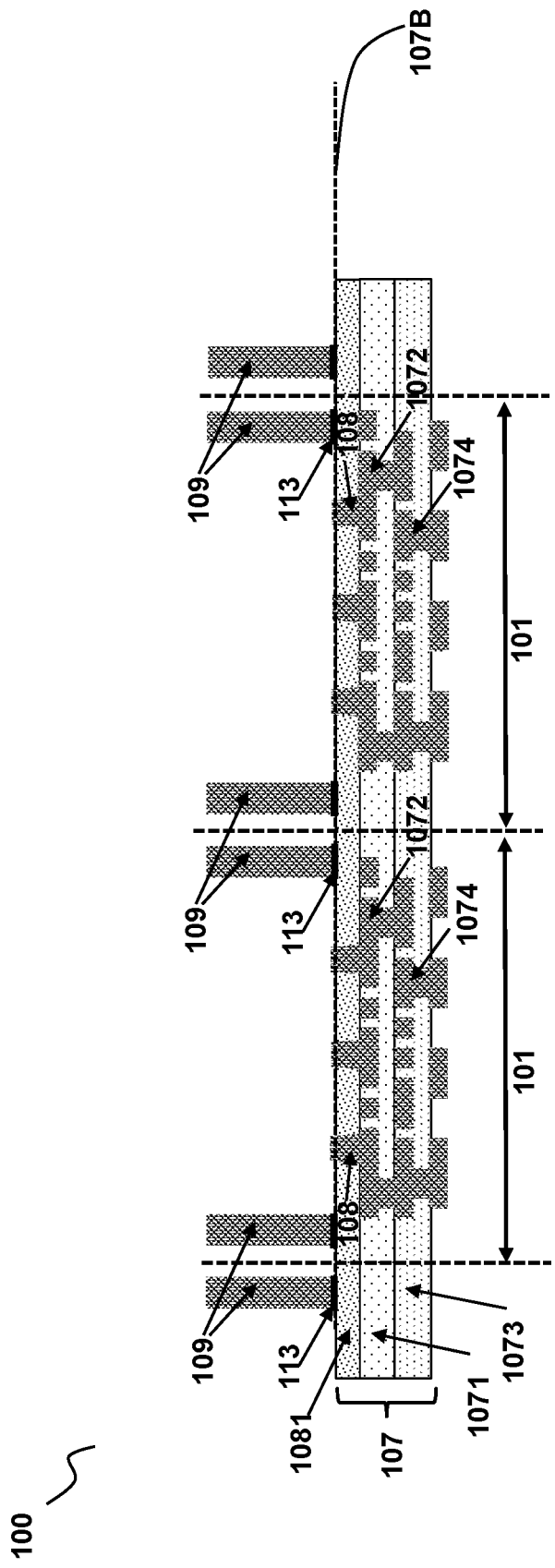
FIG. 5A to FIG. 5G illustrate partial cross-sectional views process of some stages of a method for manufacturing an integrated circuit ("IC") package structure in accordance with an alternative embodiment of the present invention.

Referring to the cross-sectional view illustrated in FIG. 5A, the entire panel of the array of metal wall grids 109 may be bonded or welded to the panel-shaped rewiring substrate 107 as shown in the embodiment of FIG. 3 for example through an adhesive material having a strong adhesive coefficient or a bonding or solder material 113. In an embodiment, an adhesive material or a solder material 113 may be pasted on predetermined positions on the panel-shaped rewiring substrate 107 corresponding to the array of the metal wall grids 109. Each metal wall grid 109 in the panel-shaped metal wall grids 109 array has a continuous and closed metal wall (also labeled with 109 for brevity). Those skilled in the art should understand that the top plan view of the panel-shaped metal wall grids 109 array may refer to the illustration in the example of FIG. 1A and related descriptions, which will not be addressed again here. Those skilled in the art should understand that the shape and size of the panel-shaped metal wall grids 109 array and the shape and size of the panel-shaped rewiring substrate 107 may be reasonably selected according to the shape, size, and quantity of the integrated circuit chips/dies 102 to be packaged, which is not limited in this application.

Figure 5B:
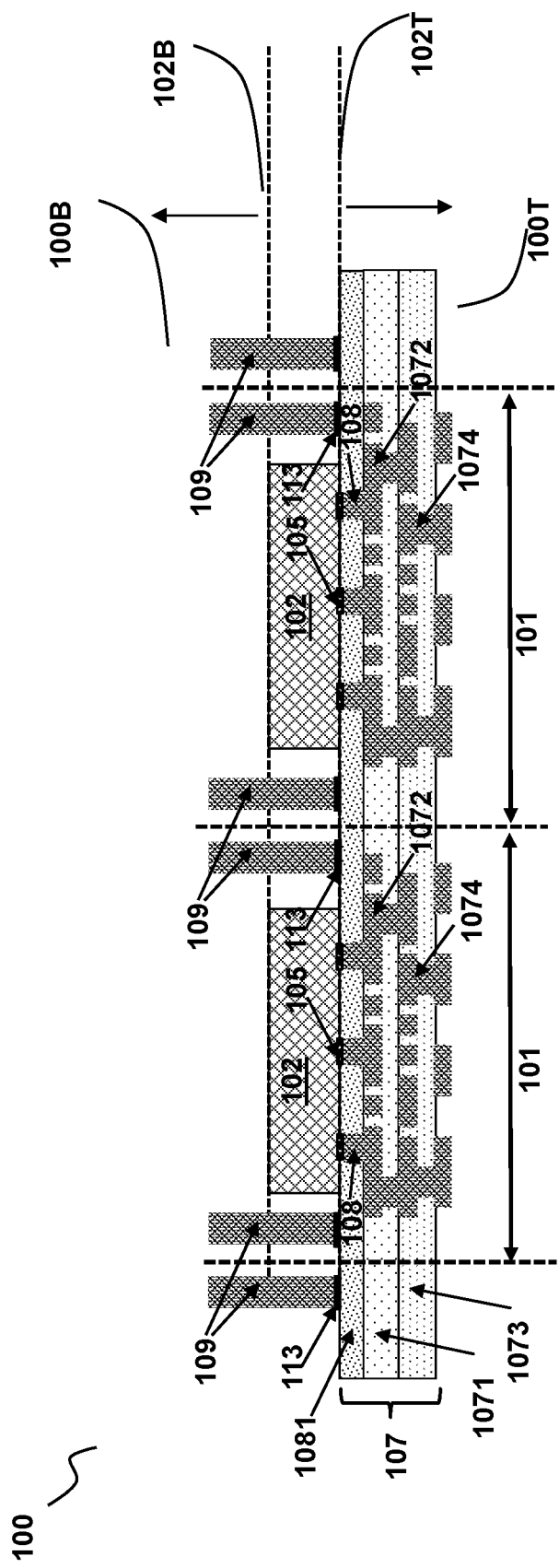

Next, referring to the cross-sectional view illustrated in FIG. 5B, a plurality of (at least one) integrated circuit chips/dies 102 to be packaged may be soldered on the panel-level rewiring board/substrate 107. In an exemplary embodiment, at least one IC chip/IC die 102 may be placed in each metal wall grid 109. In the examples shown in FIG. 5A to FIG. 5G, the IC chips/IC dies 102 may comprise flip chip IC chips/IC dies, each having a top surface 102T with a plurality of metal pads 105 formed thereon and a back surface 102B opposite to the top surface 102T. The plurality of integrated circuit chips/dies 102 may be placed in the metal wall grids 109 array in batches with the top side 102T of each IC chip/die 102 facing the panel-shaped rewiring substrate 107 and soldered on the panel-shaped rewiring substrate 107. The metal pillars 108 in the panel-shaped rewiring substrate 107 may be soldered with the metal pads 105 that need to be led out of each integrated circuit chip/die 102 placed in each package unit 101 (or metal wall grid 109) in a one-to-one correspondence with each other in position (for example, solder paste 113 may also be used, which is not shown in the figure for brevity, but those skilled in the art should understand). Usually the plurality of IC chips/IC dies 102 may be packaged in batch through subsequent processes to form a panel level IC package structure (such as the IC package structure 100). The panel level IC package structure may at last be singulated or cut into a plurality of individual package units (such as package units 101) with each metal wall grid 109 as a cutting unit (i.e. each metal wall grid 109 is used as a boarder of a single package unit 101) in the Z-axis direction. Each singulated/individual package unit 101 may comprise at least one IC chip/IC die 102. For better understanding, one can also turn to the exemplary top plan view illustration in FIG. 1A for reference. The cross-section shown in FIG. 5B may be considered as a partial cross-sectional view corresponding to a portion cutting along the C-C' cutting line in the Z-axis of FIG. 1A during a certain stage (e.g. chip/die attaching stage) of the production process. One of ordinary skill in the art would understand that in the exemplary cross-sectional views of FIG. 5A to FIG. 5G, the center line of the cutting lanes between the package units 101 (or the metal wall grids 109) are illustrated in dashed lines.

In accordance with an embodiment of the present invention, if one chose to bond the entire panel-shaped array of metal wall grids 109 to the panel-shaped rewiring substrate 107 through solder paste 113, before the steps of FIGS. 5A and 5B, solder paste 113 may be spread/brushed on predetermined positions corresponding to the metal walls of the array of the metal wall grids 109 and on predetermined positions corresponding to the metal pads 105 of each integrated circuit chip/die 102 on the panel-shaped rewiring substrate 107. Subsequently, the entire panel-shaped metal wall grids 109 array and the integrated circuit chips/dies 102 are placed on the corresponding predetermined positions on the panel-shaped rewiring substrate 107, and a high-temperature reflow process is used to solder the entire panel-shaped metal wall grids 109 array and each integrated circuit chip/die 102 on the panel-shaped rewiring board 107. Those skilled in the art should understand that the steps of FIG. 5A and FIG. 5B do not limit/distinguish the order of the steps.

Figure 5C:
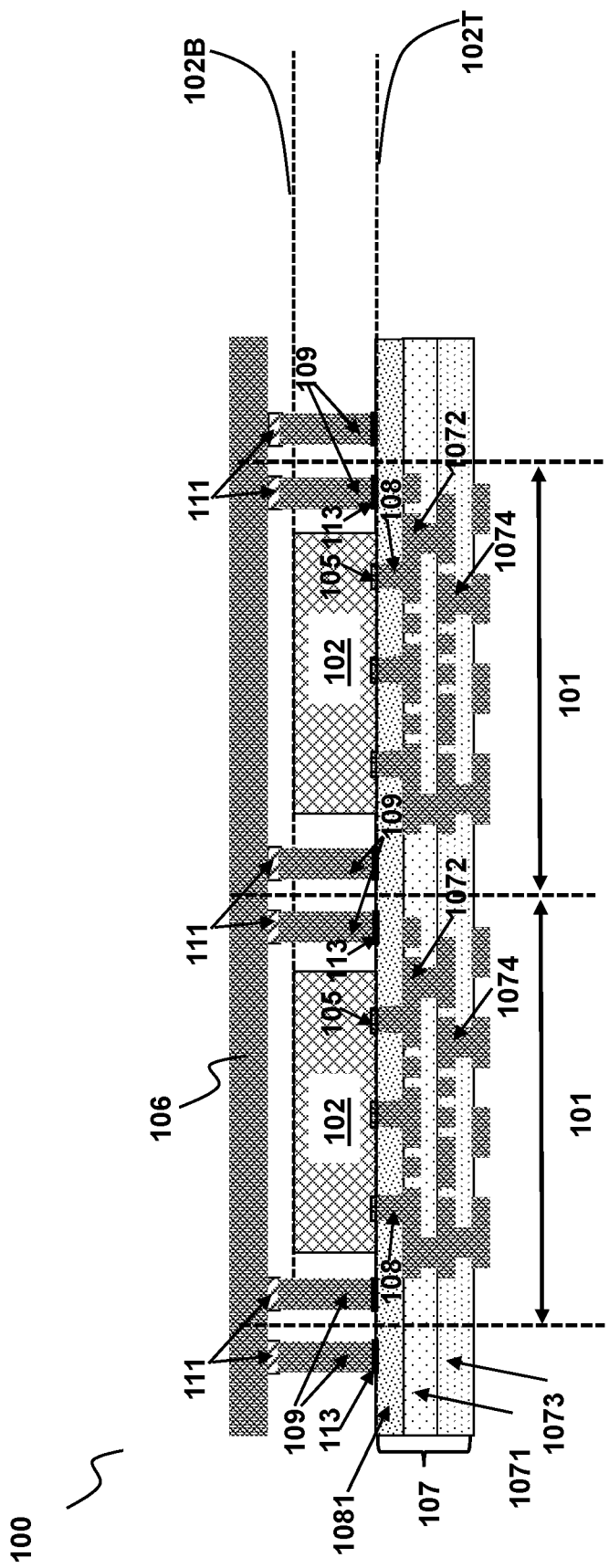

Now turning to the cross-sectional view illustrated in FIG. 5C, after the integrated circuit chips/dies 102 are soldered on the panel-shaped rewiring substrate 107, a panel-shaped metal layer 106 corresponding to the panel-shaped metal wall grids 109 array may be fabricated on the entire back side 100B of the IC package structure 100 under fabrication, so that the panel-shaped metal layer 106 is bonded to the metal fence/wall 109 of each metal wall grid 109. Optionally, the panel-shaped metal layer 106 may be prefabricated as a whole board, and bonded to the metal fence/wall 109 through an adhesive material 111 having a strong adhesive coefficient. The panel-shaped metal layer 106 may be further bonded to the back surface 102B of each integrated circuit chip/die 102 through an adhesive material 112 having a better thermal conductivity than the adhesive material 111, as shown in FIG. 5D.

Figure 5D:
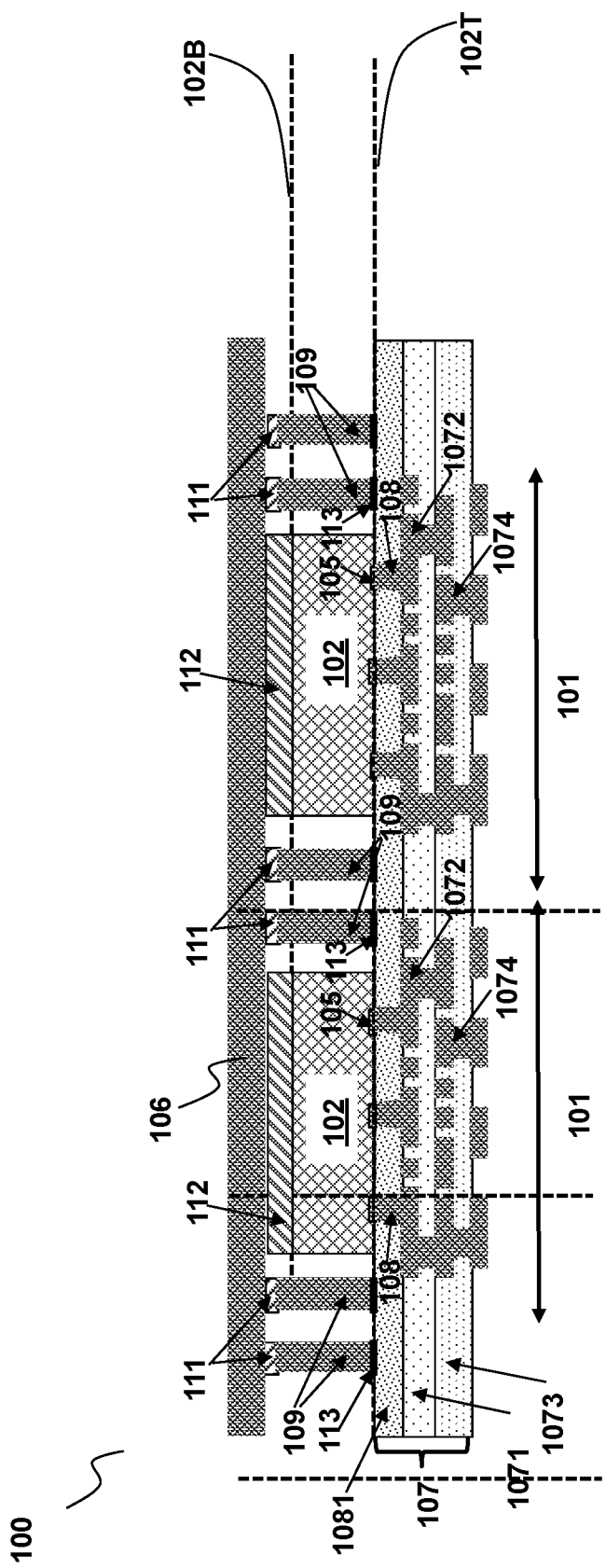
Figure 5E:
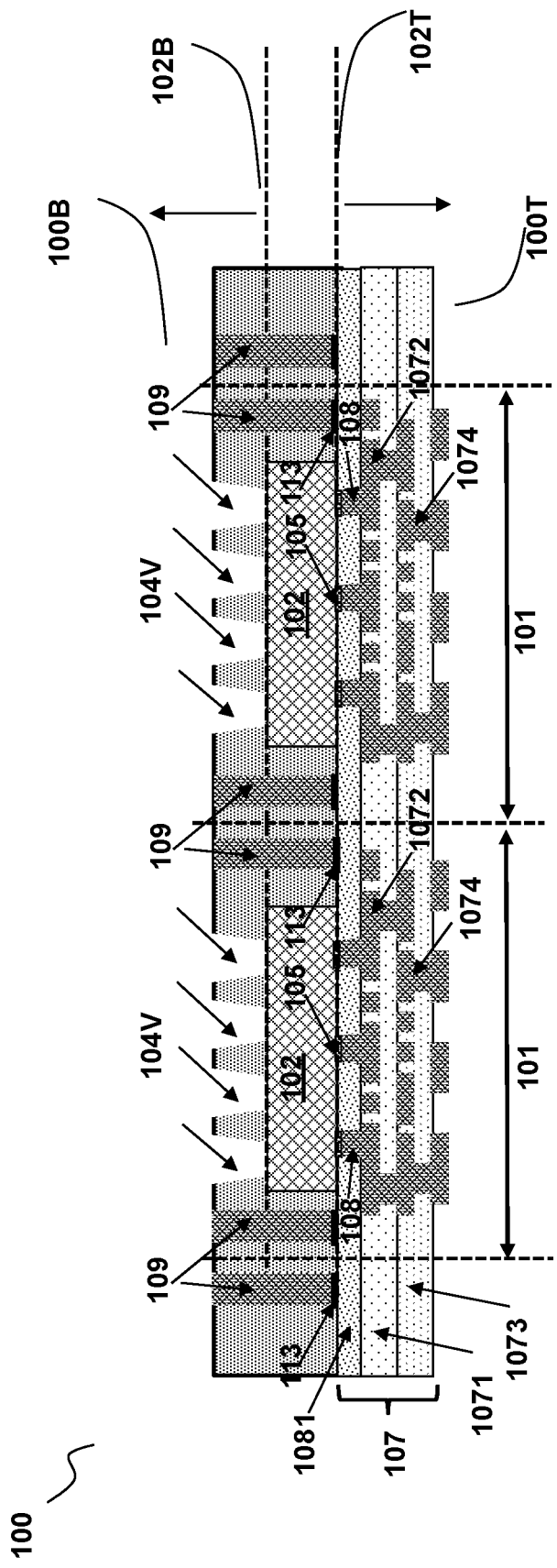
Figure 5F:
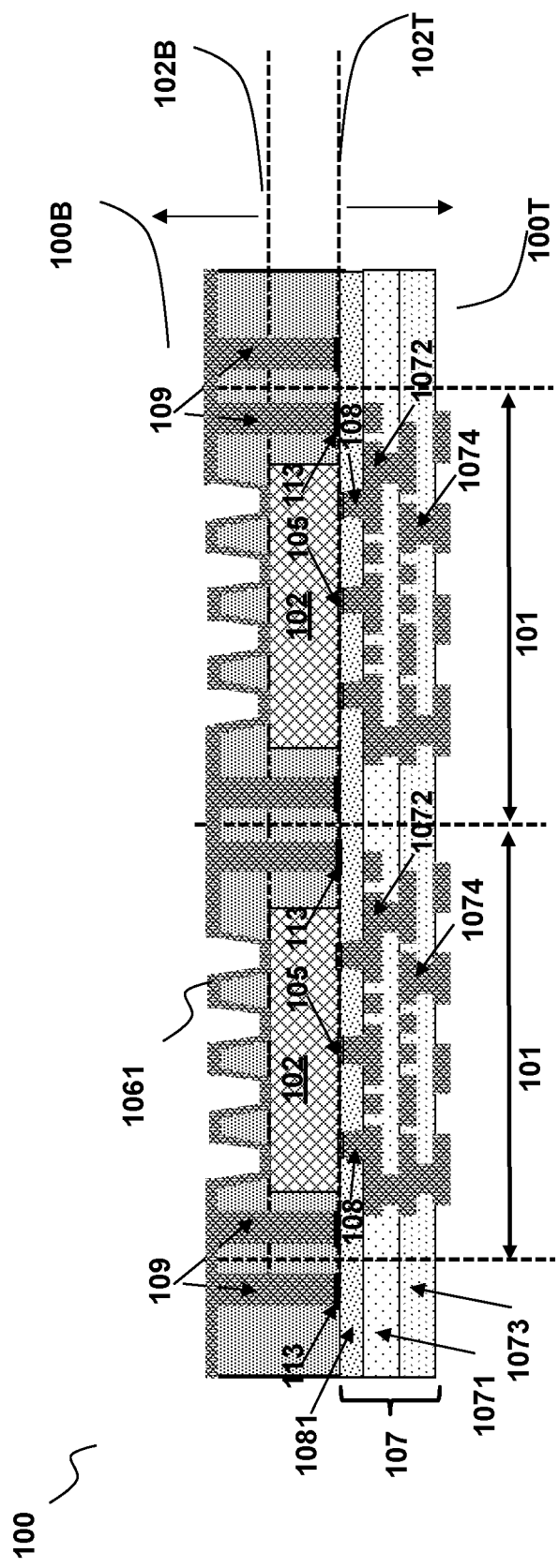
Figure 5G:
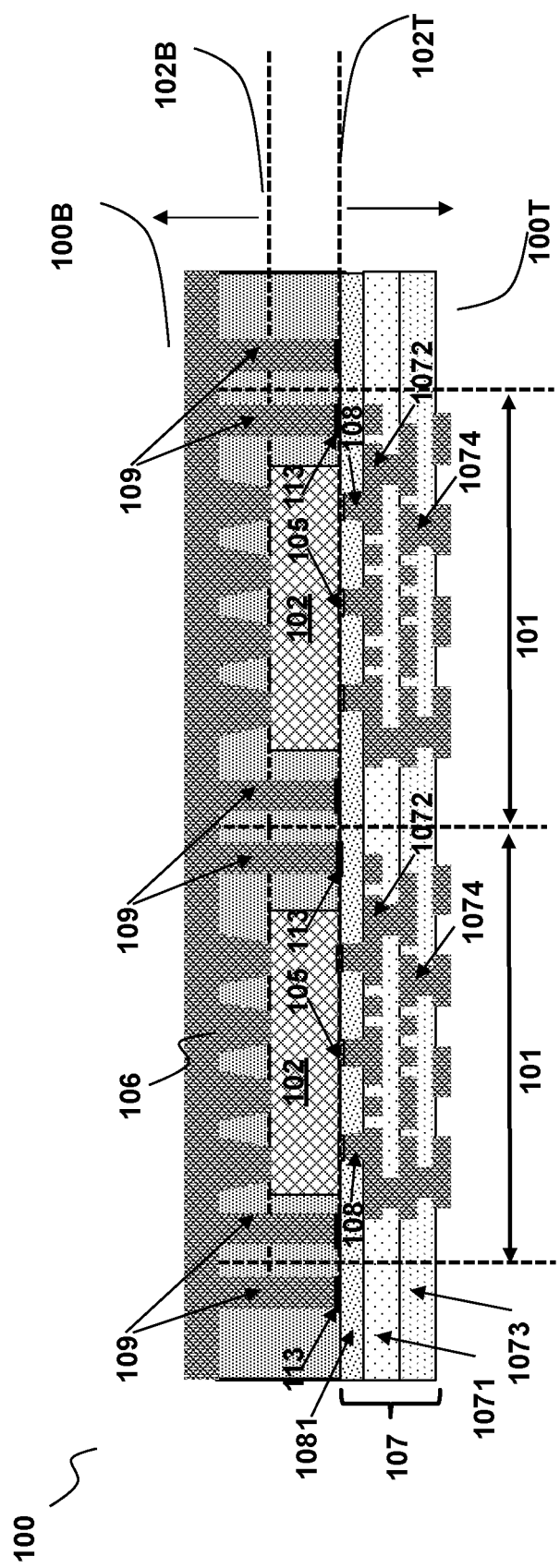

In accordance with an embodiment of the present invention, referring to FIG. 5E to FIG. 5G, as an alternative embodiment of the related steps respectively illustrated in FIG. 5C and FIG. 5D, after the integrated circuit chips/dies 102 are soldered on the panel-shaped rewiring substrate 107, an encapsulation layer 104 (e.g. formed of an epoxy resin molding compound or other appropriate encapsulation materials such as other plastic packaging materials etc.) may be formed. Referring to the illustration in the example of FIG. 5E, the encapsulation layer 104 may fill the metal wall grid 109 of each package unit 101, cover and wrap the IC chip(s)/IC die(s) 102 in each package unit 101, and electrically isolate the integrated circuit chips or dies 102 from each other. It also plays a role in preventing moisture and shaping the entire panel of the IC package structure 100, and so on. The encapsulation layer 104 may further fill cutting lanes (for example, including the row cutting lanes 110X and the column cutting lanes 110Y in the illustrated examples of this application) between the metal wall grids 109. In this fashion, the encapsulation layer 104 may be formed for example through injection molding materials or laminating encapsulation materials to fill the metal wall grids 109 and the cutting lanes (110X, 110Y) between the metal wall grids 109 as well as cover and wrap the IC chips/IC dies 102 in the metal wall grids 109, saving manufacturing processes. After that, at least a portion of the encapsulation layer 104 may be removed to form one or more openings 104V to expose entirety or at least a portion of the back surface 102B of each IC chip/IC die 102. In the example of FIG. 5E, it is illustrated that a plurality of openings 104V are formed in the encapsulation layer 104 above the back surface 102B of each IC chip or IC die 102. However, those skilled in the art should understand that the exemplary embodiments of this disclosure do not limit the shape, size, and number of the openings 104V. For instance, more examples may be referred to the illustrations in FIG. 1C to FIG. 1G and corresponding descriptions in connection with these figures. There are many options for forming the openings 104V in the encapsulation layer 104, for example, laser polishing, chemical polishing, or mechanical polishing or one or more combinations thereof may be used.

Next, referring to FIG. 5F, a seed layer 1061 may be formed on the encapsulation layer 104, the exposed surface of the metal wall grids 109 and the exposed back surface 102B of the IC chips or IC dies 102. The seed layer 1061 may be spread over the surface of the encapsulation layer 104, the exposed surface of the metal wall grids 109 and the exposed back surface 102B (exposed by the plurality of openings 104V) of the IC chips or IC dies 102 for instance by sputtering conductive materials (such as titanium, copper, or other metals or alloys etc.). In an embodiment, the seed layer 1061 may comprise a titanium-copper (Ti—Cu) stack layer, wherein the titanium layer may be formed on the surface of the encapsulation layer 104, the exposed surface of the metal wall grids 109 and the exposed back surface 102B of the IC chips or IC dies 102, and the copper layer may be formed on the titanium layer. In the titanium-copper (Ti—Cu) stack layer, the titanium layer may be used as a protective layer, and the copper layer may be used as an electroplating seed layer.

Next, referring to FIG. 5G, a panel-shaped metal layer 106 may be formed by electroplating metal materials (for example, copper, nickel, gold, or other metal or alloy etc.). In an exemplary embodiment, electroplating metal materials may comprise electroplating a copper layer or a copper-nickel stack layer or other single metal layers or multilayer metal stacked layers to form a main metal layer 1062. In an embodiment, electroplating metal materials may further comprise electroplating an anti-oxidation metal layer 1063 (for example, an SUS alloy layer) on the main metal layer 1062. The anti-oxidation metal layer 1063 may protect the main metal layer 1062 from being oxidized. In such an example, the panel-shaped metal layer 106 may finally comprise the seed layer 1061, the main metal layer 1062 and the anti-oxidation metal layer 1063. The panel-shaped metal layer 106 covers the entire back side 100B of the IC package structure 100 (the side to which the back surface 102B of the IC chips or IC dies 102 are facing) and fills the opening(s) 104V, so that the metal layer 106 is in direct contact with the exposed portions of the back surface 102B of each IC chip/IC die 102 (i.e., the portions of the back surface 102B of each IC chip/IC die 102 that are not covered by the encapsulation layer 104) and also in direct contact with the metal fence or metal wall of each metal wall grid 109. In an exemplary embodiment, the panel-shaped metal layer 106 may be formed to have a thickness of 10 μm to 2000 μm. In an alternative exemplary embodiment, the panel-shaped metal layer 106 may be formed to have a thickness of 50 μm to 1000 μm. In an alternative exemplary embodiment, the panel-shaped metal layer 106 may be formed to have a thickness of 100 μm to 500 μm. In still an alternative exemplary embodiment, the panel-shaped metal layer 106 may be formed to have a thickness of 100 μm to 200 μm.

During the process of electroplating the panel-shaped metal layer 106, molecular bonding forms at the interface between the panel-shaped metal layer 106 and the metal fence or metal wall 109 of each package unit 101 (or of each metal wall grid 109). Such molecular bonding between the metal material of the panel-shaped metal layer 106 and the metal material of the metal fence or metal wall 109 may be very strong bond. And thus, the panel-shaped metal layer 106 may be tightly bonded to the metal wall grids 109 and not easy to fall off from the back side 100B of the IC package structure 100, without the need to use any additional adhesive layer or adhesive material (such as the aforementioned adhesive material 111). Therefore, electroplating the panel-shaped metal layer 106 not only saves fabrication costs, but the direct contact and bond between the panel-shaped metal layer 106 and the metal fence/wall 109 of each package unit 101 (or of each metal wall grid 109) may help to greatly enhance the EMI protection performance of each IC chip/IC die 102. Molecular bonding also forms at the interface between the panel-shaped metal layer 106 and the back surface 102B of each IC chip/IC die 102, making the panel-shaped metal layer 106 tightly bonded to (not easy to fall off from) the back surface 102B of each IC chip/IC die 102 without the need to use any additional adhesive layer or adhesive material (such as the aforementioned adhesive material 112) which is usually a resin material having a thermal conductivity far inferior to the metal layer 106. In addition, the direct contact between the panel-shaped metal layer 106 and the back surface 102B of each IC chip/IC die 102 may help to greatly enhance the heat dissipation performance of each IC chip/IC die 102.

After the panel-shaped metal layer 106 is fabricated on the entire back side 100B of the IC package structure 100, panel level packaging process for forming the panel-shaped IC package structure 100 completes. And after that, the panel-shaped IC package structure 100 may be divided into a plurality of independent package units (for example, the singulated package units 101) by a cutting process. Each package unit 101 may include at least one integrated circuit chip/die 102, e.g. referring to the exemplary illustrations in FIG. 1B to FIG. 1H.

FIG. 6A to FIG. 6H illustrate top plan views of an IC package structure 100 according to several modified embodiments of the present disclosure. Compared with the top plan view of the IC package structure 100 shown in FIG. 1A the top plan views shown in FIGS. 6A to 6H are variety of variant connection methods/patterns (planar view pattern) of the array of metal wall grids 109 connected by a plurality of metal connecting portions 114. Those skilled in the art should understand that the above descriptions to the IC package structure 100, the package unit 101 and related manufacturing methods of the various embodiments of the present disclosure made with reference to FIGS. 1A to 5G are applicable to the examples in FIGS. 6A to 6H. Referring to the example in FIG. 6A, every two adjacent metal wall grids 109 are connected to each other through at least one metal connecting portion 114. The embodiment of FIG. 6A takes an array of rectangular metal wall grids 109 as an example. It is illustrated that the adjacent metal side walls of every two adjacent metal wall grids 109 are connected to each other by a metal connecting portion 114 crosses (spans across) a cutting lane (e.g. row cutting lane 110X or column cutting lane 110Y) between the adjacent metal side walls of every two adjacent metal wall grids 109. Compared with the example of FIG. 1A, the embodiment of FIG. 6A requires relatively few metal connecting portions 114, which can further reduce the cutting resistance along the cutting lanes and the wear down to the cutting equipment during the cutting process to singulate/cut the entire panel-shaped array of package units 101 into singulated individual package units 101.

Figure 6A:
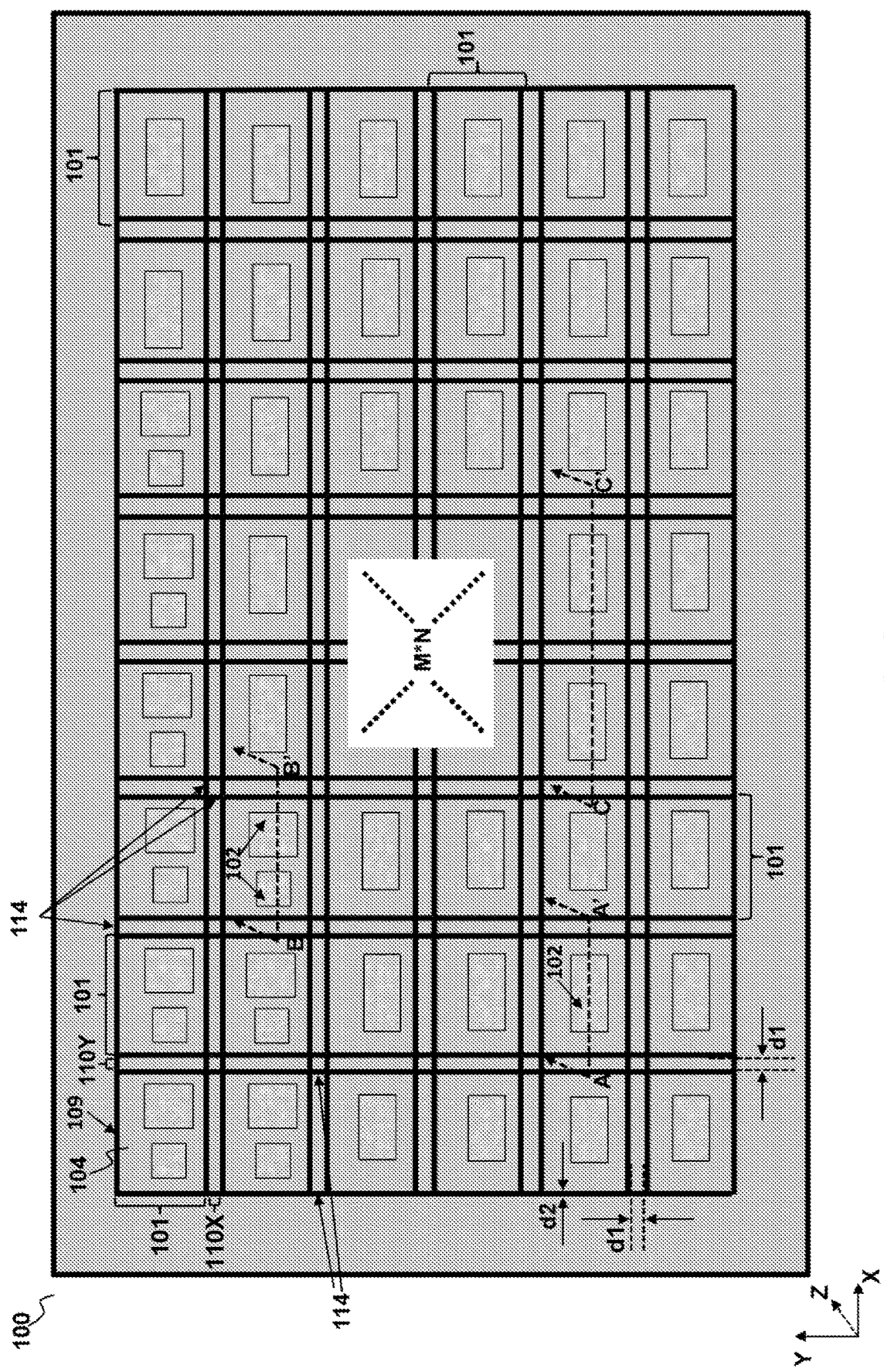
FIG. 6A to FIG. 6H illustrate top plan views of an IC package structure 100 according to several modified embodiments of the present disclosure.
Figure 6B:
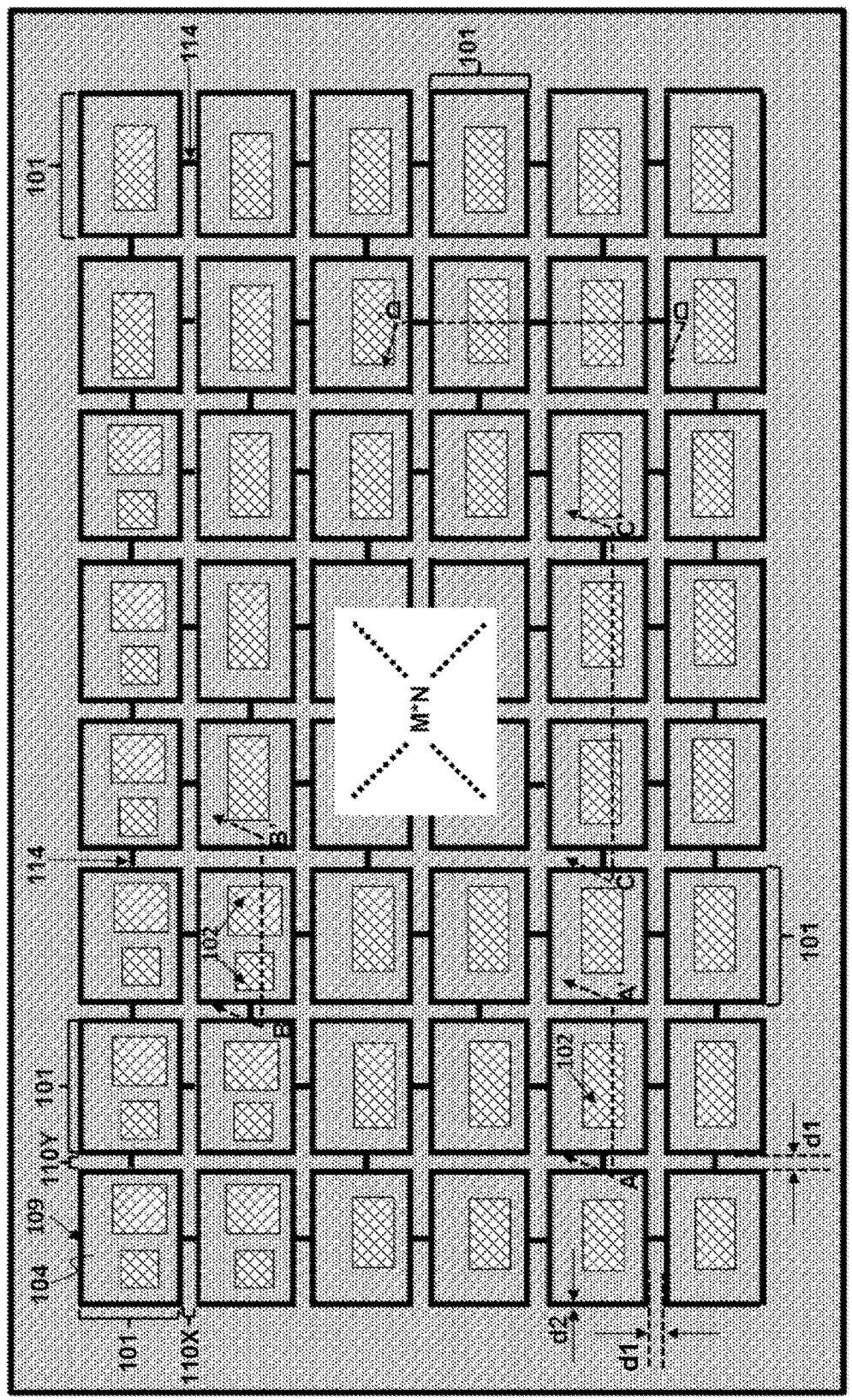
Figure 6C:
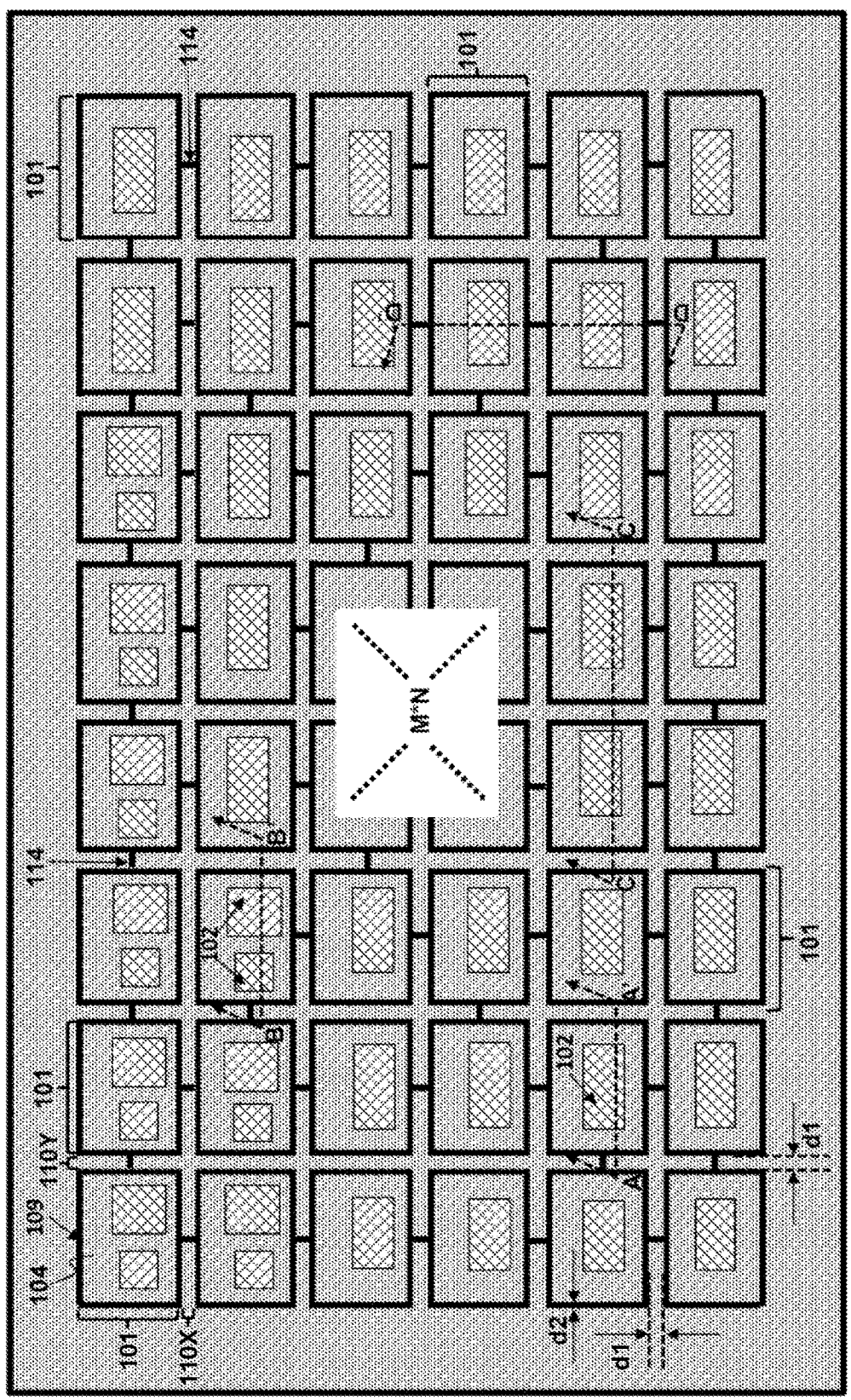

For another example, referring to the top plan views of FIG. 6B and FIG. 6C, the number of metal connecting portions 114 may be further reduced. Continuing to take each metal wall grid 109 as a rectangular wall grid as an example, the metal fence/wall 109 is surrounded by four metal side walls, and at least two metal side walls of each metal wall grid 109 are respectively connected to other metal wall grids 109 adjacent to it through at least two metal connecting portions 114. That is each one of the at least two metal side walls of each metal wall grid 109 is connected to at least one of the other metal wall grids 109 adjacent to it through at least one metal connecting portion 114.

Figure 6D:
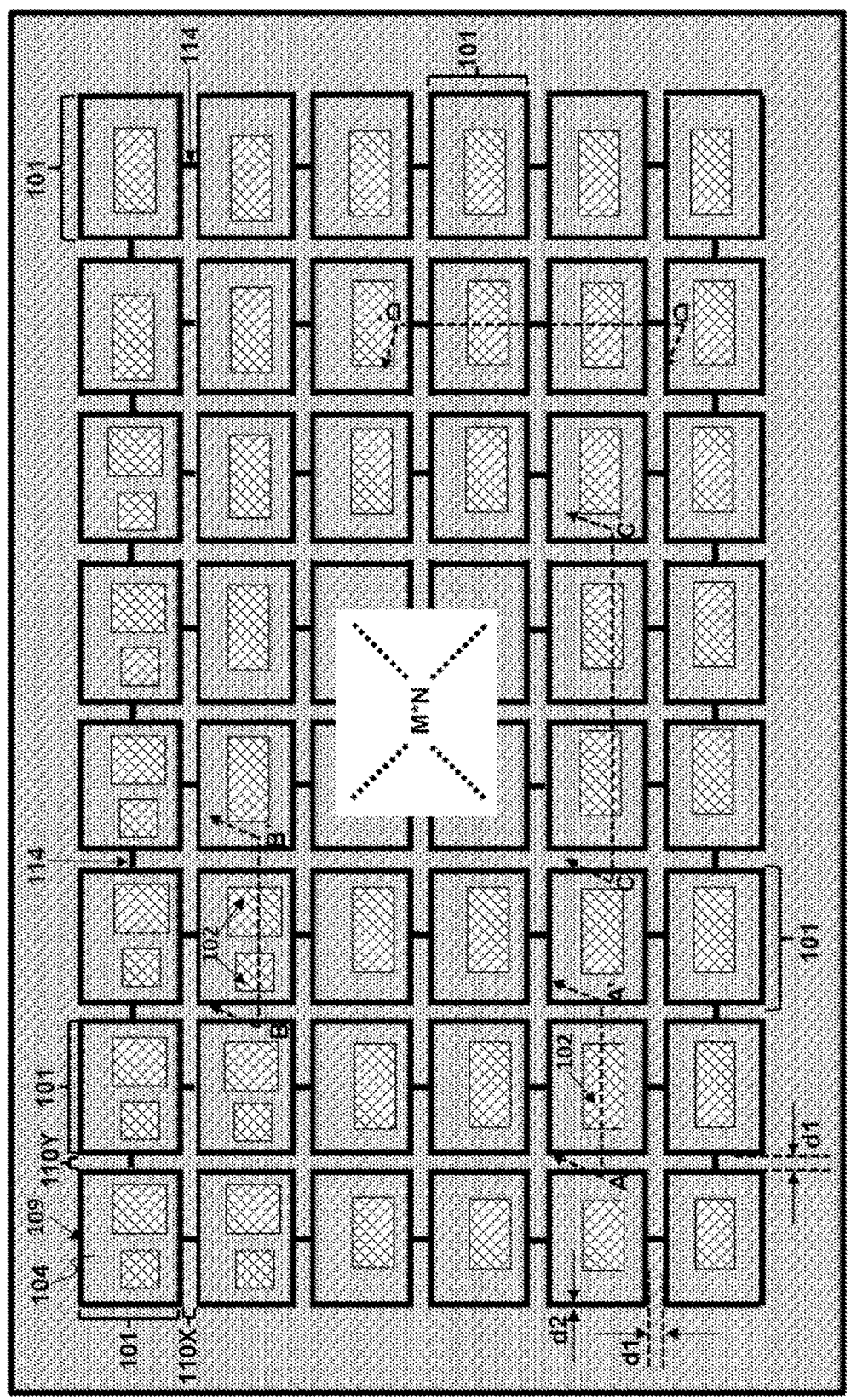
Figure 6E:
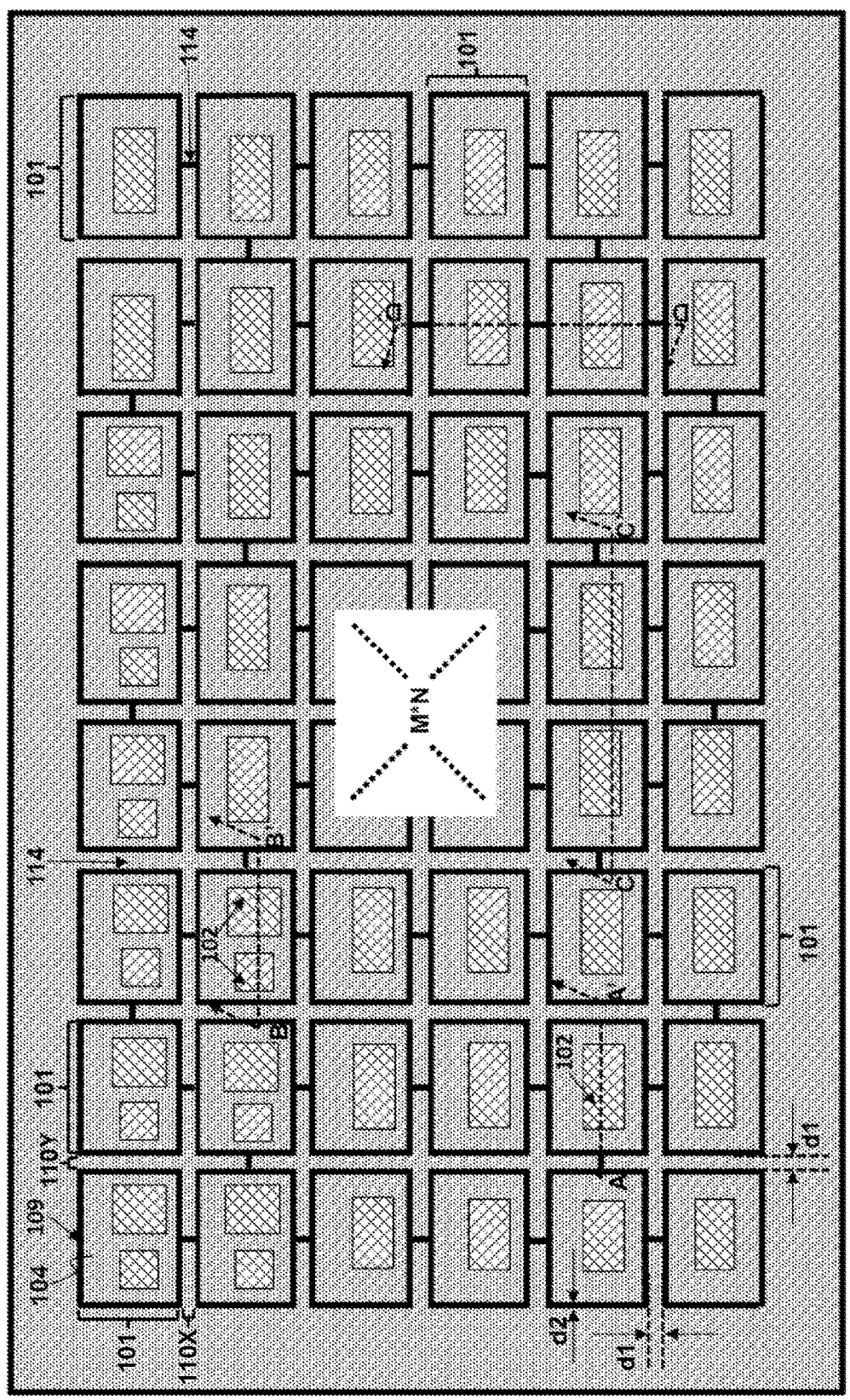
Figure 6F:
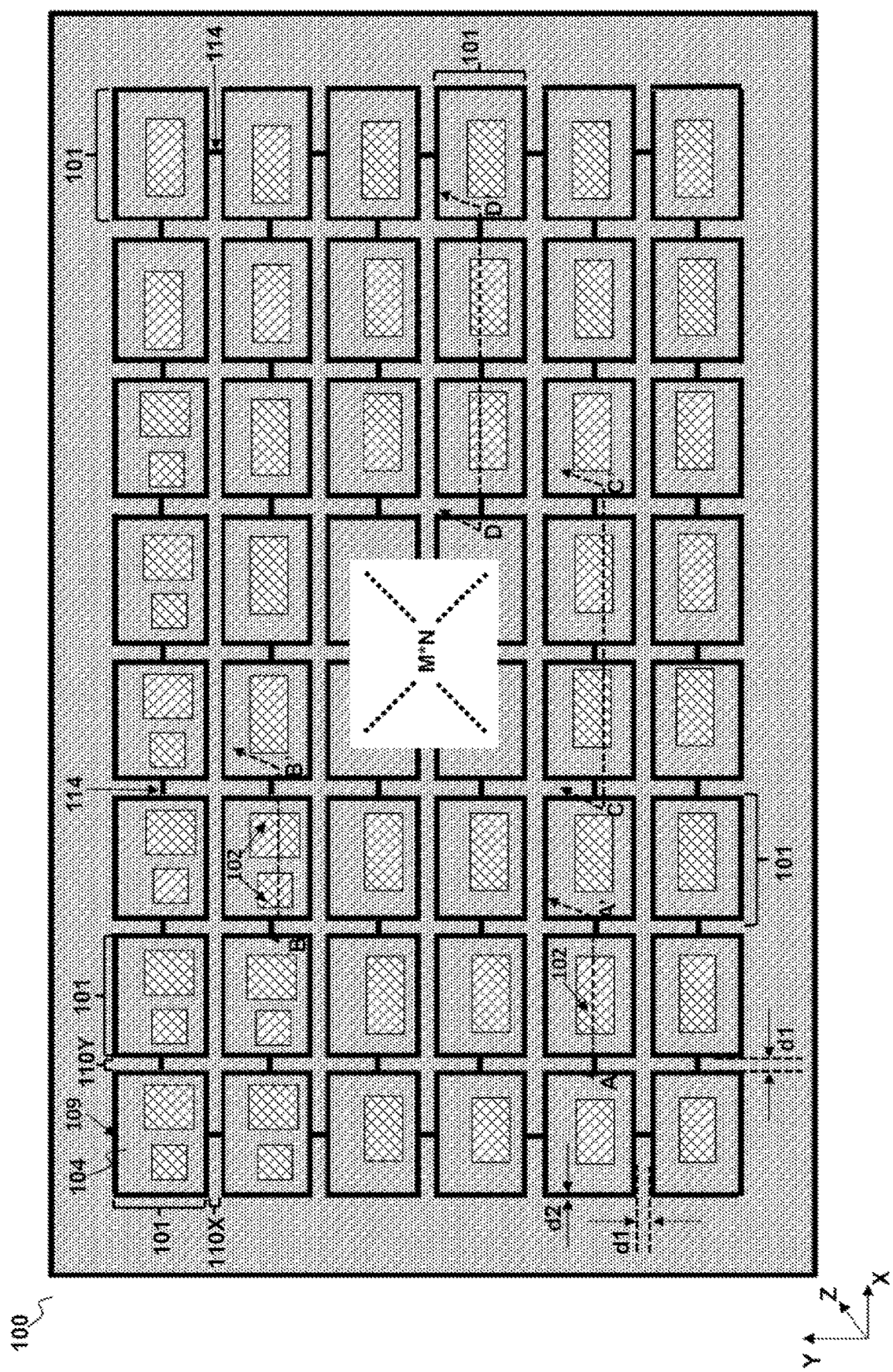
Figure 6G:
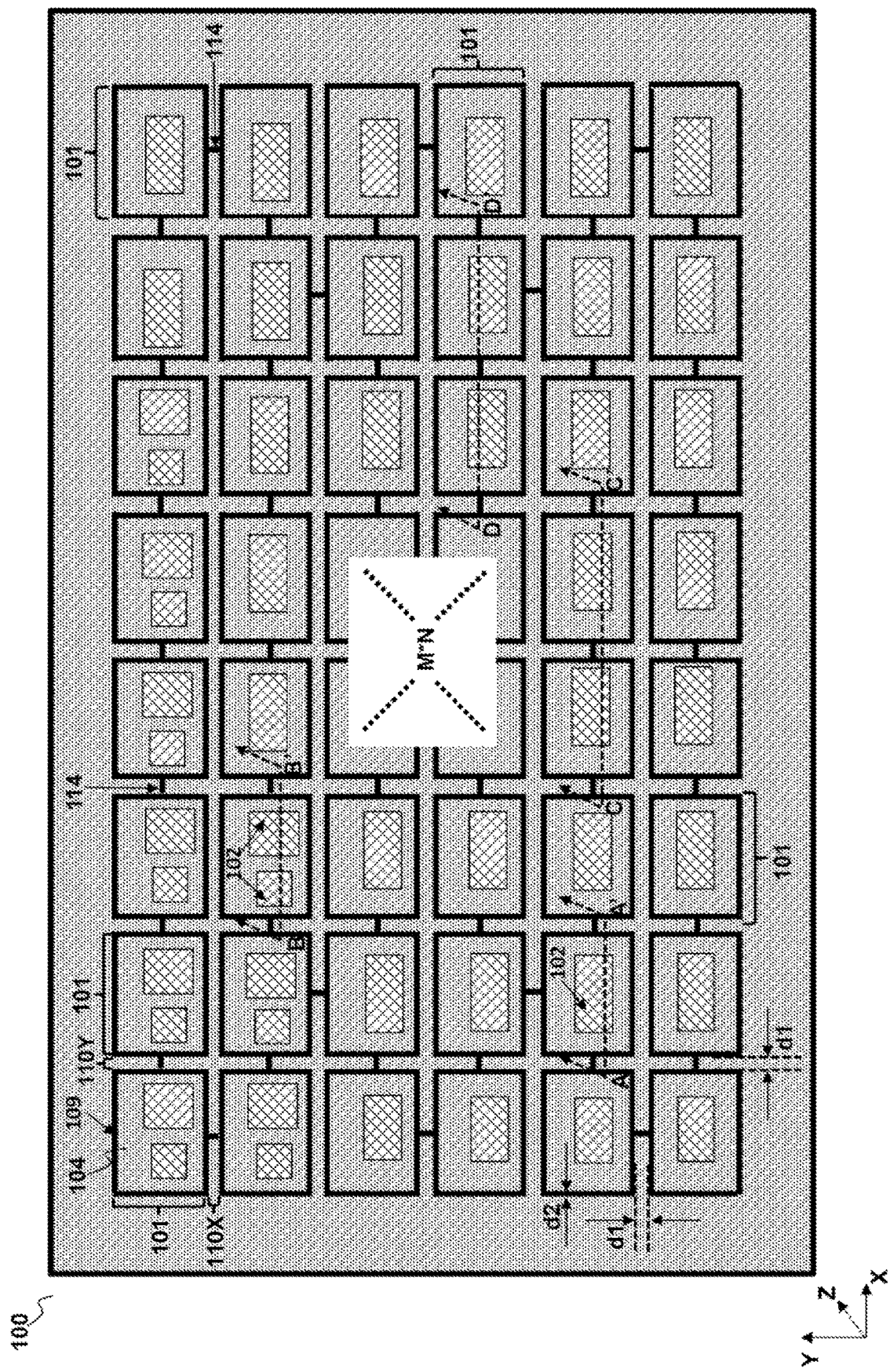
Figure 6H:
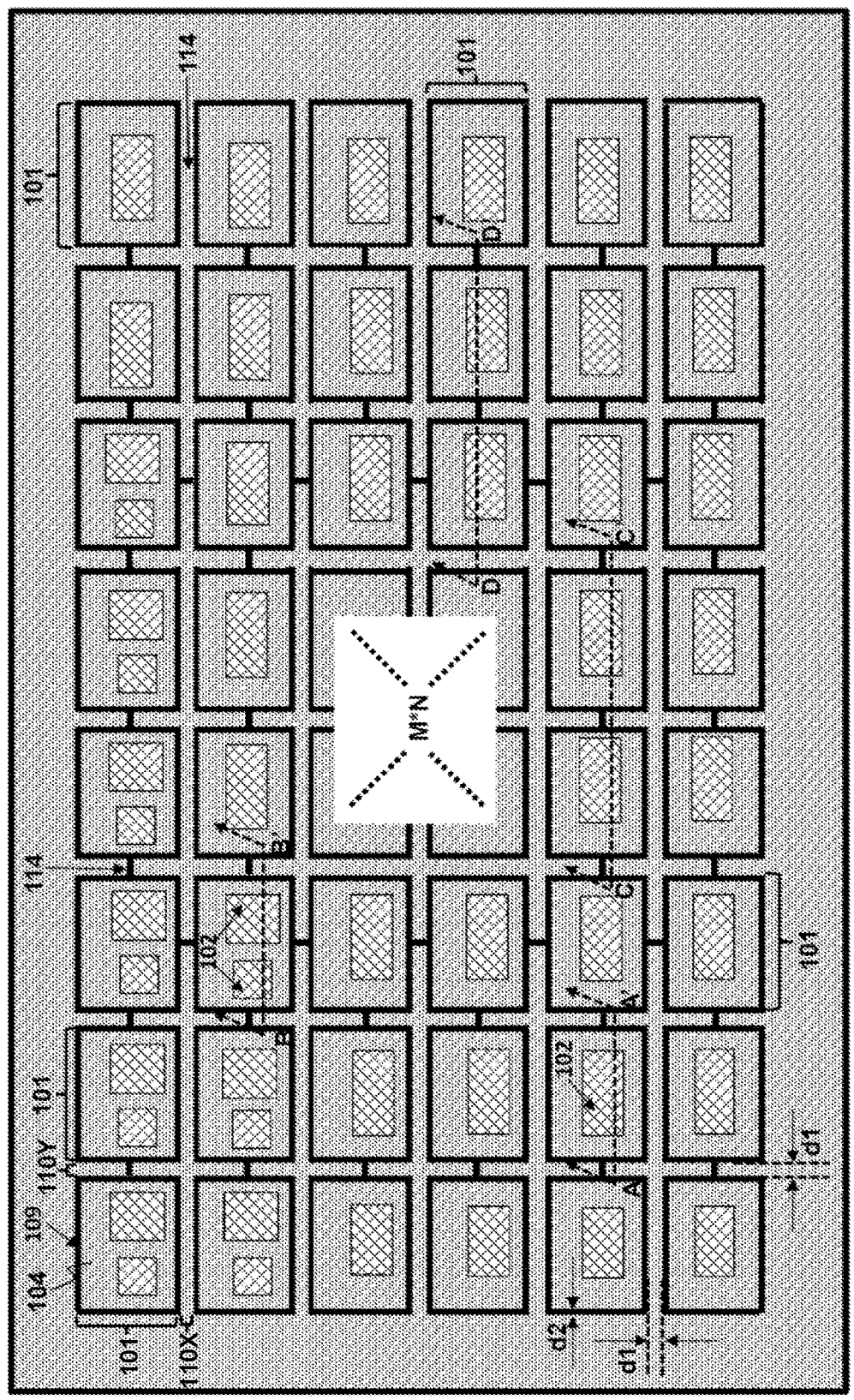

For another example, referring to the top plan views of FIGS. 6D and 6E, the array of metal wall grids 109 in M rows and N columns is continued as an example. For each column in the metal wall grids 109 array, every two adjacent metal wall grids 109 in each column are connected by at least one metal connecting portion 114, and every two adjacent columns of the metal wall grids 109 array are connected with each other by at least two metal connecting portions 114. For example, at least two rows of metal wall grids 109 in every two adjacent columns are selected, and the metal wall grids 109 in each row of the selected at least two rows are connected to each other by at least one metal connecting portion 114. For another example, referring to the top plan views of FIG. 6F, FIG. 6G and FIG. 6H, the array of metal wall grids 109 in M rows and N columns is continued as an example. For each row in the metal wall grids 109 array, every two adjacent metal wall grids 109 in each row are connected by at least one metal connecting portion 114, and every two adjacent rows of the metal wall grids 109 array are connected to each other by at least two metal connecting portions 114. For example, at least two columns of metal wall grids 109 in every two adjacent rows are selected, and metal wall grids 109 in each column of the selected at least two columns are connected to each other by at least one metal connecting portion 114. In this way, the number of metal connecting portions 114 on the cutting lane may be further reduced. Those skilled in the art should understand that there may be more variations in the way of connecting the metal wall grids 109 into an integral panel shaped metal wall grid 109 array. This disclosure is not exhaustive, but the variations are not beyond the scope of this disclosure.

Figure 7:
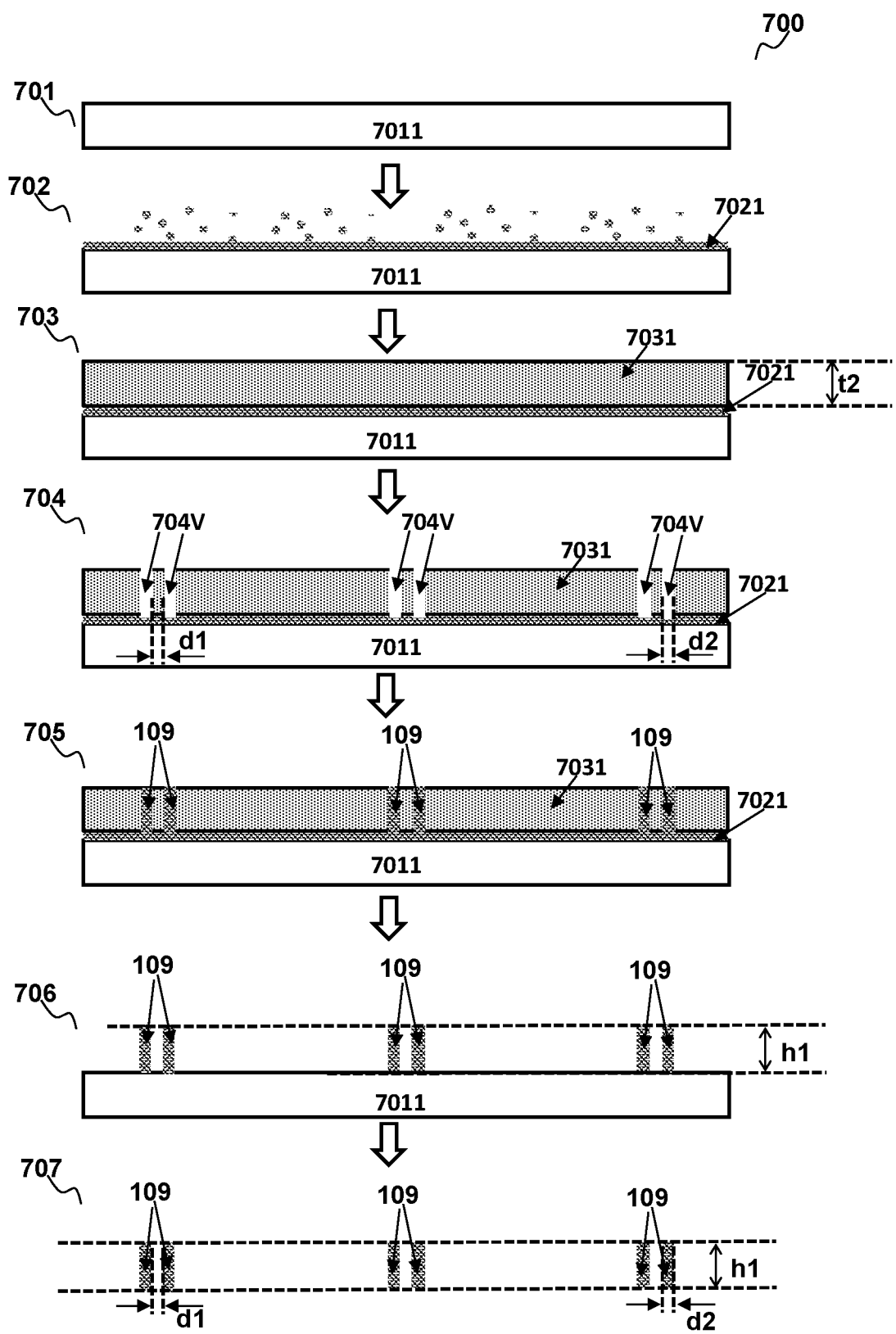
FIG. 7 and FIG. 8 illustrate partial cross-sectional views of some process stages of a method 700 for manufacturing a panel-shaped metal wall grids 109 array according to an embodiment of the present disclosure.
Figure 8:
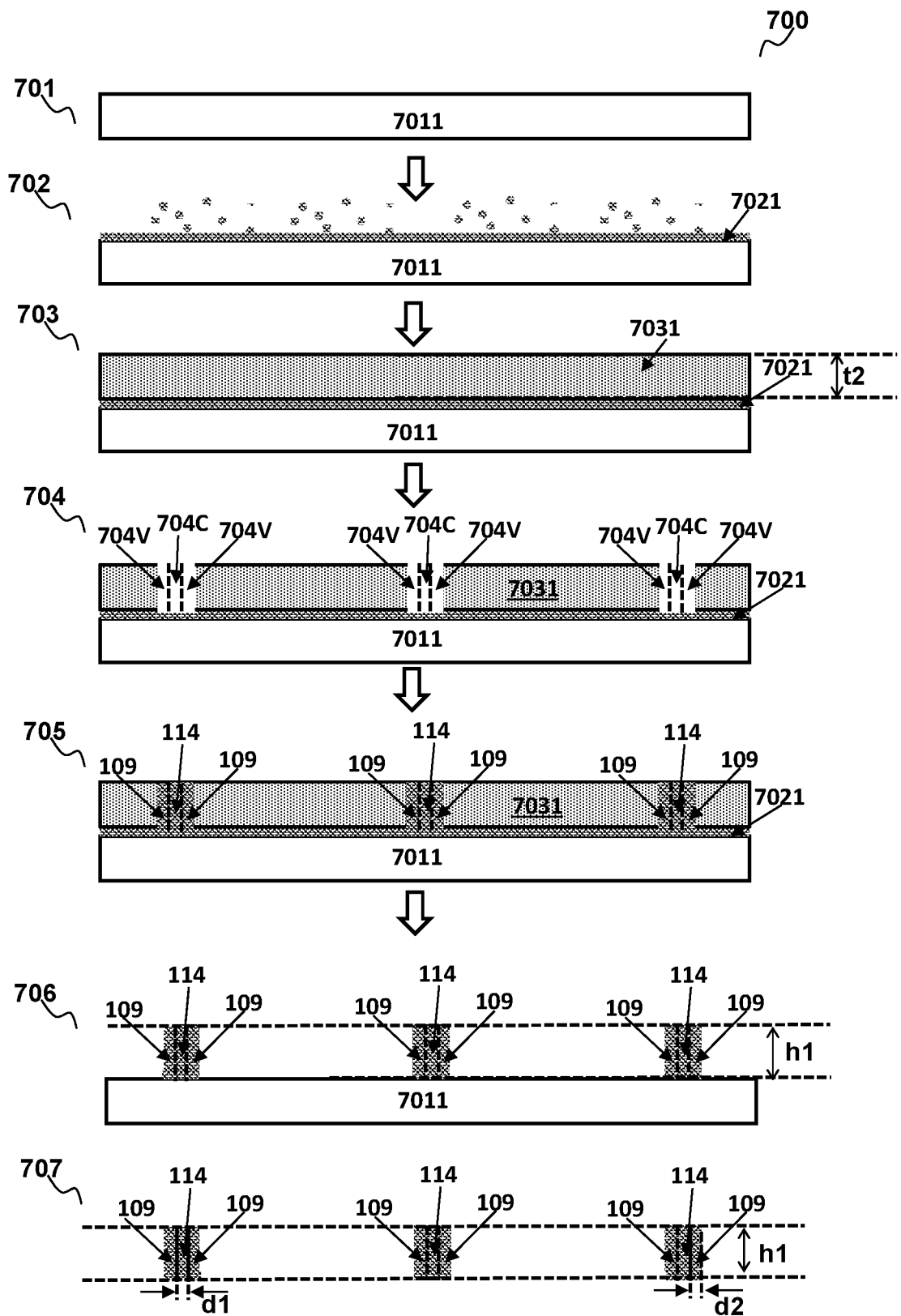

FIG. 7 and FIG. 8 illustrate partial cross-sectional views of some process stages of a method 700 for manufacturing a panel-shaped metal wall grids 109 array (for example, the metal wall grids 109 array mentioned above according to the embodiments shown in FIG. 1A, and FIG. 6A to FIG. 6H) according to an embodiment of the present disclosure. To help better understand, the cross-sections shown in FIG. 7 may be considered as partial cross-sectional views corresponding to a portion cutting along the C-C' cutting line in the Z-axis direction of FIGS. 6A to 6H during several stages of the manufacturing method 700. The cross-sections shown in FIG. 8 may be considered as partial cross-sectional views corresponding to a portion cutting along the D-D' cutting line in the Z-axis direction of FIGS. 6A to 6H during several stages of the manufacturing method 700. FIG. 8 is used to show the cross sections where the D-D' cutting line just cuts across the metal connecting portion 114.

In accordance with an embodiment of the present invention, the method 700 for fabricating the panel-shaped metal wall grids 109 array may use an electroplating process. After the production is completed, each metal wall grid 109 in the metal wall grids 109 array has a continuous and closed metal fence/wall 109, and the metal fence/wall 109 has a predetermined wall height h1. Referring to FIG. 7 and FIG. 8, the method 700 may include: step 701, preparing and providing a carrier board 7011 compatible with the panel-shaped array of metal wall grids 109 to be produced; step 702, forming a conductive seed layer 7021 is on the carrier board 7011 by a process such as sputtering conductive materials (such as titanium, copper, or other metals or alloys other conductive materials etc.); step 703, forming an electroplating mask layer 7031 (for example, a dry film such as polyimide) on the conductive seed layer 7021, and the electroplating mask layer 7031 may be fabricated by a process such as lamination (or rolling), wherein the electroplating mask layer 7031 may have a thickness t2 (measured in the Z-axis direction) greater than the predetermined wall height h1, namely: t2>h1, for example, in an embodiment, t2>h1+50 μm; step 704, patterning the electroplating mask layer 7031 (for example, laser direct imaging technology or other exposure and development techniques may be used to pattern the electroplating mask layer 7031) to remove portions of the electroplating mask layer 7031 where the metal fences/walls of the metal wall grids 109 array will be later formed, an thus an array of hollow groove grids 704V is formed in the electroplating mask layer 7031 to expose portions of the conductive seed layer 7021; step 705, with the patterned electroplating mask layer 7031 as a mask, electroplating metal materials (for example metals such as copper, nickel, or alloy materials such as SUS304) to fill in the hollow groove grids 704V array to form the panel-shaped metal wall grids 109 array; step 706, removing the patterned electroplating mask layer 7031 and the conductive seed layer 7021; and step 707, peeling off the carrier board 7011.

Figure 9:
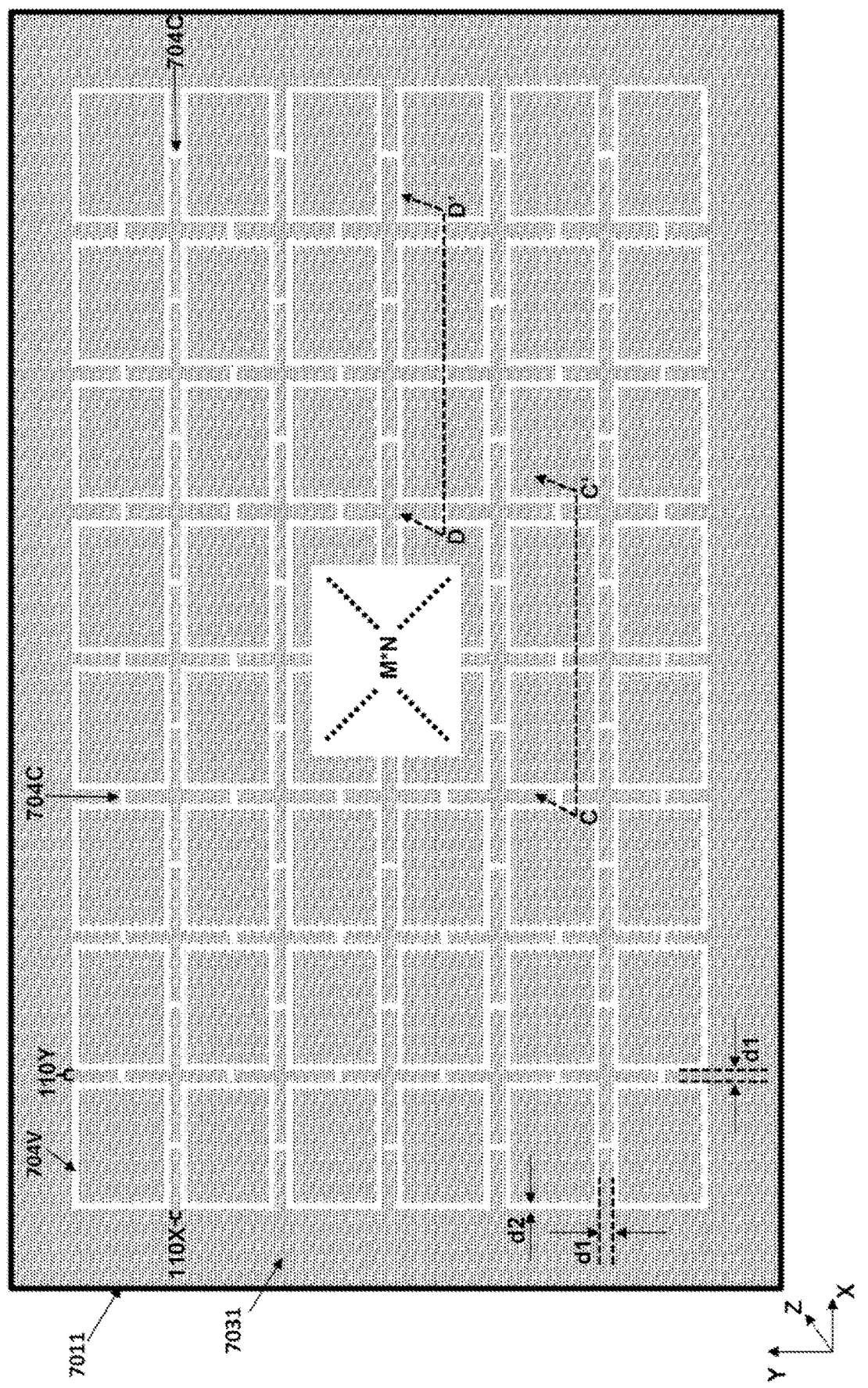
FIG. 9 illustrates a top plan view (in the X-Y plane) of the hollow groove grids 704V array formed in step 704 corresponding to the metal wall grids 109 array to be manufactured.
Figure 10:
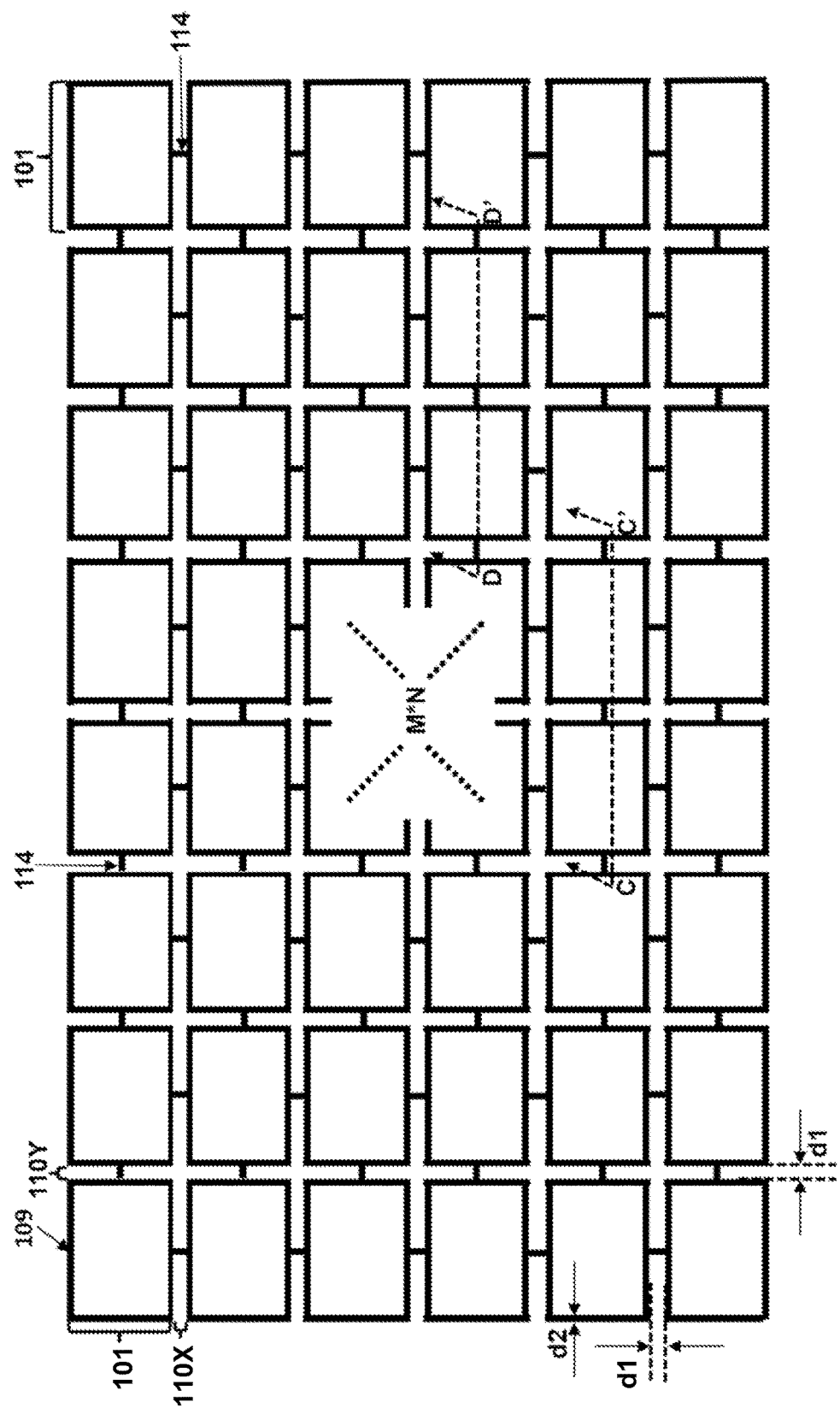
FIG. 10 illustrates a top plan view of a panel-shaped array of metal wall grids 109 formed/manufactured/obtained with the patterned electroplating mask layer 7031 as shown in the example of FIG. 9 as a mask for the electroplating process.

In accordance with an embodiment of the present invention, the array of the hollow groove grids 704V formed in step 704 may have a pattern corresponding to (or matching with) a pattern of the metal wall grids 109 array in a one-to-one correspondence manner. To help understanding, take the metal wall grids 109 array to be manufactured as the metal wall grids 109 array mentioned in the embodiment shown in FIG. 6A (for example, M rows by N columns) as an example. FIG. 9 illustrates a top plan view (in the X-Y plane) of the hollow groove grids 704V array formed in step 704 corresponding to the metal wall grids 109 array to be manufactured. Corresponding to the metal wall grids 109 array of M rows by N columns in the example of FIG. 6A, the pattern of the hollow groove grids 704V array is a rectangular hollow groove grids 704V array pattern of M rows by N columns, each groove side of each rectangular hollow groove grid 704V has a predetermined hollow groove width d2 (measured in the X-Y plane, the hollow groove width d2 determines the wall thickness d2 of the metal fence/wall 109). In an embodiment, the wall thickness d2 of the metal fence 109 or the predetermined hollow groove width d2 may be 50 μm to 500 μm. In another embodiment, the wall thickness d2 of the metal fence 109 or the predetermined hollow groove width d2 may be 50 μm to 200 μm. In another embodiment, the wall thickness d2 of the metal fence 109 or the predetermined hollow groove width d2 may be 50 μm to 100 μm. The pattern of the hollow groove grids 704V array has a plurality of hollow connection grooves 704C which are in one-to-one correspondence with the plurality of metal connection portions 114 to be produced, so that each one of the hollow groove grids 704V is connected to at least one of the other hollow groove grids 704V adjacent to it through a hollow connection groove 704C. FIG. 8 shows the cross-sectional areas of the hollow connection groove 704C in the cross-sectional view of step 704 with dotted lines, and shows the cross-sectional areas of the corresponding metal connection portions 114 formed in the cross-sectional views of steps 705 to 707 by the dotted lines. In accordance with an embodiment of the present invention, each hollow groove grid 704V may be a rectangular groove grid surrounded by four hollow groove sides, and at least two hollow groove sides of each hollow groove grid 704V are respectively connected to other hollow groove grids 704V adjacent to it through at least two hollow connection grooves 704C. That is to say, each one of the at least two hollow groove sides of each hollow groove grid 704V is connected to at least one of the other hollow groove grids 704V adjacent to it through at least one hollow connection groove 704C. Those skilled in the art should understand that when forming the panel-shaped metal wall grids 109 array illustrated in the exemplary embodiments of FIGS. 1A and 6A to 6H, the top plan view pattern of the hollow groove grids 704V array and the plurality of hollow connection grooves 704C formed in the step 704 after patterning the electroplating mask layer 7031 should match with the top plan view pattern of the metal wall grids 109 array and the plurality of metal connecting portions 114 in each embodiment shown in FIGS. 1A and 6A to 6H in a one-to-one correspondence manner. There may be many other variations in the pattern of the panel-shaped metal wall grids 109 array and the corresponding pattern of hollow groove grids 704V array and the plurality of hollow connection grooves 704C formed in the step 704, which will not be exhaustively illustrated and addressed here. FIG. 10 illustrates a top plan view of a panel-shaped array of metal wall grids 109 formed/manufactured/obtained with the patterned electroplating mask layer 7031 (having the pattern of the hollow groove grids 704V array) as shown in the example of FIG. 9 as a mask for the electroplating process and then went through subsequent steps until the carrier board 7011 was peeled off. For the panel-shaped metal wall grids 109 array produced by the method 700, the plurality of metal connection portions 114 may have a height identical to the height of the metal fence/wall of each metal wall grid 109, that is, each one of the plurality of metal connection portions 114 also have the predetermined wall height h1.

Figure 11:
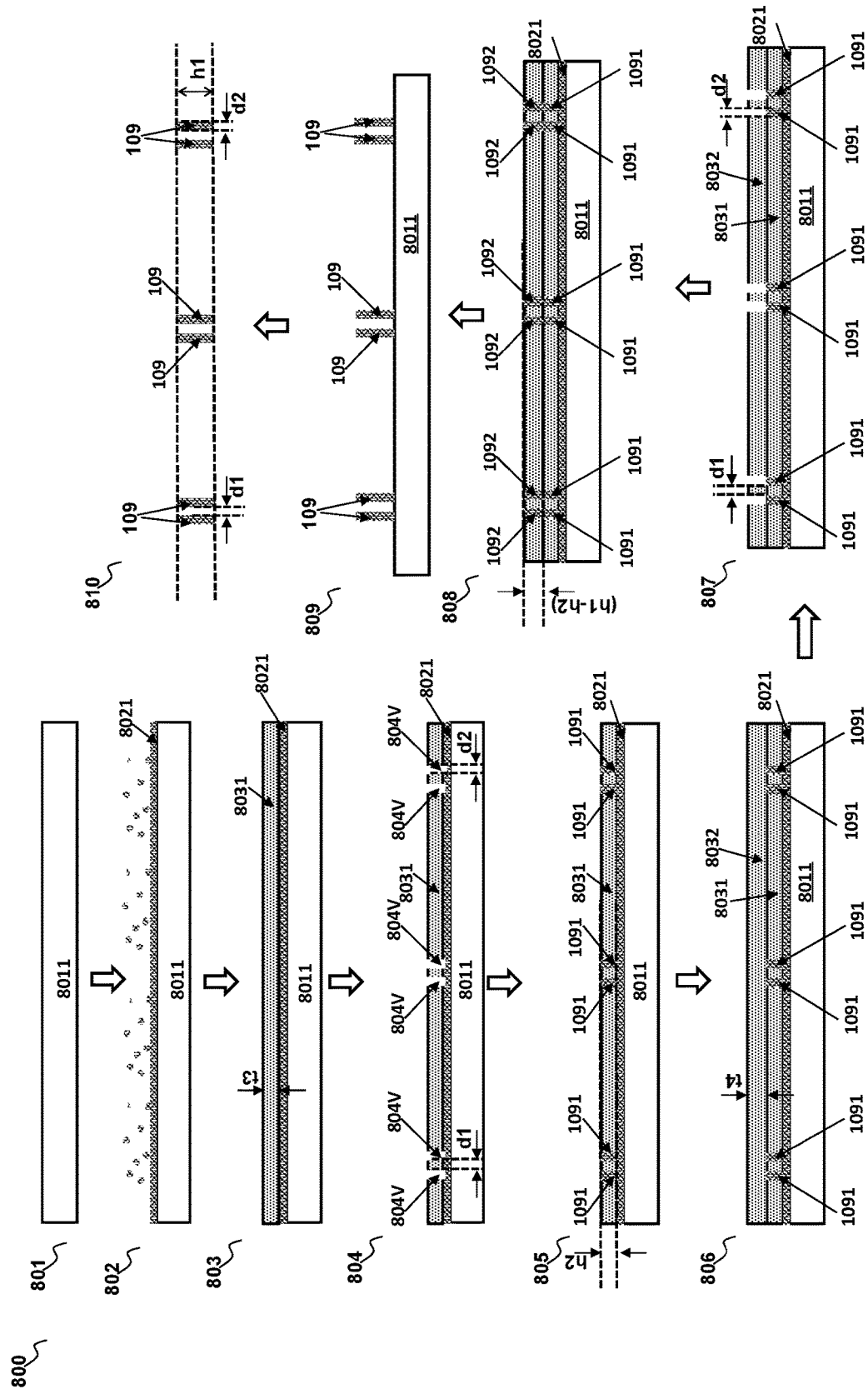
FIGS. 11 and 12 illustrate partial cross-sectional views of some process stages of a method 800 for manufacturing a panel-shaped metal wall grids 109 array according to an alternative embodiment of the present disclosure.
Figure 12:
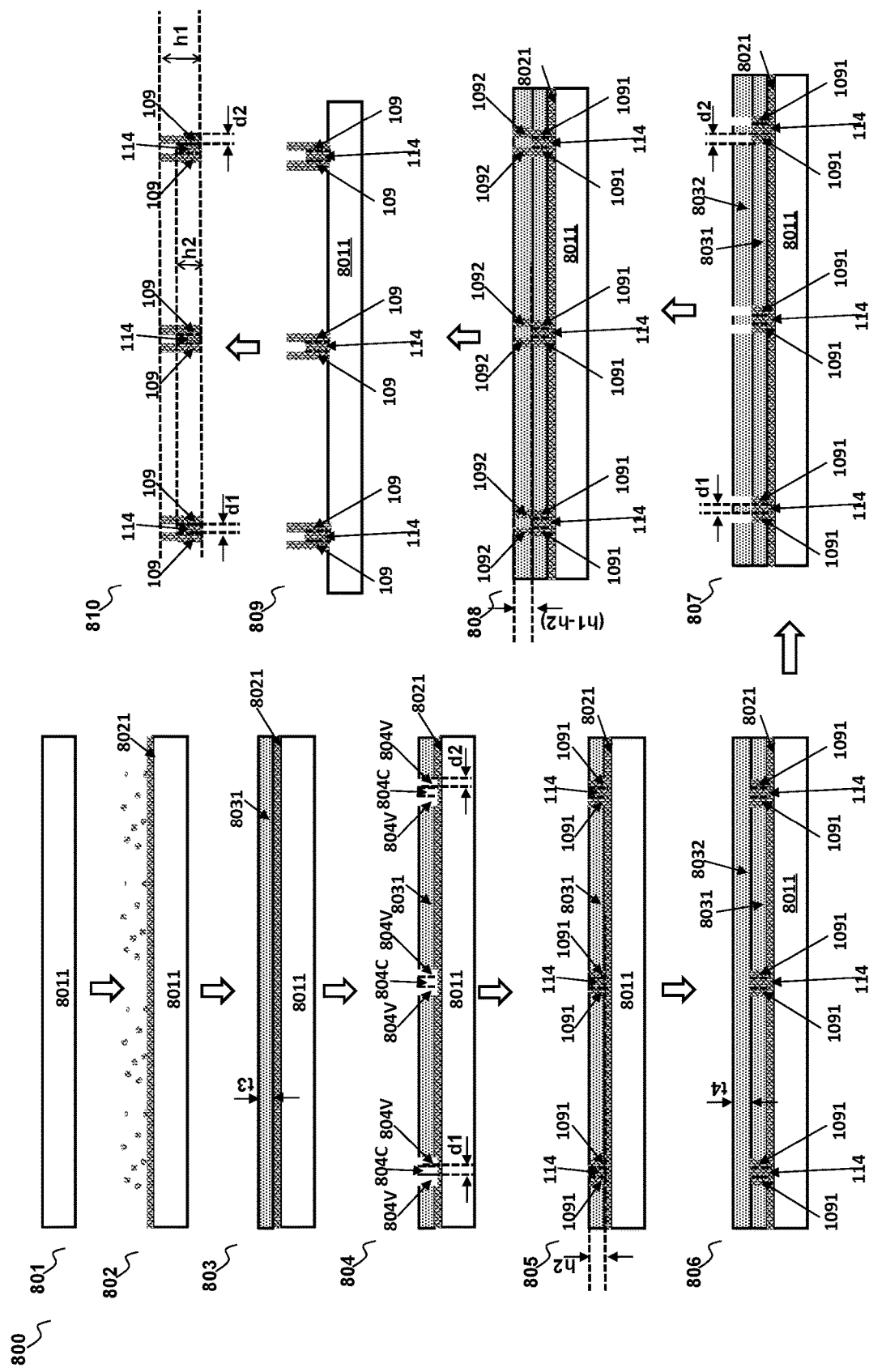

FIGS. 11 and 12 illustrate partial cross-sectional views of some process stages of a method 800 for manufacturing a panel-shaped metal wall grids 109 array (for example, the metal wall grids 109 array mentioned above according to the embodiments shown in FIG. 1A, and FIG. 6A to FIG. 6H) according to an alternative embodiment of the present disclosure. To help better understand, the cross-sections shown in FIG. 11 may be considered as partial cross-sectional views corresponding to a portion cutting along the C-C' cutting line in the Z-axis direction of FIGS. 6A to 6H during several stages of the manufacturing method 800. The cross-sections shown in FIG. 12 may be considered as partial cross-sectional views corresponding to a portion cutting along the D-D' cutting line in the Z-axis direction of FIGS. 6A to 6H during several stages of the manufacturing method 800. FIG. 8 is used to show the cross sections where the D-D' cutting line just cuts across the metal connecting portion 114.

In accordance with an embodiment of the present invention, the method 800 for manufacturing an integral panel-shaped metal wall grids 109 array may comprise: step 801, preparing and providing a carrier board 8011 compatible with the panel-shaped array of metal wall grids 109 to be produced; step 802, forming a conductive seed layer 8021 on the carrier board 8011 by a process such as sputtering conductive materials (such as titanium, copper, or other metals or alloys other conductive materials etc.); step 803, forming a first electroplating mask layer 8031 (for example, a dry film such as polyimide) on the conductive seed layer 8021 for example by a process such as lamination (or rolling), wherein the first electroplating mask layer 8031 may have a thickness t3 (measured in the Z-axis direction) greater than the predetermined connecting portion height h2 of the metal connecting portions 114 to be fabricated, for example, in an embodiment, t3≥h2+50 μm, and the predetermined connecting portion height h2 may be ½ or ¼ of the predetermined wall height h1 of the metal walls 109; step 804, patterning the first electroplating mask layer 8031 (for example, laser direct imaging technology or other exposure and development techniques may be used to pattern the first electroplating mask layer 8031) to remove portions of the first electroplating mask layer 8031 where the metal fences/walls of the metal wall grids 109 array and the plurality of metal connection portions 114 will be later formed, an thus an array of first type hollow groove grids 804V and a plurality of hollow connection grooves 804C are formed in the first electroplating mask layer 8031 to expose portions of the conductive seed layer 8021; step 805, using the patterned first electroplating mask layer 8031 as a mask for a first electroplating process to electroplate metal materials (for example metals such as copper, nickel, or alloy materials such as SUS304) to fill in the first type hollow groove grids 804V array and the plurality of hollow connection grooves 804C) to form a first height portion 1091 (in the Z-axis direction) of the panel-shaped metal wall grids 109 array as well as the plurality of metal connecting portions 114, wherein the first height portion 1091 and the plurality of metal connecting portions 114 have the predetermined connection portion height h2 (h2<h1); step 806, forming a second electroplating mask layer 8032 (for example, a dry film such as polyimide) on the patterned first electroplating mask layer 8031 for example by a process such as lamination (or rolling), wherein the second electroplating mask layer 8032 may have a thickness t4 (measured in the Z direction) greater than a height difference between the predetermined wall height h1 and the predetermined connection portion height h2, that is: t4>(h1-h2), for instance in an embodiment t4≥(h1-h2)+50 μm; step 807, patterning the second electroplating mask layer 8032 (for example by laser direct imaging technology or other exposure and development techniques) to remove portions of the second electroplating mask layer 8032 where a remaining height (i.e.: h1-h2) portion 1092 (in the Z-axis direction) of the metal wall grids 109 array will be later formed, and thus an array of the second type hollow groove grids 807V are formed in the second electroplating mask layer 8032, wherein the second type hollow groove grids array 807V has a pattern corresponding to (matching with) the pattern of the first type hollow groove grids array 804V in a one-to-one correspondence manner, thereby exposing the metal materials which fill in the array of the first type hollow groove grids 804V and were formed after the first electroplating process in step 805; step 808, using the patterned second electroplating mask layer 8032 as a mask for a second electroplating process to electroplate metal materials (for example metals such as copper, nickel, or alloy materials such as SUS304) to fill in the second type hollow groove grids array 807V so as to complete formation of the remaining height (i.e.: h1-h2) portion 1092 of the metal wall grids 109 array; step 809, removing the patterned first electroplating mask layer 8031 and the patterned second electroplating mask layer 8032 and removing the conductive seed layer 8021; and step 810, peeling off the carrier board 8011.

Figure 13:
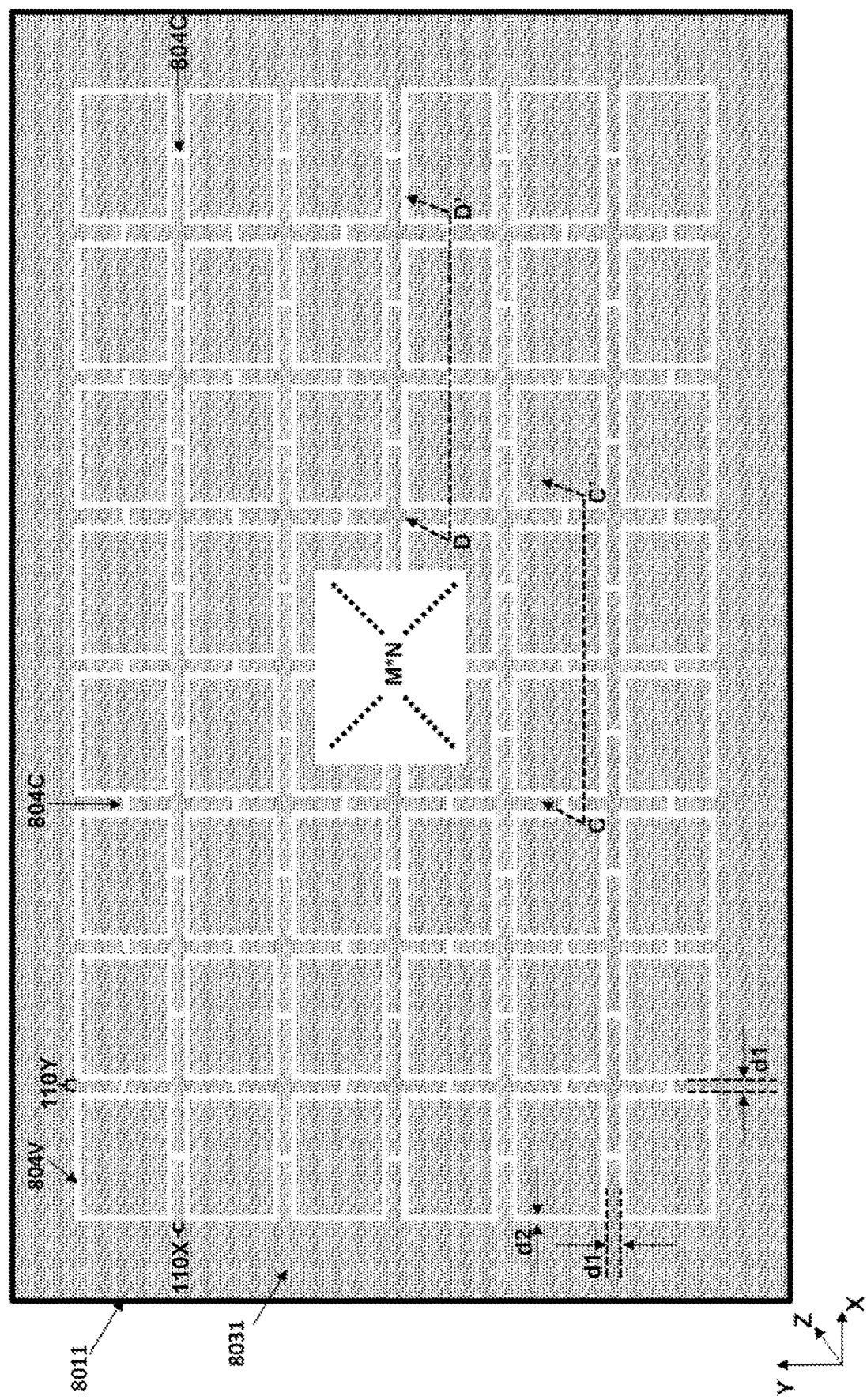
FIG. 13 illustrates a top plan view of the first type hollow groove grids 804V array formed in step 804 corresponding to the metal wall grids 109 array to be manufactured in accordance with an embodiment of the present invention.
Figure 14:
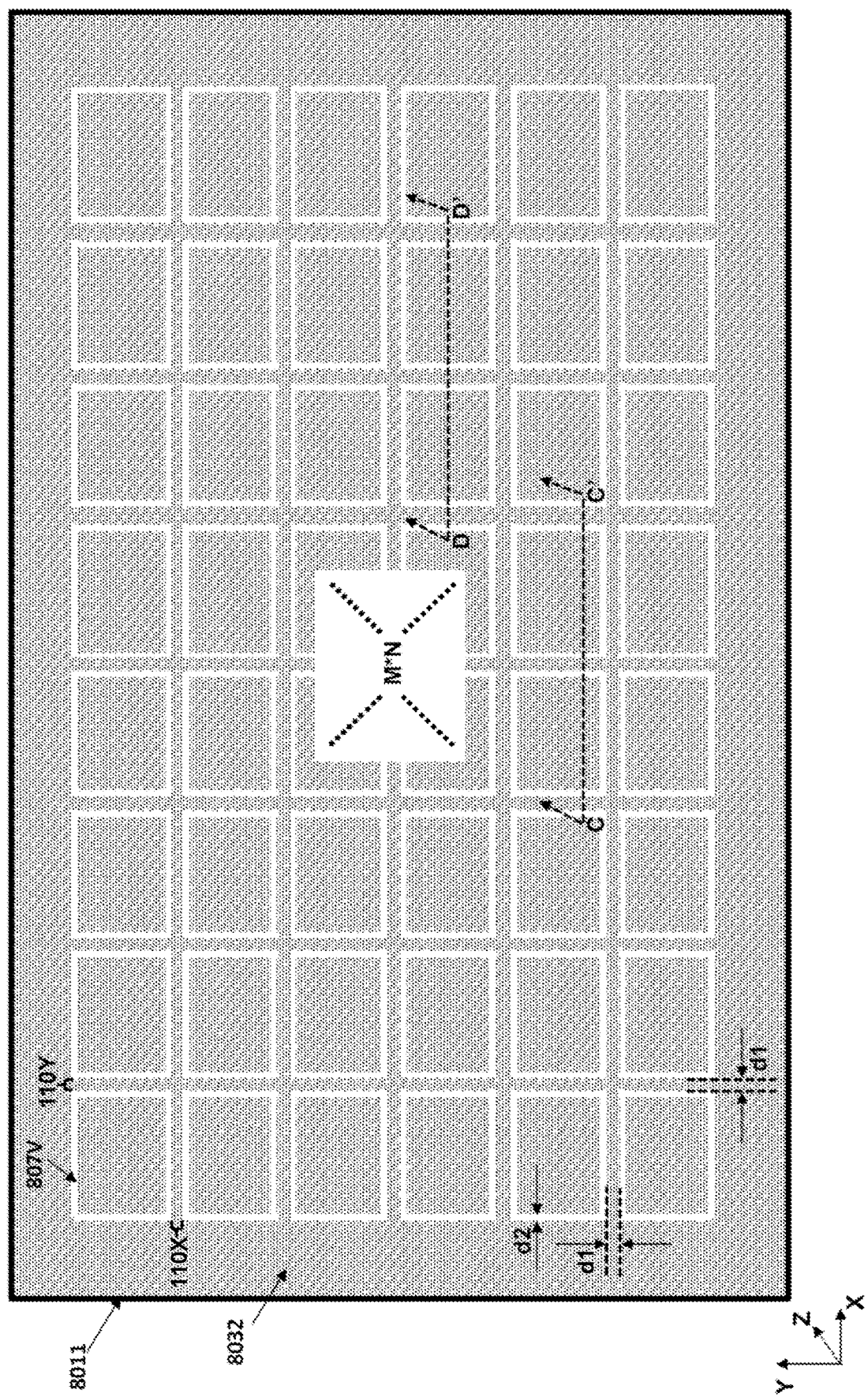
FIG. 14 illustrates a top plan view of the second type hollow groove grids 807V array formed in step 807 in accordance with an embodiment of the present invention.

In accordance with an embodiment of the present invention, the array of the first type hollow groove grids 804V formed in step 804 may have a pattern corresponding to (or matching with) the pattern of the metal wall grids 109 in a one-to-one correspondence manner. To help understanding, take the metal wall grids 109 array to be manufactured as the metal wall grids 109 array mentioned in the embodiment shown in FIG. 6A (for example, M rows by N columns) as an example. FIG. 13 illustrates a top plan view (in the X-Y plane) of the first type hollow groove grids 804V array formed in step 804 corresponding to the metal wall grids 109 array to be manufactured. FIG. 14 illustrates a top plan view (in the X-Y plane) of the second type hollow groove grids 807V array formed in step 807. The top plan view pattern of the second type hollow groove grids array and the top plan view pattern of the first type hollow groove grids 804V array are in one-to-one correspondence, except that the second type hollow groove grids 807V are not connected to each other. Corresponding to the metal wall grids 109 array of M rows by N columns in the example of FIG. 6A, the pattern of the first type hollow groove grids 804V array is an array pattern of M rows by N columns rectangular hollow groove grids 804V, and each groove side of each rectangular hollow groove grid 804V has a predetermined hollow groove width d2 (measured in the X-Y plane, the hollow groove width d2 determines the wall thickness d2 of the metal fence/wall 109). In step 804, a hollow pattern of the plurality of hollow connection grooves 804C (in one-to-one correspondence to the plurality of metal connection portions 114 to be produced) is formed at the same time, and each first type hollow groove grid 804V in the first type hollow groove grids 804V array is connected to at least one of the other first type hollow groove grids 804V adjacent to it through at least one of the plurality of hollow connection grooves 804C. In accordance with an embodiment of the present invention, each hollow groove grid 804V may be a rectangular groove grid surrounded by four hollow groove sides, and at least two hollow groove sides of each hollow groove grid 804V are respectively connected to other hollow groove grids 804V adjacent to it through at least two hollow connection grooves 804C. That is to say, each one of the at least two hollow groove sides of each hollow groove grid 804V is connected to at least one of the other hollow groove grids 804V adjacent to it through at least one hollow connection groove 804C. In accordance with an embodiment of the present invention, for each row in the first type hollow groove grids 804V array, every two adjacent hollow groove grids 804V in each row are connected by at least one hollow connection groove 804C, and every two adjacent rows of the first type hollow groove grids 804V array are connected to each other by at least two hollow connection grooves 804C. In accordance with an alternative embodiment of the present invention, for each column in the first type hollow groove grids 804V array, every two adjacent hollow groove grids 804V in each column are connected by at least one hollow connection groove 804C, and every two adjacent columns of the first type hollow groove grids 804V array are connected with each other by at least two hollow connection grooves 804C. Those skilled in the art should understand that when forming the panel-shaped metal wall grids 109 array illustrated in the exemplary embodiments of FIGS. 1A and 6A to 6H, the top plan view pattern of the first type hollow groove grids 804V array and the plurality of hollow connection grooves 804C formed in the step 804 after patterning the first electroplating mask layer 8031 should match with the top plan view pattern of the metal wall grids 109 array and the plurality of metal connecting portions 114 in each embodiment shown in FIGS. 1A and 6A to 6H in a one-to-one correspondence manner. There may be many other variations in the pattern of the panel-shaped metal wall grids 109 array and the corresponding pattern of first type hollow groove grids 804V array and the plurality of hollow connection grooves 804C formed in the step 804, which will not be exhaustively illustrated and addressed here.

One may still refer to the illustration in FIG. 10 for the top plan view of a panel-shaped array of metal wall grids 109 formed/manufactured/obtained by the method 800 with the patterned first electroplating mask layer 8031 (having the pattern of the hollow groove grids 704V array) as shown in the example of FIG. 13 as a mask for the first electroplating process and with the patterned second electroplating mask layer 8032 as shown in the example of FIG. 14 as a mask for the second electroplating process and then went through subsequent steps until the carrier board 8011 was peeled off. For the panel-shaped metal wall grids 109 array produced by the method 800, the plurality of metal connection portions 114 may have a predetermined connection portion height h2 smaller/lower than the predetermined wall height h1 of the metal fence/wall of each metal wall grid 109.

The present disclosure provides a package structure including at least one integrated circuit chip/die and a related method for manufacturing an integrated circuit chip/die. Although some embodiments of the present disclosure are described in detail, it should be understood that these embodiments are only for illustrative purposes. It is not intended to limit the scope of the present invention.

From the foregoing, it will be appreciated that specific embodiments of the present invention have been described herein for purposes of illustration, but that various modifications may be made without deviating from the invention. Many of the elements of one embodiment may be combined with other embodiments in addition to or in lieu of the elements of the other embodiments. Accordingly, the present invention is not limited except as by the appended claims.

What is claimed is:

1. An integrated circuit ("IC") package structure, comprising: an array of package units formed into a panel-shaped package units array, wherein each package unit has a continuous and closed metal wall surrounding the periphery of the package unit and at least one IC chip/IC die disposed in the package unit, and wherein each IC chip/IC die has a top surface and a back surface opposite to the top surface; and a panel-shaped metal layer corresponding to the panel-shaped package units array and formed on an entire back side of the IC package structure and bonded to the metal wall of each package unit, wherein the back side of the IC package structure refers to the side to which the back surface of each IC chip/IC die is facing; an encapsulation layer, filling each package unit, covering and wrapping the at least one IC chip/IC die in each package unit; wherein: the encapsulation layer has one or more openings at a portion corresponding to the back surface of each IC chip/IC die to expose an entire or at least a portion of the back surface of each IC chip/IC die, and wherein the panel-shaped metal layer is electroplated on the entire back side of the IC package structure so that the panel-shaped metal layer is in direct contact with the metal wall of each package unit and in direct contact with the exposed portions of the back surface of each IC chip/IC die.

2. The IC package structure of claim 1, wherein the array of package units comprises an array of M rows by N columns, wherein M and N are both positive integers greater than or equal to 1.

3. The IC package structure of claim 1, wherein the metal wall of each package unit has a predetermined wall height.

4. The IC package structure of claim 1, further comprising:
a cutting lane between adjacent metal walls of every two adjacent package units, wherein the cutting lane has a predetermined lane width.

5. The IC package structure of claim 1, wherein the package units in the panel-shaped package units array are separated by a corresponding panel-shaped metal wall grids array, and wherein each one of the metal wall grids has a continuous and closed metal wall surrounding a corresponding one package unit.

6. The IC package structure of claim 1, wherein the package units in the panel-shaped package units are connected to form a monolithic panel through a plurality of metal connecting portions, and wherein the metal wall of each package unit is connected to at least one of the other package units that is adjacent to it through at least one of the plurality of metal connecting portions.

7. The IC package structure of claim 6, wherein the metal wall of each package unit has a predetermined wall height, and wherein each one of the plurality of metal connecting portions has a predetermined connecting portion height smaller/lower than the predetermined wall height.

8. The IC package structure of claim 1, wherein the metal wall of each package unit comprises four metal side walls forming a rectangular metal wall grid surrounding the package unit, and wherein at least two metal side walls of each package unit are respectively connected to other package units adjacent to it through at least two metal connecting portions.

9. The IC package structure of claim 1, wherein the panel-shaped metal layer is electroplated on the entire back side of the IC package structure so that the panel-shaped metal layer is in direct contact with the metal wall of each package unit.

10. The IC package structure of claim 1, wherein the panel-shaped metal layer comprises an electroplated copper layer.

11. The IC package structure of claim 10, wherein the panel-shaped metal layer further comprises a conductive seed layer under the electroplated copper layer.

12. An integrated circuit ("IC") package unit, comprising: a metal wall grid having a continuous and closed metal wall surrounding the periphery of the package unit; at least one IC chip/IC die disposed in the metal wall grid, each of the at least one IC chip/IC die having a top surface and a back surface opposite to the top surface; and a metal layer, formed on entire back side of the IC package unit and bonded to the metal wall of the IC package unit, wherein the back side of the IC package unit refers to the side to which the back surface of each IC chip/IC die is facing; an encapsulation layer, filling the package unit, covering and wrapping the at least one IC chip/IC die in the package unit, wherein the encapsulation layer has one or more openings at a portion corresponding to the back surface of each IC chip/IC die to expose an entire or at least a portion of the back surface of each IC chip/IC die, and wherein the metal layer is electroplated on the entire back side of the IC package unit so that the metal layer is in direct contact with the metal wall of the metal wall grid and also in direct contact with the exposed portions of the back surface of each IC chip/IC die.

13. The IC package unit of claim 12, wherein the metal wall of the metal wall grid has a predetermined wall height.

14. The IC package unit of claim 12, further comprising:
at least one metal connecting portion, directly connected to the metal wall of the metal wall grid and extended outward from the metal wall to outside of the periphery of the package unit.

15. The IC package unit of claim 12, wherein the metal wall of the metal wall grid comprises four metal side walls forming a rectangular metal wall grid, and wherein each one metal side wall of at least two metal side walls of the rectangular metal wall grid has at least one metal connecting portion extended outward from the metal side wall to outside of the periphery of the package unit.

16. The IC package unit of claim 14, wherein the metal wall has a predetermined wall height, and wherein each one of the at least one metal connecting portion has a predetermined connecting portion height smaller/lower than the predetermined wall height.

17. The IC package unit of claim 12, further comprising:
an encapsulation layer, filling the package unit, covering and wrapping the at least one IC chip/IC die in the package unit; wherein
the metal layer is electroplated on the entire back side of the IC package unit so that the metal layer is in direct contact with the metal wall of the metal wall grid.

\* \* \* \* \*